(12) United States Patent
Huang

(10) Patent No.: US 11,262,540 B2
(45) Date of Patent: Mar. 1, 2022

(54) IMAGING LENS SYSTEM, IMAGE CAPTURING UNIT AND ELECTRONIC DEVICE

(71) Applicant: LARGAN PRECISION CO., LTD., Taichung (TW)

(72) Inventor: Hsin-Hsuan Huang, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 112 days.

(21) Appl. No.: 16/371,220

(22) Filed: Apr. 1, 2019

(65) Prior Publication Data
US 2020/0132969 A1 Apr. 30, 2020

(30) Foreign Application Priority Data

Oct. 24, 2018 (TW) .................................. 107137600

(51) Int. Cl.
*G02B 13/00* (2006.01)
*G02B 9/64* (2006.01)
*H01L 27/146* (2006.01)

(52) U.S. Cl.
CPC ........... *G02B 13/0045* (2013.01); *G02B 9/64* (2013.01); *G02B 13/0055* (2013.01); *H01L 27/14627* (2013.01)

(58) Field of Classification Search
CPC .............. G02B 13/00; G02B 13/0045; G02B 13/0055; G02B 13/0035; G02B 13/04; G02B 13/06; G02B 13/16; G02B 13/18; G02B 13/006; G02B 5/20; G02B 5/208; G02B 9/12; G02B 9/64; G02B 3/02; H01L 27/146; H01L 27/14627

USPC ........ 359/754, 708, 713, 714, 750, 751, 755
See application file for complete search history.

(56) References Cited

U.S. PATENT DOCUMENTS

| 2,925,010 A | 1/1959 | Turula et al. |
| 3,045,548 A | 7/1962 | Baker |
| 3,840,289 A | 10/1974 | Day |
| 5,278,699 A | 1/1994 | Ito et al. |
| 5,353,162 A | 10/1994 | Ito et al. |
| 5,424,871 A | 6/1995 | Ito et al. |
| 5,493,446 A | 2/1996 | Nakajima |

(Continued)

FOREIGN PATENT DOCUMENTS

| CN | 107643586 A | 1/2018 |
| CN | 107703608 A | 2/2018 |

(Continued)

OTHER PUBLICATIONS

Taiwanese Office Action issued in corresponding application No. 107137600, dated Nov. 4, 2019.

*Primary Examiner* — Jie Lei
(74) *Attorney, Agent, or Firm* — Maschoff Brennan

(57) ABSTRACT

An imaging lens system includes eight lens elements which are, in order from an object side to an image side: a first lens element, a second lens element, a third lens element, a fourth lens element, a fifth lens element, a sixth lens element, a seventh lens element and an eighth lens element. Each of the eight lens elements has an object-side surface facing toward the object side and an image-side surface facing toward the image side. At least one lens element of the imaging lens system has at least one lens surface having at least one inflection point. The imaging lens system has a total of eight lens elements.

30 Claims, 31 Drawing Sheets

(56) References Cited

U.S. PATENT DOCUMENTS

| | | | |
|---|---|---|---|
| 5,642,229 A | 6/1997 | Kaneko et al. | |
| 5,751,498 A | 5/1998 | Ito | |
| 6,025,959 A | 2/2000 | Moskovich | |
| 6,327,100 B1 | 12/2001 | Yamanash | |
| 9,835,822 B2 | 12/2017 | Huang | |
| 2017/0045714 A1* | 2/2017 | Huang | G02B 9/64 |
| 2017/0329108 A1 | 11/2017 | Hashimoto | |
| 2018/0180856 A1 | 6/2018 | Jung et al. | |
| 2019/0056568 A1 | 2/2019 | Huang | |

FOREIGN PATENT DOCUMENTS

| | | |
|---|---|---|
| CN | 107703609 A | 2/2018 |
| CN | 107741630 A | 2/2018 |
| CN | 107831588 A | 3/2018 |
| CN | 108919464 A | 11/2018 |
| CN | 109031620 A | 12/2018 |
| JP | H01-124810 A | 5/1989 |
| JP | H01-261612 A | 10/1989 |
| JP | H05-034593 A | 2/1993 |
| JP | H06-258575 A | 9/1994 |
| JP | H07-287166 A | 10/1995 |
| JP | H08-227038 A | 9/1996 |
| JP | H10-339844 A | 12/1998 |
| JP | H11-326764 A | 11/1999 |
| JP | 2009-251367 A | 10/2009 |
| JP | 2010072359 A | 4/2010 |
| JP | 2011113052 A | 6/2011 |
| TW | I636279 B | 9/2018 |

* cited by examiner

IMAGING LENS SYSTEM, IMAGE CAPTURING UNIT AND ELECTRONIC DEVICE

RELATED APPLICATIONS

This application claims priority to Taiwan Application 107137600, filed on Oct. 24, 2018, which is incorporated by reference herein in its entirety.

BACKGROUND

Technical Field

The present disclosure relates to an imaging lens system, an image capturing unit and an electronic device, more particularly to an imaging lens system and an image capturing unit applicable to an electronic device.

Description of Related Art

With the development of semiconductor manufacturing technology, the performance of image sensors has been improved, and the pixel size thereof has been scaled down. Therefore, featuring high image quality becomes one of the indispensable features of an optical system nowadays.

Furthermore, due to the rapid changes in technology, electronic devices equipped with optical systems are developed towards multi-functionality for various applications, and therefore the functionality requirements for the optical systems have been increasing. However, it is yet difficult for a conventional optical system to obtain a balance among the requirements such as high image quality, low sensitivity, proper aperture size, miniaturization or a desirable field of view. Accordingly, there is a need for an optical system that satisfies the aforementioned requirements.

SUMMARY

According to one aspect of the present disclosure, an imaging lens system includes eight lens elements. The eight lens elements are, in order from an object side to an image side, a first lens element, a second lens element, a third lens element, a fourth lens element, a fifth lens element, a sixth lens element, a seventh lens element and an eighth lens element. Each of the eight lens elements has an object-side surface facing toward the object side and an image-side surface facing toward the image side. The first lens element has positive refractive power. At least one lens element of the imaging lens system has at least one lens surface having at least one inflection point. The imaging lens system has a total of eight lens elements. When a minimum value among Abbe numbers of all lens elements of the imaging lens system is Vmin, half of a maximum field of view of the imaging lens system is HFOV, a focal length of the imaging lens system is f, a focal length of the first lens element is f1, an entrance pupil diameter of the imaging lens system is EPD, an axial distance between the image-side surface of the eighth lens element and an image surface is BL, and an axial distance between the object-side surface of the first lens element and the image-side surface of the eighth lens element is TD, the following conditions are satisfied:

$8.0 < Vmin < 22.5;$ $5.0\ [\deg.] < HFOV < 25.0\ [\deg.];$ $0.80 < f/EPD < 2.20;$ $0 < BL/TD < 0.25;$ and $0.32 < f/f1 < 3.80.$ According to another aspect of the present disclosure, an image capturing unit includes the aforementioned imaging lens system and an image sensor, wherein the image sensor is disposed on the image surface of the imaging lens system.

According to still another aspect of the present disclosure, an electronic device includes at least two image capturing units, and the at least two image capturing units face the same side. The at least two image capturing units include a first image capturing unit and a second image capturing unit. The first image capturing unit includes the aforementioned imaging lens system and a first image sensor, and the first image sensor is disposed on the image surface of the imaging lens system. The second image capturing unit includes an optical lens assembly and a second image sensor, and the second image sensor is disposed on an image surface of the optical lens assembly. A field of view of the first image capturing unit and a field of view of the second image capturing unit are different from each other by at least 20 degrees.

According to yet another aspect of the present disclosure, an imaging lens system includes eight lens elements. The eight lens elements are, in order from an object side to an image side, a first lens element, a second lens element, a third lens element, a fourth lens element, a fifth lens element, a sixth lens element, a seventh lens element and an eighth lens element. Each of the eight lens elements has an object-side surface facing toward the object side and an image-side surface facing toward the image side. At least one lens element of the imaging lens system has at least one lens surface having at least one inflection point. The imaging lens system has a total of eight lens elements. When an Abbe number of the eighth lens element is V8, half of a maximum field of view of the imaging lens system is HFOV, a focal length of the imaging lens system is f, an entrance pupil diameter of the imaging lens system is EPD, and an axial distance between the object-side surface of the first lens element and an image surface is TL, the following conditions are satisfied:

$8.0 < V8 < 24.5;$ $5.0\ [\deg.] < HFOV < 30.0\ [\deg.];$ $0.80 < f/EPD < 2.20;$ and $0.50 < TL/f < 1.30.$ According to yet still another aspect of the present disclosure, an imaging lens system includes eight lens elements. The eight lens elements are, in order from an object side to an image side, a first lens element, a second lens element, a third lens element, a fourth lens element, a fifth lens element, a sixth lens element, a seventh lens element and an eighth lens element. Each of the eight lens elements has an object-side surface facing toward the object side and an image-side surface facing toward the image side. At least one lens element of the imaging lens system has at least one lens surface having at least one inflection point. The imaging lens system has a total of eight lens elements. When a minimum value among Abbe numbers of all lens elements of the imaging lens system is Vmin, an axial distance between the object-side surface of the first lens element and an image surface is TL, a focal length of the imaging lens system is f, an axial distance between the image-side surface of the eighth lens element and the image surface is BL, and an axial distance between the object-side surface of the first lens element and the image-side surface of the eighth lens element is TD, the following conditions are satisfied:

$8.0 < V\min < 20.0;$ $0.50 < TL/f < 1.10;$ and $0 < BL/TD < 0.30.$

BRIEF DESCRIPTION OF THE DRAWINGS

The disclosure can be better understood by reading the following detailed description of the embodiments, with reference made to the accompanying drawings as follows.

DETAILED DESCRIPTION

An imaging lens system includes eight lens elements. The eight lens elements are, in order from an object side to an image side, a first lens element, a second lens element, a third lens element, a fourth lens element, a fifth lens element, a sixth lens element, a seventh lens element and an eighth lens element.

The first lens element can have positive refractive power; therefore, it is favorable for providing significant light converging capability so as to minimize the space between adjacent lens elements, thereby achieving compactness. The first lens element can have an object-side surface being convex in a paraxial region thereof; therefore, it is favorable for receiving light rays from the off-axis region so as to reduce the incident angle of light, thereby preventing total reflection.

The second lens element can have negative refractive power; therefore, it is favorable for correcting aberrations generated by the first lens element so as to eliminate spherical and chromatic aberrations. The second lens element can have an image-side surface being concave in a paraxial region thereof; therefore, it is favorable for further correcting aberrations so as to improve image quality.

The third lens element can have an image-side surface being concave in a paraxial region thereof. Therefore, it is favorable for providing a compact and telephoto configuration while reducing aberrations.

The seventh lens element can have an image-side surface being concave in a paraxial region thereof. Therefore, it is favorable for reducing the back focal length of the imaging lens system so as to meet the requirement of compactness.

Figure 31:
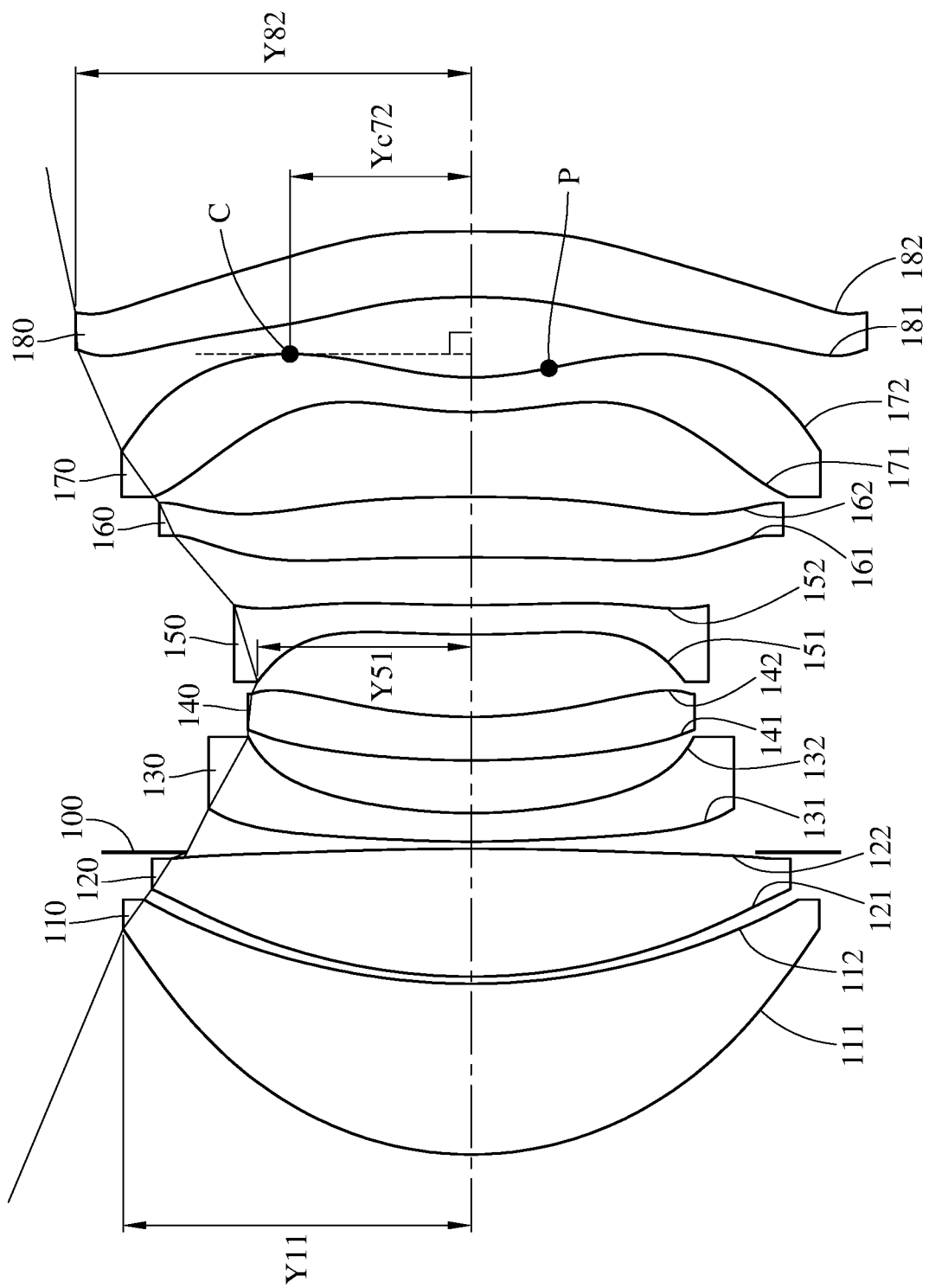
FIG. 31 shows a schematic view of Y11, Y51, Yc72, Y82 and an inflection point and a critical point on the image-side surface of the seventh lens element according to the 1st embodiment of the present disclosure.

According to the present disclosure, at least one lens element of the imaging lens system has at least one lens surface having at least one inflection point; therefore, it is favorable for correcting off-axis aberrations and reducing the size of the imaging lens system. Moreover, each of at least three lens elements of the imaging lens system can have at least one lens surface having at least one inflection point; therefore, it is favorable for correcting coma and astigmatism, obtaining a compact configuration and flattening the Petzval surface of the imaging lens system. Please refer to FIG. 31, which shows a schematic view of an inflection point P on the image-side surface 172 of the seventh lens element 170 according to the 1st embodiment of the present disclosure. The inflection point P on the image-side surface of the seventh lens element in FIG. 31 is only exemplary. The other lens surfaces of the eight lens elements may also have one or more inflection points.

When a minimum value among Abbe numbers of all lens elements of the imaging lens system is Vmin, the following condition can be satisfied: 8.0<Vmin<22.5. Therefore, it is favorable for adjusting the light path and balancing the capability of converging light rays with different wavelengths so as to correct chromatic aberration. Moreover, the following condition can be satisfied: 8.0<Vmin<20.0. Moreover, the following condition can be satisfied: 10.0<Vmin<20.0. Moreover, the following condition can also be satisfied: 15.0<Vmin<19.0.

When half of a maximum field of view of the imaging lens system is HFOV, the following condition can be satisfied: 5.0 [deg.]<HFOV<30.0 [deg.]. Therefore, it is favorable for controlling the field of view so as to obtain a better imaging range, and make the imaging lens system applicable to various applications. Moreover, the following condition can also be satisfied: 5.0 [deg.]<HFOV<25.0 [deg.].

When a focal length of the imaging lens system is f, and an entrance pupil diameter of the imaging lens system is EPD, the following condition can be satisfied: 0.80<f/EPD<2.20. Therefore, it is favorable for adjusting the entrance pupil so as to provide sufficient incident light to increase image brightness. Moreover, the following condition can be satisfied: 1.0<f/EPD<2.0. Moreover, the following condition can also be satisfied: 0.80<f/EPD<1.80.

When an axial distance between an image-side surface of the eighth lens element and an image surface is BL, and an axial distance between the object-side surface of the first lens element and the image-side surface of the eighth lens element is TD, the following condition can be satisfied: 0<BL/TD<0.30. Therefore, it is favorable for reducing the back focal length so as to control the total track length of the imaging lens system. Moreover, the following condition can be satisfied: 0<BL/TD<0.25. Moreover, the following condition can also be satisfied: 0<BL/TD<0.18.

When the focal length of the imaging lens system is f, and a focal length of the first lens element is f1, the following condition can be satisfied: 0.32<f/f1<3.80. Therefore, it is favorable for providing sufficient converging capability on the object side of the imaging lens system from the first lens element so as to achieve a telephoto configuration.

When an Abbe number of the eighth lens element is V8, the following condition can be satisfied: 8.0<V8<24.5. Therefore, it is favorable for correcting chromatic aberration by the eighth lens element so as to prevent defocusing of light rays with different wavelengths, thereby improving image quality. Moreover, the following condition can be satisfied: 8.0<V8<22.0. Moreover, the following condition can also be satisfied: 8.0<V8<20.0.

When an axial distance between the object-side surface of the first lens element and the image surface is TL, and the focal length of the imaging lens system is f, the following condition can be satisfied: 0.50<TL/f<1.30. Therefore, it is favorable for balancing between the total length and the field of view of the imaging lens system, while making the imaging lens system applicable to various applications. Moreover, the following condition can also be satisfied: 0.50<TL/f<1.10.

According to the present disclosure, each of at least four lens elements of the imaging lens system can be made of plastic material. Therefore, it is favorable for reducing manufacturing costs and increasing design flexibility of the imaging lens system so as to optimize the capability for correcting off-axis aberrations.

When the axial distance between the object-side surface of the first lens element and the image surface is TL, and the entrance pupil diameter of the imaging lens system is EPD, the following condition can be satisfied: 0.90<TL/EPD<1.90. Therefore, it is favorable for achieving a short total track length and a large aperture, enabling the imaging lens system to capture high brightness images within limited interior space. Moreover, the following condition can also be satisfied: 1.10<TL/EPD<1.67.

According to the present disclosure, each of at least four lens elements of the imaging lens system can have an Abbe number smaller than 35.0. Therefore, it is favorable for providing the materials of the lens elements in the imaging lens system with a sufficient capability of controlling light path so as to balance the focusing positions of light rays with different wavelengths, thereby preventing image overlapping. Moreover, each of at least four lens elements of the imaging lens system can have an Abbe number smaller than 30.0. Moreover, each of at least four lens elements of the imaging lens system can have an Abbe number smaller than 25.0. According to the present disclosure, the Abbe number V of one lens element is obtained from the following equation: V=(Nd−1)/(NF−NC), wherein Nd is the refractive index of said lens element at the wavelength of helium d-line (587.6 nm), NF is the refractive index of said lens element at the wavelength of hydrogen F-line (486.1 nm), and NC is the refractive index of said lens element at the wavelength of hydrogen C-line (656.3 nm).

When a focal length of the fifth lens element is f5, and a focal length of the eighth lens element is f8, the following condition can be satisfied: −0.50<f8/f5<9.0. Therefore, it is favorable for providing sufficient capability of controlling light path with proper refractive power of the eighth lens element and controlling the refractive power among different fields of view in the middle part of the imaging lens system so as to reduce aberrations. Moreover, the following condition can also be satisfied: −0.40<f8/f5<3.0.

When a sum of central thicknesses of all lens elements of the imaging lens system is ΣCT, and a sum of axial distances between each of all adjacent lens elements of the imaging lens system is ΣAT, the following condition can be satisfied: 1.10<ΣCT/ΣAT<3.50. Therefore, it is favorable for balancing the thicknesses of the lens elements and gaps between adjacent lens elements of the imaging lens system so as to achieve a high assembling yield rate. Moreover, the following condition can also be satisfied: 1.20<ΣCT/ΣAT<2.50.

When a curvature radius of the object-side surface of the first lens element is R1, and a central thickness of the first lens element is CT1, the following condition can be satisfied: 0.50<R1/CT1<2.65. Therefore, it is favorable for enhancing the capability of controlling light path and the structural strength of the first lens element so as to allow the imaging lens system to be applicable to different environmental conditions. Moreover, the following condition can also be satisfied: 0.80<R1/CT1<2.50.

When a curvature radius of an object-side surface of the seventh lens element is R13, and a curvature radius of the image-side surface of the seventh lens element is R14, the following condition can be satisfied: (R13−R14)/(R13+R14) <5.0. Therefore, it is favorable for balancing the surface shapes of the seventh lens element so as to better correct aberrations, thereby improving image quality. Moreover, the following condition can be satisfied: $-2.0<(R13-R14)/(R13+R14)<3.0$. Moreover, the following condition can also be satisfied: $-1.0<(R13-R14)/(R13+R14)<2.0$.

When a maximum effective radius of the object-side surface of the first lens element is Y11, a maximum effective radius of the image-side surface of the eighth lens element is Y82, a maximum image height of the imaging lens system (half of a diagonal length of an effective photosensitive area of an image sensor) is ImgH, and the focal length of the imaging lens system is f, the following condition can be satisfied: $0<(|Y11-Y82|+|Y82-ImgH|)/f<0.15$. Therefore, it is favorable for balancing the differences among the object side, the image side and the image height of the imaging lens system, and controlling the diameters of the lens elements so as to maintain the quality in lens molding, thereby providing a stable manufacturing yield rate. Please refer to FIG. 31, which shows a schematic view of Y11 and Y82 according to the 1st embodiment of the present disclosure.

When a maximum value among refractive indices of all lens elements of the imaging lens system is Nmax, the following condition can be satisfied: $1.60<Nmax<1.72$. Therefore, it is favorable for selecting proper lens materials so as to reduce difficulty in manufacture, thereby increasing the feasibility of commercialization of the imaging lens system. Moreover, the following condition can also be satisfied: $1.65<Nmax<1.70$.

When the focal length of the imaging lens system is f, a curvature radius of an object-side surface of one lens element of the imaging lens system is Ro, and a curvature radius of an image-side surface of the lens element is Ri, at least one lens element of the imaging lens system can satisfy the following condition: $|f/Ro|+|f/Ri|<0.50$. Therefore, it is favorable for providing at least one correction lens in the imaging lens system and preventing the curvature of lens surfaces thereof from being overly large so that the imaging lens system is able to balance aberrations generated by the lens elements on the object side and image side. Moreover, at least one lens element of the imaging lens system can satisfy the following condition: $|f/Ro|+|f/Ri|<0.30$.

When the entrance pupil diameter of the imaging lens system is EPD, and the axial distance between the image-side surface of the eighth lens element and the image surface is BL, the following condition can be satisfied: $4.50<EPD/BL<18.0$. Therefore, it is favorable for maintaining a proper back focal length for lens elements assembling within limited interior space, and providing sufficient amount of incident light so as to meet the requirement of product specifications. Moreover, the following condition can also be satisfied: $4.50<EPD/BL<9.0$.

When the axial distance between the image-side surface of the eighth lens element and the image surface is BL, and the central thickness of the first lens element is CT1, the following condition can be satisfied: $0<BL/CT1<0.95$. Therefore, it is favorable for increasing the thickness of the first lens element for having sufficient structural strength of the imaging lens system against environmental factors so as to maintain consistent product quality; furthermore, it is favorable for controlling the back focal length of the imaging lens system so as to achieve compactness. Moreover, the following condition can also be satisfied: $0.10<BL/CT1<0.70$.

When the maximum effective radius of the object-side surface of the first lens element is Y11, the maximum image height of the imaging lens system is ImgH, and the entrance pupil diameter of the imaging lens system is EPD, the following condition can be satisfied: $-0.27<(Y11-ImgH)/EPD<0$. Therefore, it is favorable for balancing the differences between the object side and the image side of the imaging lens system and providing sufficient amount of incident light.

When the focal length of the imaging lens system is f, and the focal length of the fifth lens element is f5, the following condition can be satisfied: $-0.25<f/f5<1.50$. Therefore, it is favorable for balancing the refractive power of the fifth lens element so as to reduce sensitivity of the imaging lens system. Moreover, the following condition can also be satisfied: $0<f/f5<1.0$.

According to the present disclosure, the imaging lens system further includes an aperture stop. When an axial distance between the aperture stop and the image surface is SL, and the axial distance between the object-side surface of the first lens element and the image surface is TL, the following condition can be satisfied: $0.50<SL/TL<0.95$. Therefore, the position of the aperture stop is favorable for controlling the size of the imaging lens system. Moreover, the following condition can also be satisfied: $0.50<SL/TL<0.85$.

When the focal length of the imaging lens system is f, half of the maximum field of view of the imaging lens system is HFOV, and the entrance pupil diameter of the imaging lens system is EPD, the following condition can be satisfied: $0.20<f\times\tan(HFOV)/EPD<1.0$. Therefore, it is favorable for obtaining a telephoto configuration with sufficient incident light so as to prevent low image brightness. Moreover, the following condition can also be satisfied: $0.30<f\times\tan(HFOV)/EPD<0.73$.

When the maximum effective radius of the object-side surface of the first lens element is Y11, the maximum effective radius of the image-side surface of the eighth lens element is Y82, the axial distance between the image-side surface of the eighth lens element and the image surface is BL, and the focal length of the imaging lens system is f, the following condition can be satisfied: $0<(|Y11-Y82|+BL)/f<0.20$. Therefore, it is favorable for preventing an overly large difference between pupil openings at two ends of the imaging lens system to provide sufficient incoming light, and for reducing the back focal length so as to obtain a proper space arrangement of the imaging lens system.

When an Abbe number of the first lens element is V1, an Abbe number of the second lens element is V2, an Abbe number of the third lens element is V3, an Abbe number of the fourth lens element is V4, an Abbe number of the fifth lens element is V5, an Abbe number of the sixth lens element is V6, an Abbe number of the seventh lens element is V7, the Abbe number of the eighth lens element is V8, and an Abbe number of the i-th lens element is Vi, the following condition can be satisfied: $150.0<\Sigma Vi<320.0$, wherein $i=1, 2, 3, 4, 5, 6, 7, 8$. Therefore, it is favorable for increasing the density difference between the lens elements and air so as to better control the light path within limited interior space. Moreover, the following condition can also be satisfied: $150.0<\Sigma Vi<300.0$, wherein $i=1, 2, 3, 4, 5, 6, 7, 8$.

When the focal length of the imaging lens system is f, the focal length of the fifth lens element is f5, and a focal length of the sixth lens element is f6, the following condition can be satisfied: $-0.50<f/f5+f/f6<1.0$. Therefore, it is favorable for correcting aberrations with proper refractive power of the fifth lens element and sixth lens element so as to optimize the image quality. Moreover, the following condition can also be satisfied: $-0.20<f/f5+f/f6<0.50$.

When a vertical distance between a critical point on the image-side surface of the seventh lens element and an optical axis is Yc72, and the focal length of the imaging lens system is f, the following condition can be satisfied: $0.02 < Yc72/f < 0.70$. Therefore, it is favorable for correcting off-axis aberrations on the image side while reducing distortion and field curvature. Moreover, the following condition can also be satisfied: $0.02 < Yc72/f < 0.28$. Please refer to FIG. 31, which shows a schematic view of a critical point C on the image-side surface 172 of the seventh lens element 170 according to the 1st embodiment of the present disclosure.

When the focal length of the fifth lens element is f5, and a focal length of the seventh lens element is f7, the following condition can be satisfied: $f5/f7 < 0.50$. Therefore, it is favorable for balancing the refractive power of the fifth lens element and seventh lens element so as to better correct aberrations, thereby improving image quality. Moreover, the following condition can also be satisfied: $-5.0 < f5/f7 < 0.35$.

When a curvature radius of an image-side surface of the fourth lens element is R8, and the focal length of the imaging lens system is f, the following condition can be satisfied: $-1.50 < R8/f < 1.50$. Therefore, it is favorable for providing sufficient refraction on the image-side surface of the fourth lens element so as to control the light path. Moreover, the following condition can also be satisfied: $0 < R8/f < 1.50$.

When the focal length of the imaging lens system is f, and the maximum image height of the imaging lens system is ImgH, the following condition can be satisfied: $2.10 < f/ImgH < 3.80$. Therefore, it is favorable for providing proper viewing angles so that the imaging lens system is applicable to various applications.

When a curvature radius of an object-side surface of the sixth lens element is R11, and a curvature radius of an image-side surface of the sixth lens element is R12, the following condition can be satisfied: $-0.50 < (R11+R12)/(R11-R12) < 15.0$. Therefore, it is favorable for balancing the light path in both tangential direction and sagittal direction so as to correct astigmatism. Moreover, the following condition can also be satisfied: $-0.20 < (R11+R12)/(R11-R12) < 3.0$.

When the maximum effective radius of the object-side surface of the first lens element is Y11, a maximum effective radius of an object-side surface of the fifth lens element is Y51, and the maximum effective radius of the image-side surface of the eighth lens element is Y82, the following condition can be satisfied: $0.70 < (Y82-Y51)/(Y11-Y51) < 2.50$. Therefore, it is favorable for arranging the outer diameters of the object side, the middle part and the image side of the imaging lens system so as to increase the symmetry of the imaging lens system, to improve image quality and to reduce sensitivity. Please refer to FIG. 31, which shows a schematic view of Y11, Y51 and Y82 according to the 1st embodiment of the present disclosure.

When the entrance pupil diameter of the imaging lens system is EPD, and the maximum image height of the imaging lens system is ImgH, the following condition can be satisfied: $1.20 < EPD/ImgH < 2.80$. Therefore, it is favorable for providing sufficient light on the image surface so as to meet the requirement of image brightness.

When the Abbe number of the first lens element is V1, the Abbe number of the second lens element is V2, the Abbe number of the third lens element is V3, the Abbe number of the fourth lens element is V4, the Abbe number of the fifth lens element is V5, the Abbe number of the sixth lens element is V6, the Abbe number of the seventh lens element is V7, the Abbe number of the eighth lens element is V8, the Abbe number of the i-th lens element is Vi, a refractive index of the first lens element is N1, a refractive index of the second lens element is N2, a refractive index of the third lens element is N3, a refractive index of the fourth lens element is N4, a refractive index of the fifth lens element is N5, a refractive index of the sixth lens element is N6, a refractive index of the seventh lens element is N7, a refractive index of the eighth lens element is N8, a refractive index of the i-th lens element is Ni, and a minimum value of Vi/Ni is (Vi/Ni)min, the following condition can be satisfied: $9.0 < (Vi/Ni)min < 11.80$, wherein $i=1, 2, 3, 4, 5, 6, 7, 8$. Therefore, it is favorable for the imaging lens system to have a sufficient image correction capability so as to correct various aberrations. Moreover, the following condition can also be satisfied: $9.5 < (Vi/Ni)min < 11.5$.

When the axial distance between the object-side surface of the first lens element and the image surface is TL, the following condition can be satisfied: $4.0\ [mm] < TL < 8.0\ [mm]$. Therefore, it is favorable for controlling the total length of the imaging lens system, making the imaging lens system applicable to more applications so as to satisfy market demands. Moreover, the following condition can also be satisfied: $4.5\ [mm] < TL < 7.0\ [mm]$.

When the maximum image height of the imaging lens system is ImgH, the following condition can be satisfied: $1.50\ [mm] < ImgH < 4.50\ [mm]$. Therefore, it is favorable for providing a proper light receiving area with sufficient image brightness so as to meet the requirement of product specifications. Moreover, the following condition can also be satisfied: $1.80\ [mm] < ImgH < 3.20\ [mm]$.

According to the present disclosure, the aforementioned features and conditions can be utilized in numerous combinations so as to achieve corresponding effects.

According to the present disclosure, the lens elements of the imaging lens system can be made of either glass or plastic material. When the lens elements are made of glass material, the refractive power distribution of the imaging lens system may be more flexible. The glass lens element can either be made by grinding or molding. When the lens elements are made of plastic material, the manufacturing cost can be effectively reduced. Furthermore, surfaces of each lens element can be arranged to be aspheric, which allows more control variables for eliminating aberrations thereof, the required number of the lens elements can be reduced, and the total track length of the imaging lens system can be effectively shortened. The aspheric surfaces may be formed by plastic injection molding or glass molding.

According to the present disclosure, one or more of the lens elements' material may optionally include an additive which alters the lens elements' transmittance in a specific range of wavelength for a reduction in unwanted stray light or colour deviation. For example, the additive may optionally filter out light in the wavelength range of 600 nm to 800 nm to reduce excessive red light and/or near infrared light; or may optionally filter out light in the wavelength range of 350 nm to 450 nm to reduce excessive blue light and/or near ultraviolet light from interfering the final image. The additive may be homogeneously mixed with a plastic material to be used in manufacturing a mixed-material lens element by injection molding.

According to the present disclosure, when a lens surface is aspheric, it means that the lens surface has an aspheric shape throughout its optically effective area, or a portion(s) thereof.

According to the present disclosure, each of an object-side surface and an image-side surface has a paraxial region and an off-axis region. The paraxial region refers to the region of the surface where light rays travel close to the optical axis, and the off-axis region refers to the region of the surface away from the paraxial region. Particularly, unless otherwise stated, when the lens element has a convex surface, it indicates that the surface is convex in the paraxial region thereof; when the lens element has a concave surface, it indicates that the surface is concave in the paraxial region thereof. Moreover, when a region of refractive power or focus of a lens element is not defined, it indicates that the region of refractive power or focus of the lens element is in the paraxial region thereof.

According to the present disclosure, an inflection point is a point on the surface of the lens element at which the surface changes from concave to convex, or vice versa. A critical point is a non-axial point of the lens surface where its tangent is perpendicular to the optical axis.

According to the present disclosure, an image surface of the imaging lens system, based on the corresponding image sensor, can be flat or curved, especially a curved surface being concave facing towards the object side of the imaging lens system.

According to the present disclosure, an image correction unit, such as a field flattener, can be optionally disposed between the lens element closest to the image side of the imaging lens system and the image surface for correction of aberrations such as field curvature. The optical properties of the image correction unit, such as curvature, thickness, index of refraction, position and surface shape (convex or concave surface with spherical, aspheric, diffractive or Fresnel types), can be adjusted according to the design of an image capturing unit. In general, a preferable image correction unit is, for example, a thin transparent element having a concave object-side surface and a planar image-side surface, and the thin transparent element is disposed near the image surface.

According to the present disclosure, the imaging lens system can include at least one stop, such as an aperture stop, a glare stop or a field stop. Said glare stop or said field stop is set for eliminating the stray light and thereby improving image quality thereof.

According to the present disclosure, an aperture stop can be configured as a front stop or a middle stop. A front stop disposed between an imaged object and the first lens element can provide a longer distance between an exit pupil of the imaging lens system and the image surface to produce a telecentric effect, and thereby improves the image-sensing efficiency of an image sensor (for example, CCD or CMOS). A middle stop disposed between the first lens element and the image surface is favorable for enlarging the viewing angle of the imaging lens system and thereby provides a wider field of view for the same.

According to the present disclosure, the imaging lens system can include an aperture control unit. The aperture control unit may be a mechanical component or a light modulator, which can control the size and shape of the aperture through electricity or electrical signals. The mechanical component can include a movable member, such as a blade assembly or a light baffle. The light modulator can include a shielding element, such as a filter, an electrochromic material or a liquid-crystal layer. The aperture control unit controls the amount of incident light or exposure time to enhance the capability of image quality adjustment. In addition, the aperture control unit can be the aperture stop of the present disclosure, which changes the f-number to obtain different image effects, such as the depth of field or lens speed.

According to the above description of the present disclosure, the following specific embodiments are provided for further explanation.

1st Embodiment

Figure 1:
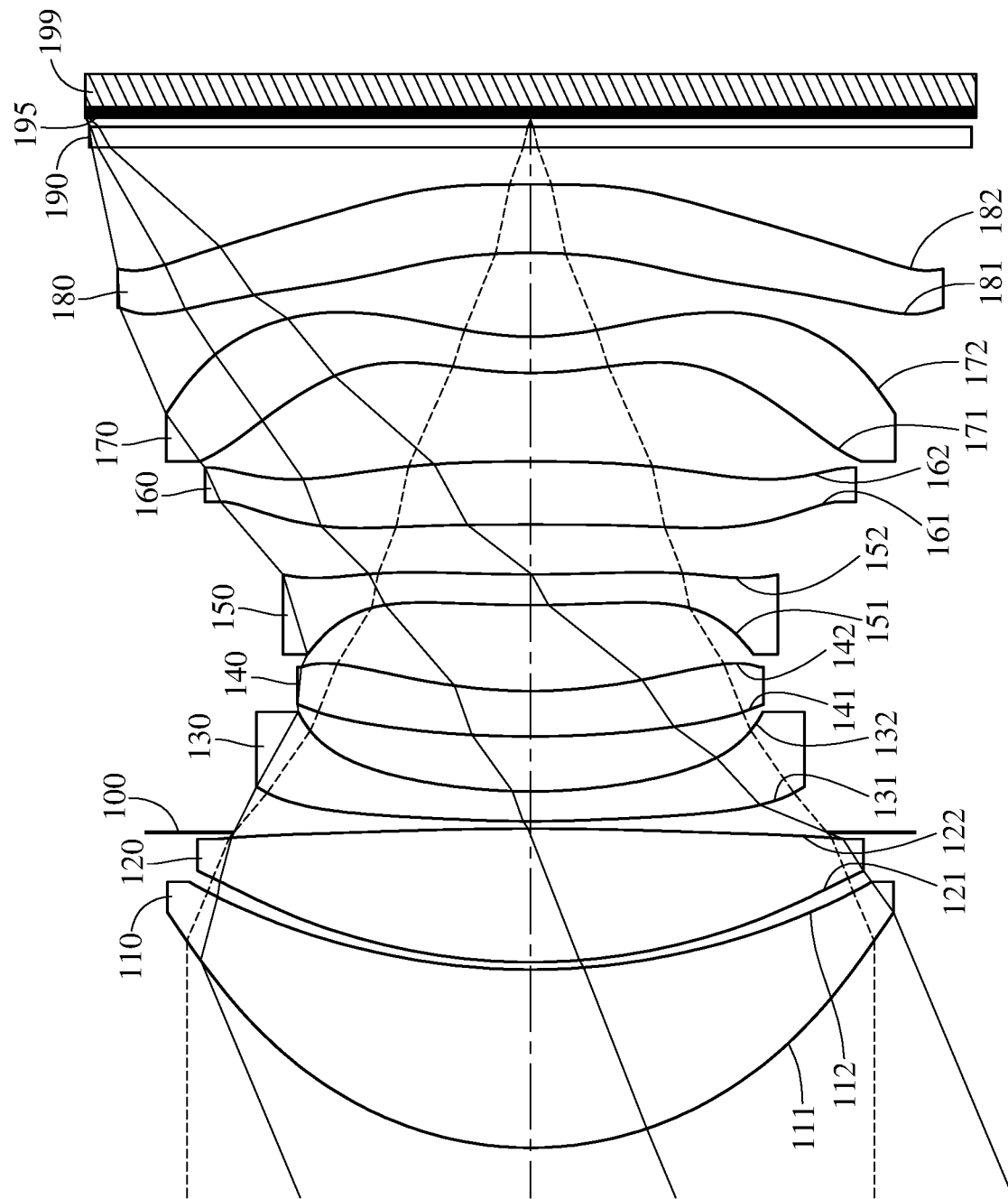
FIG. 1 is a schematic view of an image capturing unit according to the 1st embodiment of the present disclosure.
Figure 2:
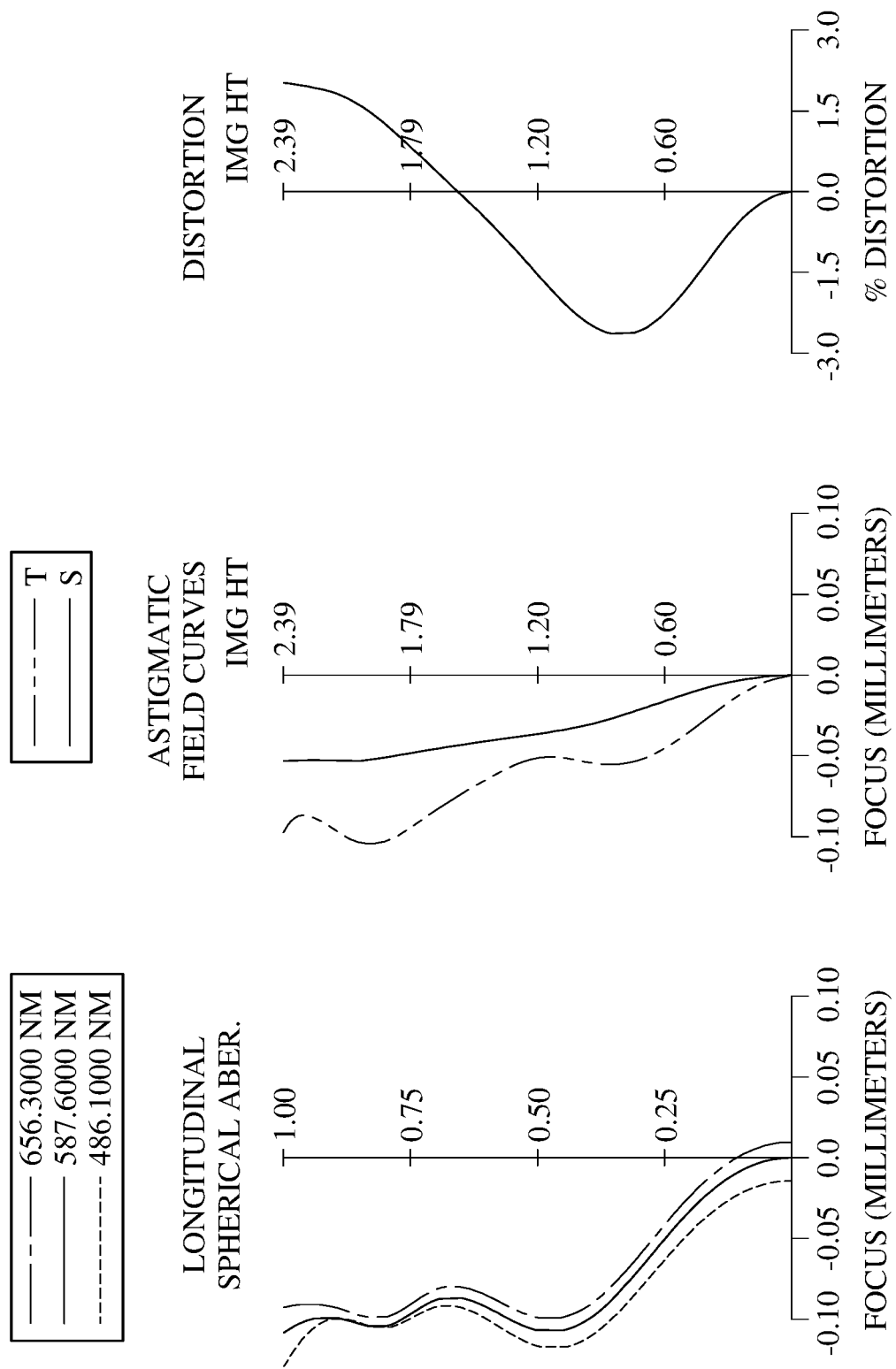
FIG. 2 shows spherical aberration curves, astigmatic field curves and a distortion curve of the image capturing unit according to the 1st embodiment.

FIG. 1 is a schematic view of an image capturing unit according to the 1st embodiment of the present disclosure. FIG. 2 shows, in order from left to right, spherical aberration curves, astigmatic field curves and a distortion curve of the image capturing unit according to the 1st embodiment. In FIG. 1, the image capturing unit includes the imaging lens system (its reference numeral is omitted) of the present disclosure and an image sensor 199. The imaging lens system includes, in order from an object side to an image side, a first lens element 110, a second lens element 120, an aperture stop 100, a third lens element 130, a fourth lens element 140, a fifth lens element 150, a sixth lens element 160, a seventh lens element 170, an eighth lens element 180, a filter 190 and an image surface 195. The imaging lens system includes eight lens elements (110, 120, 130, 140, 150, 160, 170 and 180) with no additional lens element disposed between each of the adjacent eight lens elements.

The first lens element 110 with positive refractive power has an object-side surface 111 being convex in a paraxial region thereof and an image-side surface 112 being concave in a paraxial region thereof. The first lens element 110 is made of plastic material and has the object-side surface 111 and the image-side surface 112 being both aspheric.

The second lens element 120 with positive refractive power has an object-side surface 121 being convex in a paraxial region thereof and an image-side surface 122 being convex in a paraxial region thereof. The second lens element 120 is made of plastic material and has the object-side surface 121 and the image-side surface 122 being both aspheric. The object-side surface 121 of the second lens element 120 has one inflection point. The image-side surface 122 of the second lens element 120 has two inflection points.

The third lens element 130 with negative refractive power has an object-side surface 131 being convex in a paraxial region thereof and an image-side surface 132 being concave in a paraxial region thereof. The third lens element 130 is made of plastic material and has the object-side surface 131 and the image-side surface 132 being both aspheric.

The fourth lens element 140 with negative refractive power has an object-side surface 141 being convex in a paraxial region thereof and an image-side surface 142 being concave in a paraxial region thereof. The fourth lens element 140 is made of plastic material and has the object-side surface 141 and the image-side surface 142 being both aspheric. The object-side surface 141 of the fourth lens element 140 has one inflection point. The image-side surface 142 of the fourth lens element 140 has one inflection point.

The fifth lens element 150 with positive refractive power has an object-side surface 151 being convex in a paraxial region thereof and an image-side surface 152 being concave in a paraxial region thereof. The fifth lens element 150 is made of plastic material and has the object-side surface 151 and the image-side surface 152 being both aspheric. The object-side surface 151 of the fifth lens element 150 has one inflection point. The image-side surface 152 of the fifth lens element 150 has two inflection points.

The sixth lens element 160 with positive refractive power has an object-side surface 161 being concave in a paraxial region thereof and an image-side surface 162 being convex in a paraxial region thereof. The sixth lens element 160 is made of plastic material and has the object-side surface 161 and the image-side surface 162 being both aspheric. The object-side surface 161 of the sixth lens element 160 has two inflection points. The image-side surface 162 of the sixth lens element 160 has two inflection points.

The seventh lens element 170 with negative refractive power has an object-side surface 171 being convex in a paraxial region thereof and an image-side surface 172 being concave in a paraxial region thereof. The seventh lens element 170 is made of plastic material and has the object-side surface 171 and the image-side surface 172 being both aspheric. The object-side surface 171 of the seventh lens element 170 has three inflection points. The image-side surface 172 of the seventh lens element 170 has two inflection points. The image-side surface 172 of the seventh lens element 170 has at least one critical point in an off-axis region thereof.

The eighth lens element 180 with negative refractive power has an object-side surface 181 being concave in a paraxial region thereof and an image-side surface 182 being convex in a paraxial region thereof. The eighth lens element 180 is made of plastic material and has the object-side surface 181 and the image-side surface 182 being both aspheric. The object-side surface 181 of the eighth lens element 180 has three inflection points. The image-side surface 182 of the eighth lens element 180 has one inflection point.

The filter 190 is made of glass material and located between the eighth lens element 180 and the image surface 195, and will not affect the focal length of the imaging lens system. The image sensor 199 is disposed on or near the image surface 195 of the imaging lens system.

The equation of the aspheric surface profiles of the aforementioned lens elements of the 1st embodiment is expressed as follows:

$$X(Y) = (Y^2/R)/(1 + \mathrm{sqrt}(1 - (1+k) \times (Y/R)^2)) + \sum_i (A_i) \times (Y^i),$$

where,

X is the relative distance between a point on the aspheric surface spaced at a distance Y from an optical axis and the tangential plane at the aspheric surface vertex on the optical axis;

Y is the vertical distance from the point on the aspheric surface to the optical axis;

R is the curvature radius;

k is the conic coefficient; and

Ai is the i-th aspheric coefficient, and in the embodiments, i may be, but is not limited to, 4, 6, 8, 10, 12, 14, 16 and 18.

In the imaging lens system of the image capturing unit according to the 1st embodiment, when a focal length of the imaging lens system is f, an f-number of the imaging lens system is Fno, and half of a maximum field of view of the imaging lens system is HFOV, these parameters have the following values: f=5.72 millimeters (mm), Fno=1.55, HFOV=22.8 degrees (deg.).

When an Abbe number of the eighth lens element 180 is V8, the following condition is satisfied: V8=18.7.

When a minimum value among Abbe numbers of all lens elements of the imaging lens system is Vmin, the following condition is satisfied: Vmin=18.7. In this embodiment, among the first lens element 110, the second lens element 120, the third lens element 130, the fourth lens element 140, the fifth lens element 150, the sixth lens element 160, the seventh lens element 170 and the eighth lens element 180, the Abbe number of the eighth lens element 180 is smaller than the Abbe numbers of the other lens elements, and Vmin is equal to the Abbe number of the eighth lens element 180.

When an Abbe number of the first lens element 110 is V1, an Abbe number of the second lens element 120 is V2, an Abbe number of the third lens element 130 is V3, an Abbe number of the fourth lens element 140 is V4, an Abbe number of the fifth lens element 150 is V5, an Abbe number of the sixth lens element 160 is V6, an Abbe number of the seventh lens element 170 is V7, the Abbe number of the eighth lens element 180 is V8, and an Abbe number of the i-th lens element is Vi, the following condition is satisfied: ΣVi=270.0, wherein i=1, 2, 3, 4, 5, 6, 7, 8.

When a maximum value among refractive indices of all lens elements of the imaging lens system is Nmax, the following condition is satisfied: Nmax=1.688. In this embodiment, among the first lens element 110, the second lens element 120, the third lens element 130, the fourth lens element 140, the fifth lens element 150, the sixth lens element 160, the seventh lens element 170 and the eighth lens element 180, the refractive index of the eighth lens element 180 is larger than the refractive indices of the other lens elements, and Nmax is equal to the refractive index of the eighth lens element 180.

When the Abbe number of the first lens element 110 is V1, the Abbe number of the second lens element 120 is V2, the Abbe number of the third lens element 130 is V3, the Abbe number of the fourth lens element 140 is V4, the Abbe number of the fifth lens element 150 is V5, the Abbe number of the sixth lens element 160 is V6, the Abbe number of the seventh lens element 170 is V7, the Abbe number of the eighth lens element 180 is V8, the Abbe number of the i-th lens element is Vi, a refractive index of the first lens element 110 is N1, a refractive index of the second lens element 120 is N2, a refractive index of the third lens element 130 is N3, a refractive index of the fourth lens element 140 is N4, a refractive index of the fifth lens element 150 is N5, a refractive index of the sixth lens element 160 is N6, a refractive index of the seventh lens element 170 is N7, a refractive index of the eighth lens element 180 is N8, a refractive index of the i-th lens element is Ni, and a minimum value of Vi/Ni is (Vi/Ni)min, the following condition is satisfied: (Vi/Ni)min=11.08. In this embodiment, (Vi/Ni)min is equal to V8/N8.

When a sum of central thicknesses of all lens elements of the imaging lens system is ΣCT, and a sum of axial distances between each of all adjacent lens elements of the imaging lens system is ΣAT, the following condition is satisfied: ΣCT/ΣAT=1.55. In this embodiment, an axial distance between two adjacent lens elements is an air gap in a paraxial region between the two adjacent lens elements. In addition, in this embodiment, ΣCT is a sum of the central thicknesses of the first lens element 110, the second lens element 120, the third lens element 130, the fourth lens element 140, the fifth lens element 150, the sixth lens element 160, the seventh lens element 170 and the eighth lens element 180; ΣAT is a sum of the axial distance between the first lens element 110 and the second lens element 120, the axial distance between the second lens element 120 and the third lens element 130, the axial distance between the third lens element 130 and the fourth lens element 140, the axial distance between the fourth lens element 140 and the fifth lens element 150, the axial distance between the fifth lens element 150 and the sixth lens element 160, the axial distance between the sixth lens element 160 and the seventh lens element 170, and the axial distance between the seventh lens element 170 and the eighth lens element 180.

When a curvature radius of the object-side surface 111 of the first lens element 110 is R1, and a central thickness of the first lens element 110 is CT1, the following condition is satisfied: R1/CT1=2.02.

When an axial distance between the image-side surface 182 of the eighth lens element 180 and the image surface 195 is BL, and the central thickness of the first lens element 110 is CT1, the following condition is satisfied: BL ΣCT1=0.37.

When a curvature radius of the image-side surface 142 of the fourth lens element 140 is R8, and the focal length of the imaging lens system is f, the following condition is satisfied: R8/f=0.47.

When a curvature radius of the object-side surface 161 of the sixth lens element 160 is R11, and a curvature radius of the image-side surface 162 of the sixth lens element 160 is R12, the following condition is satisfied: (R11+R12)/(R11-R12)=2.23.

When a curvature radius of the object-side surface 171 of the seventh lens element 170 is R13, and a curvature radius of the image-side surface 172 of the seventh lens element 170 is R14, the following condition is satisfied: (R13−R14)/(R13+R14)=0.13.

When the focal length of the imaging lens system is f, and a focal length of the first lens element 110 is f1, the following condition is satisfied: f/f1=0.94.

When the focal length of the imaging lens system is f, and a focal length of the fifth lens element 150 is f5, the following condition is satisfied: f/f5=0.17.

When the focal length of the fifth lens element 150 is f5, and a focal length of the seventh lens element 170 is f7, the following condition is satisfied: f5/f7=−2.32.

When the focal length of the fifth lens element 150 is f5, and a focal length of the eighth lens element 180 is f8, the following condition is satisfied: f8/f5=−0.17.

When the focal length of the imaging lens system is f, the focal length of the fifth lens element 150 is f5, and a focal length of the sixth lens element 160 is f6, the following condition is satisfied: f/f5+f/f6=0.37.

When a maximum image height of the imaging lens system is ImgH, the following condition is satisfied: ImgH=2.39 [mm].

When an axial distance between the object-side surface 111 of the first lens element 110 and the image surface 195 is TL, the following condition is satisfied: TL=5.54 [mm].

When the axial distance between the object-side surface 111 of the first lens element 110 and the image surface 195 is TL, and the focal length of the imaging lens system is f, the following condition is satisfied: TL/f=0.97.

When the axial distance between the object-side surface 111 of the first lens element 110 and the image surface 195 is TL, and an entrance pupil diameter of the imaging lens system is EPD, the following condition is satisfied: TL/EPD=1.50.

When an axial distance between the aperture stop 100 and the image surface 195 is SL, and the axial distance between the object-side surface 111 of the first lens element 110 and the image surface 195 is TL, the following condition is satisfied: SL/TL=0.69.

When the axial distance between the image-side surface 182 of the eighth lens element 180 and the image surface 195 is BL, and an axial distance between the object-side surface 111 of the first lens element 110 and the image-side surface 182 of the eighth lens element 180 is TD, the following condition is satisfied: BL/TD=0.07.

When the entrance pupil diameter of the imaging lens system is EPD, and the maximum image height of the imaging lens system is ImgH, the following condition is satisfied: EPD/ImgH=1.54.

When the entrance pupil diameter of the imaging lens system is EPD, and the axial distance between the image-side surface 182 of the eighth lens element 180 and the image surface 195 is BL, the following condition is satisfied: EPD/BL=10.32.

When the focal length of the imaging lens system is f, and the entrance pupil diameter of the imaging lens system is EPD, the following condition is satisfied: f/EPD=1.55.

When a maximum effective radius of the object-side surface 111 of the first lens element 110 is Y11, the maximum image height of the imaging lens system is ImgH, and the entrance pupil diameter of the imaging lens system is EPD, the following condition is satisfied: (Y11−ImgH)/EPD=−0.12.

When the focal length of the imaging lens system is f, half of the maximum field of view of the imaging lens system is HFOV, and the entrance pupil diameter of the imaging lens system is EPD, the following condition is satisfied: f×tan(HFOV)/EPD=0.65.

When the maximum effective radius of the object-side surface 111 of the first lens element 110 is Y11, a maximum effective radius of the image-side surface 182 of the eighth lens element 180 is Y82, the axial distance between the image-side surface 182 of the eighth lens element 180 and the image surface 195 is BL, and the focal length of the imaging lens system is f, the following condition is satisfied: (|Y11-Y82|+BL)/f=0.11.

When the maximum effective radius of the object-side surface 111 of the first lens element 110 is Y11, a maximum effective radius of the object-side surface 151 of the fifth lens element 150 is Y51, and the maximum effective radius of the image-side surface 182 of the eighth lens element 180 is Y82, the following condition is satisfied: (Y82−Y51)/(Y11−Y51)=1.35.

When the maximum effective radius of the object-side surface 111 of the first lens element 110 is Y11, the maximum effective radius of the image-side surface 182 of the eighth lens element 180 is Y82, the maximum image height of the imaging lens system is ImgH, and the focal length of the imaging lens system is f, the following condition is satisfied: (|Y11−Y82|+|Y82−ImgH|)/f=0.08.

When the focal length of the imaging lens system is f, and the maximum image height of the imaging lens system is ImgH, the following condition is satisfied: f/ImgH=2.39.

When a vertical distance between the at least one critical point on the image-side surface 172 of the seventh lens element 170 and the optical axis is Yc72, and the focal length of the imaging lens system is f, the following condition is satisfied: Yc72/f=0.18.

When the focal length of the imaging lens system is f, the curvature radius of the object-side surface 111 of the first lens element 110 is R1, and a curvature radius of the image-side surface 112 of the first lens element 110 is R2, the following condition is satisfied: |f/R1|+|f/R2|=4.47.

When the focal length of the imaging lens system is f, a curvature radius of the object-side surface 121 of the second lens element 120 is R3, and a curvature radius of the image-side surface 122 of the second lens element 120 is R4, the following condition is satisfied: |f/R3|+|f/R4|=1.94.

When the focal length of the imaging lens system is f, a curvature radius of the object-side surface 131 of the third lens element 130 is R5, and a curvature radius of the image-side surface 132 of the third lens element 130 is R6, the following condition is satisfied: |f/R5|+|f/R6|=2.92.

When the focal length of the imaging lens system is f, a curvature radius of the object-side surface 141 of the fourth lens element 140 is R7, and the curvature radius of the image-side surface 142 of the fourth lens element 140 is R8, the following condition is satisfied: |f/R7|+|f/R8|=3.14.

When the focal length of the imaging lens system is f, a curvature radius of the object-side surface 151 of the fifth lens element 150 is R9, and a curvature radius of the image-side surface 152 of the fifth lens element 150 is R10, the following condition is satisfied: |f/R9|+|f/R10|=1.56.

When the focal length of the imaging lens system is f, the curvature radius of the object-side surface 161 of the sixth lens element 160 is R11, and the curvature radius of the image-side surface 162 of the sixth lens element 160 is R12, the following condition is satisfied: |f/R11|+|f/R12|=0.66.

When the focal length of the imaging lens system is f, the curvature radius of the object-side surface 171 of the seventh lens element 170 is R13, and the curvature radius of the image-side surface 172 of the seventh lens element 170 is R14, the following condition is satisfied: |f/R13|+|f/R14|=6.46.

When the focal length of the imaging lens system is f, a curvature radius of the object-side surface 181 of the eighth lens element 180 is R15, and a curvature radius of the image-side surface 182 of the eighth lens element 180 is R16, the following condition is satisfied: |f/R15|+|f/R16|=1.61.

When the Abbe number of the first lens element 110 is V1, and the refractive index of the first lens element 110 is N1, the following condition is satisfied: V1/N1=36.30.

When the Abbe number of the second lens element 120 is V2, and the refractive index of the second lens element 120 is N2, the following condition is satisfied: V2/N2=36.30.

When the Abbe number of the third lens element 130 is V3, and the refractive index of the third lens element 130 is N3, the following condition is satisfied: V3/N3=11.66.

When the Abbe number of the fourth lens element 140 is V4, and the refractive index of the fourth lens element 140 is N4, the following condition is satisfied: V4/N4=14.34.

When the Abbe number of the fifth lens element 150 is V5, and the refractive index of the fifth lens element 150 is N5, the following condition is satisfied: V5/N5=13.01.

When the Abbe number of the sixth lens element 160 is V6, and the refractive index of the sixth lens element 160 is N6, the following condition is satisfied: V6/N6=11.24.

When the Abbe number of the seventh lens element 170 is V7, and the refractive index of the seventh lens element 170 is N7, the following condition is satisfied: V7/N7=36.23.

When the Abbe number of the eighth lens element 180 is V8, and the refractive index of the eighth lens element 180 is N8, the following condition is satisfied: V8/N8=11.08.

The detailed optical data of the 1st embodiment are shown in Table 1 and the aspheric surface data are shown in Table 2 below.

TABLE 1

1st Embodiment
f = 5.72 mm, Fno = 1.55, HFOV = 22.8 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 1.932 (ASP) | 0.958 | Plastic | 1.545 | 56.1 | 6.12 |
| 2 | | 3.790 (ASP) | 0.040 | | | | |
| 3 | Lens 2 | 3.425 (ASP) | 0.717 | Plastic | 1.545 | 56.1 | 5.46 |
| 4 | | −21.105 (ASP) | −0.020 | | | | |
| 5 | Ape. Stop | Plano | 0.060 | | | | |
| 6 | Lens 3 | 6.311 (ASP) | 0.160 | Plastic | 1.669 | 19.5 | −7.88 |
| 7 | | 2.843 (ASP) | 0.296 | | | | |
| 8 | Lens 4 | 5.526 (ASP) | 0.244 | Plastic | 1.639 | 23.5 | −8.66 |
| 9 | | 2.717 (ASP) | 0.462 | | | | |
| 10 | Lens 5 | 6.328 (ASP) | 0.165 | Plastic | 1.650 | 21.5 | 34.38 |
| 11 | | 8.735 (ASP) | 0.268 | | | | |
| 12 | Lens 6 | −31.526 (ASP) | 0.339 | Plastic | 1.672 | 18.8 | 28.70 |
| 13 | | −12.017 (ASP) | 0.476 | | | | |
| 14 | Lens 7 | 2.034 (ASP) | 0.195 | Plastic | 1.544 | 55.9 | −14.85 |
| 15 | | 1.570 (ASP) | 0.450 | | | | |
| 16 | Lens 8 | −3.788 (ASP) | 0.368 | Plastic | 1.688 | 18.7 | −5.89 |
| 17 | | −60.027 (ASP) | 0.200 | | | | |
| 18 | Filter | Plano | 0.110 | Glass | 1.517 | 64.2 | — |
| 19 | | Plano | 0.048 | | | | |
| 20 | Image | Plano | — | | | | |

Note:
Reference wavelength is 587.6 nm (d-line).

TABLE 2

Aspheric Coefficients

| | Surface # | | | | | |
|---|---|---|---|---|---|---|
| | 1 | 2 | 3 | 4 | 6 | 7 |
| k= | −2.9818E−01 | −2.1159E−01 | 1.9516E−01 | 9.0000E+01 | −1.5515E+01 | −7.7859E+00 |
| A4= | −1.3398E−04 | 1.9575E−02 | 2.2307E−02 | −7.1350E−03 | −1.0608E−01 | −7.4307E−02 |

TABLE 2-continued

Aspheric Coefficients

| | | | | | | |
|---|---|---|---|---|---|---|
| A6= | 6.7041E−03 | −4.2606E−02 | −4.6342E−02 | 2.2191E−02 | 1.8304E−01 | 2.4706E−01 |
| A8= | −6.8806E−03 | 3.5360E−02 | 3.7358E−02 | −1.7351E−02 | −1.7393E−01 | −2.6206E−01 |
| A10= | 3.5068E−03 | −1.4054E−02 | −1.4188E−02 | 7.1729E−03 | 9.9062E−02 | 1.6566E−01 |
| A12= | −8.1799E−04 | 2.6735E−03 | 2.5169E−03 | −1.6202E−03 | −2.8945E−02 | −5.5348E−02 |
| A14= | 6.4288E−05 | −1.9300E−04 | −1.7231E−04 | 1.5350E−04 | 3.4512E−03 | 1.2167E−02 |

| | Surface # | | | | | |
|---|---|---|---|---|---|---|
| | 8 | 9 | 10 | 11 | 12 | 13 |
| k= | −6.1750E+00 | 1.5329E+00 | −2.6403E+01 | −9.4358E+00 | 4.7871E+01 | 2.2295E+01 |
| A4= | −3.8548E−02 | −9.4467E−02 | −6.2958E−02 | −6.0453E−02 | −1.7510E−02 | −5.4373E−02 |
| A6= | 1.2033E−01 | 1.5860E−01 | −1.8085E−01 | −6.7026E−02 | −5.7394E−02 | 1.6055E−02 |
| A8= | −1.1681E−01 | −1.9405E−01 | 3.5816E−01 | 1.4773E−01 | 1.5074E−01 | 1.1166E−02 |
| A10= | 2.1499E−02 | 7.1861E−03 | −5.6492E−01 | −1.8999E−01 | −1.0806E−01 | 1.1721E−03 |
| A12= | 3.3097E−02 | 1.4223E−01 | 4.7251E−01 | 1.5808E−01 | 3.6239E−02 | −3.4809E−03 |
| A14= | −1.3689E−02 | −1.0679E−01 | −2.0462E−01 | −6.3406E−02 | −5.6969E−03 | 9.5901E−04 |
| A16= | — | 2.4002E−02 | 3.6694E−02 | 9.3902E−03 | 2.9652E−04 | −8.8434E−05 |

| | Surface # | | | |
|---|---|---|---|---|
| | 14 | 15 | 16 | 17 |
| k= | −6.6696E+00 | −1.9700E+00 | −6.2564E+01 | 9.0000E+01 |
| A4= | −2.0747E−01 | −2.4561E−01 | −3.3748E−01 | −3.7607E−01 |
| A6= | 1.5432E−02 | 1.1142E−01 | 5.4640E−01 | 4.3917E−01 |
| A8= | −4.1439E−02 | −2.7705E−02 | −4.1852E−01 | −2.6820E−01 |
| A10= | 8.1875E−02 | −1.3161E−03 | 1.8359E−01 | 9.4698E−02 |
| A12= | −5.0008E−02 | 1.4485E−03 | −4.8465E−02 | −1.9049E−02 |
| A14= | 1.4026E−02 | 3.8338E−04 | 7.5566E−03 | 1.9194E−03 |
| A16= | −1.7700E−03 | −2.4250E−04 | −6.3422E−04 | −5.1294E−05 |
| A18= | 7.1084E−05 | 2.8498E−05 | 2.1805E−05 | −3.3209E−06 |

In Table 1, the curvature radius, the thickness and the focal length are shown in millimeters (mm). Surface numbers 0-20 represent the surfaces sequentially arranged from the object side to the image side along the optical axis. In Table 2, k represents the conic coefficient of the equation of the aspheric surface profiles. A4-18 represent the aspheric coefficients ranging from the 4th order to the 18th order. The tables presented below for each embodiment are the corresponding schematic parameter and aberration curves, and the definitions of the tables are the same as Table 1 and Table 2 of the 1st embodiment. Therefore, an explanation in this regard will not be provided again.

2nd Embodiment

Figure 3:
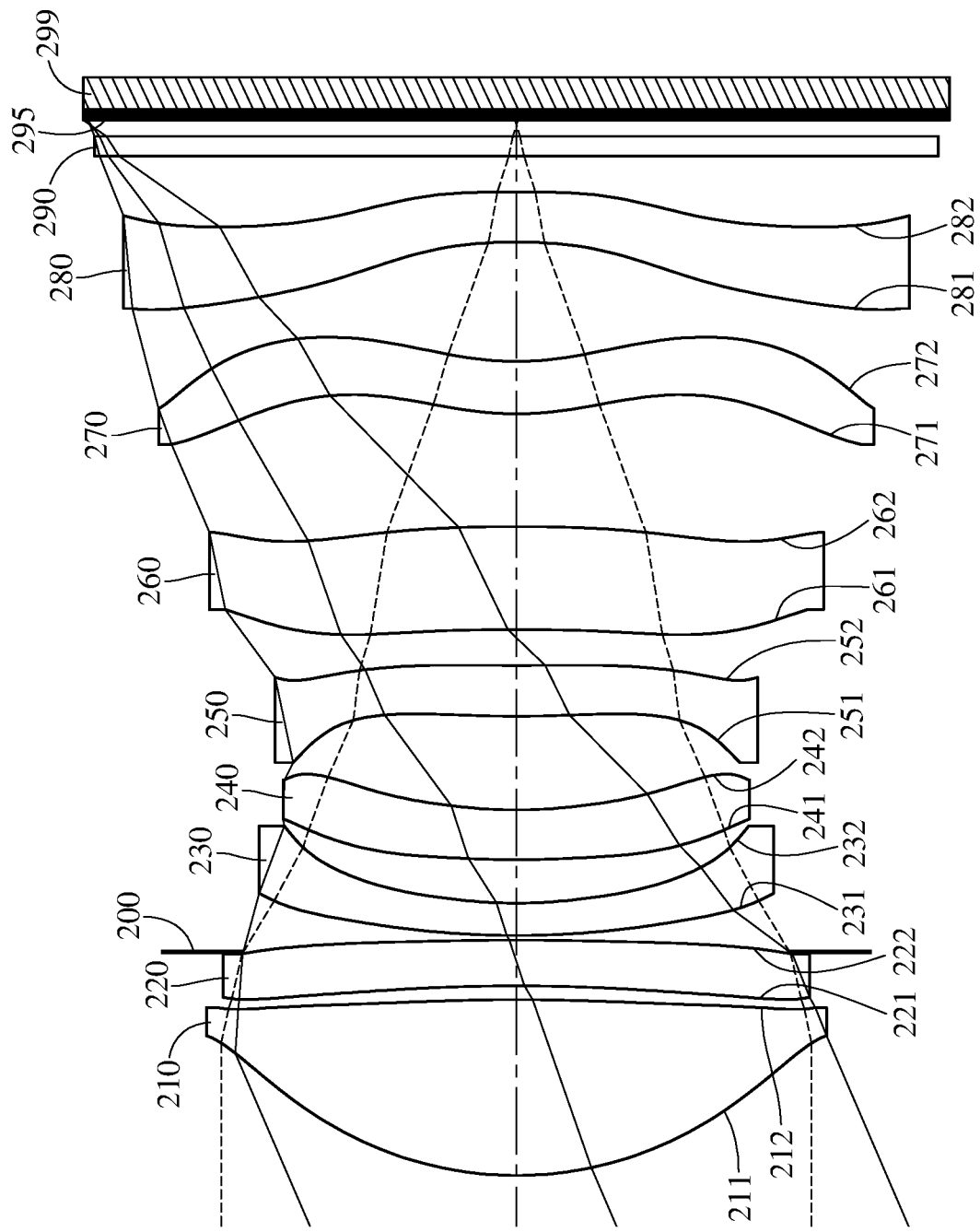
FIG. 3 is a schematic view of an image capturing unit according to the 2nd embodiment of the present disclosure.
Figure 4:
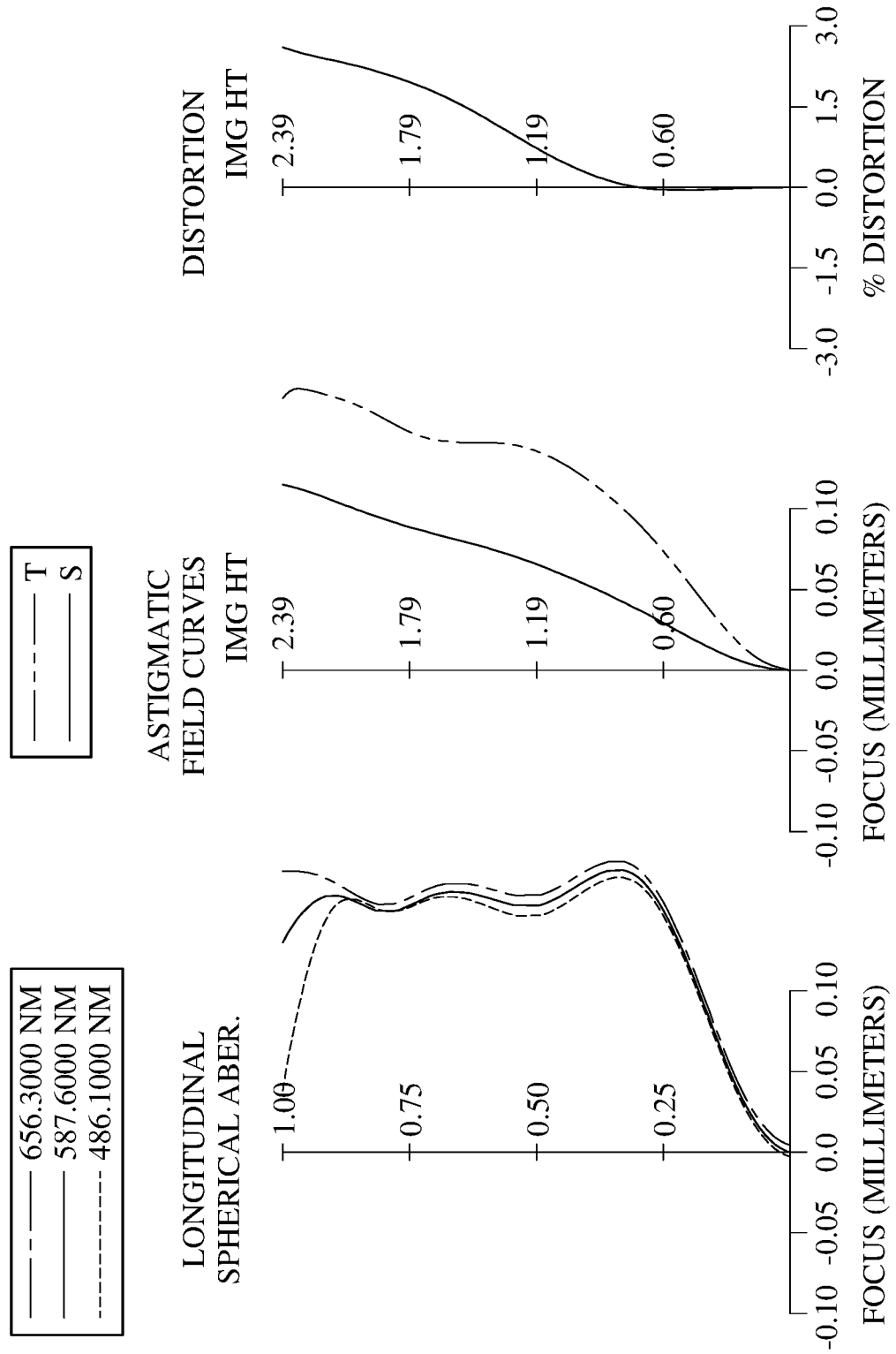
FIG. 4 shows spherical aberration curves, astigmatic field curves and a distortion curve of the image capturing unit according to the 2nd embodiment.

FIG. 3 is a schematic view of an image capturing unit according to the 2nd embodiment of the present disclosure. FIG. 4 shows, in order from left to right, spherical aberration curves, astigmatic field curves and a distortion curve of the image capturing unit according to the 2nd embodiment. In FIG. 3, the image capturing unit includes the imaging lens system (its reference numeral is omitted) of the present disclosure and an image sensor 299. The imaging lens system includes, in order from an object side to an image side, a first lens element 210, a second lens element 220, an aperture stop 200, a third lens element 230, a fourth lens element 240, a fifth lens element 250, a sixth lens element 260, a seventh lens element 270, an eighth lens element 280, a filter 290 and an image surface 295. The imaging lens system includes eight lens elements (210, 220, 230, 240, 250, 260, 270 and 280) with no additional lens element disposed between each of the adjacent eight lens elements.

The first lens element 210 with positive refractive power has an object-side surface 211 being convex in a paraxial region thereof and an image-side surface 212 being convex in a paraxial region thereof. The first lens element 210 is made of plastic material and has the object-side surface 211 and the image-side surface 212 being both aspheric. The object-side surface 211 of the first lens element 210 has one inflection point. The image-side surface 212 of the first lens element 210 has three inflection points.

The second lens element 220 with negative refractive power has an object-side surface 221 being concave in a paraxial region thereof and an image-side surface 222 being convex in a paraxial region thereof. The second lens element 220 is made of plastic material and has the object-side surface 221 and the image-side surface 222 being both aspheric. The object-side surface 221 of the second lens element 220 has one inflection point.

The third lens element 230 with negative refractive power has an object-side surface 231 being convex in a paraxial region thereof and an image-side surface 232 being concave in a paraxial region thereof. The third lens element 230 is made of plastic material and has the object-side surface 231 and the image-side surface 232 being both aspheric.

The fourth lens element 240 with negative refractive power has an object-side surface 241 being convex in a paraxial region thereof and an image-side surface 242 being concave in a paraxial region thereof. The fourth lens element 240 is made of plastic material and has the object-side surface 241 and the image-side surface 242 being both aspheric. The object-side surface 241 of the fourth lens element 240 has one inflection point. The image-side surface 242 of the fourth lens element 240 has one inflection point.

The fifth lens element 250 with positive refractive power has an object-side surface 251 being convex in a paraxial region thereof and an image-side surface 252 being concave in a paraxial region thereof. The fifth lens element 250 is made of plastic material and has the object-side surface 251 and the image-side surface 252 being both aspheric. The object-side surface 251 of the fifth lens element 250 has two inflection points. The image-side surface 252 of the fifth lens element 250 has two inflection points.

The sixth lens element 260 with positive refractive power has an object-side surface 261 being concave in a paraxial region thereof and an image-side surface 262 being convex in a paraxial region thereof. The sixth lens element 260 is made of plastic material and has the object-side surface 261 and the image-side surface 262 being both aspheric. The object-side surface 261 of the sixth lens element 260 has two inflection points. The image-side surface 262 of the sixth lens element 260 has two inflection points.

The seventh lens element 270 with positive refractive power has an object-side surface 271 being convex in a paraxial region thereof and an image-side surface 272 being concave in a paraxial region thereof. The seventh lens element 270 is made of plastic material and has the object-side surface 271 and the image-side surface 272 being both aspheric. The object-side surface 271 of the seventh lens element 270 has two inflection points. The image-side surface 272 of the seventh lens element 270 has two inflection points. The image-side surface 272 of the seventh lens element 270 has at least one critical point in an off-axis region thereof.

The eighth lens element 280 with negative refractive power has an object-side surface 281 being concave in a paraxial region thereof and an image-side surface 282 being convex in a paraxial region thereof. The eighth lens element 280 is made of plastic material and has the object-side surface 281 and the image-side surface 282 being both aspheric. The object-side surface 281 of the eighth lens element 280 has one inflection point. The image-side surface 282 of the eighth lens element 280 has one inflection point.

The filter 290 is made of glass material and located between the eighth lens element 280 and the image surface 295, and will not affect the focal length of the imaging lens system. The image sensor 299 is disposed on or near the image surface 295 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 280 is V8, and a refractive index of the eighth lens element 280 is N8.

The detailed optical data of the 2nd embodiment are shown in Table 3 and the aspheric surface data are shown in Table 4 below.

TABLE 3

2nd Embodiment
f = 5.13 mm, Fno = 1.56, HFOV = 23.3 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 2.010 (ASP) | 0.980 | Plastic | 1.545 | 56.1 | 3.22 |
| 2 | | −11.396 (ASP) | 0.077 | | | | |
| 3 | Lens 2 | −11.113 (ASP) | 0.255 | Plastic | 1.650 | 28.0 | −58.50 |
| 4 | | −15.844 (ASP) | −0.066 | | | | |
| 5 | Ape. Stop | Plano | 0.092 | | | | |
| 6 | Lens 3 | 4.642 (ASP) | 0.180 | Plastic | 1.669 | 19.5 | −8.51 |
| 7 | | 2.517 (ASP) | 0.242 | | | | |
| 8 | Lens 4 | 4.751 (ASP) | 0.278 | Plastic | 1.639 | 23.5 | −9.60 |
| 9 | | 2.616 (ASP) | 0.522 | | | | |
| 10 | Lens 5 | 5.448 (ASP) | 0.283 | Plastic | 1.650 | 21.5 | 13.02 |
| 11 | | 14.961 (ASP) | 0.200 | | | | |
| 12 | Lens 6 | −18.166 (ASP) | 0.574 | Plastic | 1.672 | 18.8 | 114.95 |
| 13 | | −14.894 (ASP) | 0.629 | | | | |
| 14 | Lens 7 | 1.704 (ASP) | 0.292 | Plastic | 1.544 | 55.9 | 367.07 |
| 15 | | 1.615 (ASP) | 0.666 | | | | |
| 16 | Lens 8 | −2.878 (ASP) | 0.279 | Plastic | 1.688 | 18.7 | −5.02 |
| 17 | | −17.953 (ASP) | 0.200 | | | | |
| 18 | Filter | Plano | 0.110 | Glass | 1.517 | 64.2 | — |
| 19 | | Plano | 0.091 | | | | |
| 20 | Image | Plano | — | | | | |

Note:
Reference wavelength is 587.6 nm (d-line).

TABLE 4

Aspheric Coefficients

| | Surface # | | | | | |
|---|---|---|---|---|---|---|
| | 1 | 2 | 3 | 4 | 6 | 7 |
| k= | −3.8546E−01 | −5.0000E+01 | −3.8697E+01 | 6.3869E+01 | −5.5442E+00 | −8.6951E+00 |
| A4= | −2.4107E−03 | 1.1382E−02 | −2.4848E−02 | 2.7928E−02 | −6.9479E−02 | −1.3821E−01 |
| A6= | 1.8521E−02 | 5.8912E−03 | 4.9651E−02 | −1.6609E−02 | 2.3298E−01 | 3.5136E−01 |
| A8= | −2.0649E−02 | −6.4475E−03 | −3.4581E−02 | −3.9789E−03 | −3.3170E−01 | −2.0806E−01 |
| A10= | 1.2040E−02 | 7.8321E−04 | 9.9460E−03 | 6.4554E−03 | 2.2356E−01 | −6.7145E−02 |
| A12= | −3.4675E−03 | 2.0852E−04 | −8.8650E−04 | −2.0111E−03 | −6.9416E−02 | 1.2180E−01 |
| A14= | 3.2888E−04 | — | — | 1.8438E−04 | 8.1147E−03 | −3.3562E−02 |

TABLE 4-continued

Aspheric Coefficients

Surface #

| | 8 | 9 | 10 | 11 | 12 | 13 |
|---|---|---|---|---|---|---|
| k= | −5.7395E+00 | 1.8708E+00 | −1.3183E+01 | −9.0000E+01 | 1.2407E+01 | 3.5550E+01 |
| A4= | −2.1465E−01 | −1.7568E−01 | −2.0134E−01 | −1.7781E−01 | −9.0865E−02 | −9.2370E−02 |
| A6= | 4.8879E−01 | 2.9066E−01 | 3.1565E−01 | 2.4726E−01 | 1.5525E−01 | 1.0693E−01 |
| A8= | −3.4607E−01 | −6.2755E−02 | −6.8233E−01 | −3.3296E−01 | −8.7085E−02 | −6.6080E−02 |
| A10= | 3.7788E−02 | −3.5340E−01 | 9.0729E−01 | 3.6526E−01 | 2.7898E−02 | 2.8529E−02 |
| A12= | 6.1480E−02 | 4.2034E−01 | −7.4012E−01 | −2.8247E−01 | −5.1207E−03 | −5.9526E−03 |
| A14= | −2.0640E−02 | −2.0387E−01 | 3.1004E−01 | 1.2454E−01 | 3.9186E−04 | 1.6928E−04 |
| A16= | — | 3.6974E−02 | −4.9699E−02 | −2.1852E−02 | — | 6.4342E−05 |

Surface #

| | 14 | 15 | 16 | 17 |
|---|---|---|---|---|
| k= | −4.9523E+00 | −1.7479E+00 | −1.0364E+01 | 5.9343E+01 |
| A4= | −1.5260E−01 | −2.1352E−01 | −2.8107E−01 | −3.7829E−01 |
| A6= | 6.0657E−03 | 4.7865E−02 | 3.8726E−01 | 4.8242E−01 |
| A8= | 3.6583E−02 | 3.3178E−02 | −2.3914E−01 | −2.9209E−01 |
| A10= | −2.2972E−02 | −3.3136E−02 | 8.2801E−02 | 1.0396E−01 |
| A12= | 6.9555E−03 | 1.2058E−02 | −1.6657E−02 | −2.2821E−02 |
| A14= | −1.0604E−03 | −2.1120E−03 | 1.8498E−03 | 3.0493E−03 |
| A16= | 6.4788E−05 | 1.4854E−04 | −9.3831E−05 | −2.2789E−04 |
| A18= | — | — | 9.5301E−07 | 7.3197E−06 |

In the 2nd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 2nd embodiment, so an explanation in this regard will not be provided again.

Moreover, these parameters can be calculated from Table 3 and Table 4 as the following values and satisfy the following conditions:

| 2nd Embodiment | | | |
|---|---|---|---|
| f [mm] | 5.13 | EPD/BL | 8.20 |
| Fno | 1.56 | f/EPD | 1.56 |
| HFOV [deg.] | 23.3 | (Y11 − ImgH)/EPD | −0.20 |
| V8 | 18.7 | f × tan(HFOV)/EPD | 0.67 |
| Vmin | 18.7 | (|Y11 − Y82| + BL)/f | 0.17 |
| ΣVi | 241.9 | (Y82 − Y51)/(Y11 − Y51) | 1.96 |
| Nmax | 1.688 | (|Y11 − Y82| + |Y82 − ImgH|)/f | 0.13 |
| (Vi/Ni)min | 11.08 | f/ImgH | 2.15 |
| ΣCT/ΣAT | 1.32 | Yc72/f | 0.20 |
| R1/CT1 | 2.05 | |f/R1| + |f/R2| | 3.00 |
| BL/CT1 | 0.41 | |f/R3| + |f/R4| | 0.79 |
| R8/f | 0.51 | |f/R5| + |f/R6| | 3.14 |
| (R11 + R12)/ | 10.10 | |f/R7| + |f/R8| | 3.04 |
| (R11 − R12) | | |f/R9| + |f/R10| | 1.28 |
| (R13 − R14)/ | 0.03 | |f/R11| + |f/R12| | 0.63 |
| (R13 + R14) | | |f/R13| + |f/R14| | 6.19 |
| f/f1 | 1.59 | |f/R15| + |f/R16| | 2.07 |
| f/f5 | 0.39 | V1/N1 | 36.30 |
| f5/f7 | 0.04 | V2/N2 | 16.97 |
| f8/f5 | −0.39 | V3/N3 | 11.66 |
| f/f5 + f/f6 | 0.44 | V4/N4 | 14.34 |
| ImgH [mm] | 2.39 | V5/N5 | 13.01 |
| TL [mm] | 5.88 | V6/N6 | 11.24 |
| TL/f | 1.15 | V7/N7 | 36.23 |
| TL/EPD | 1.79 | V8/N8 | 11.08 |
| SL/TL | 0.79 | — | — |
| BL/TD | 0.07 | | |
| EPD/ImgH | 1.38 | | |

3rd Embodiment

Figure 5:
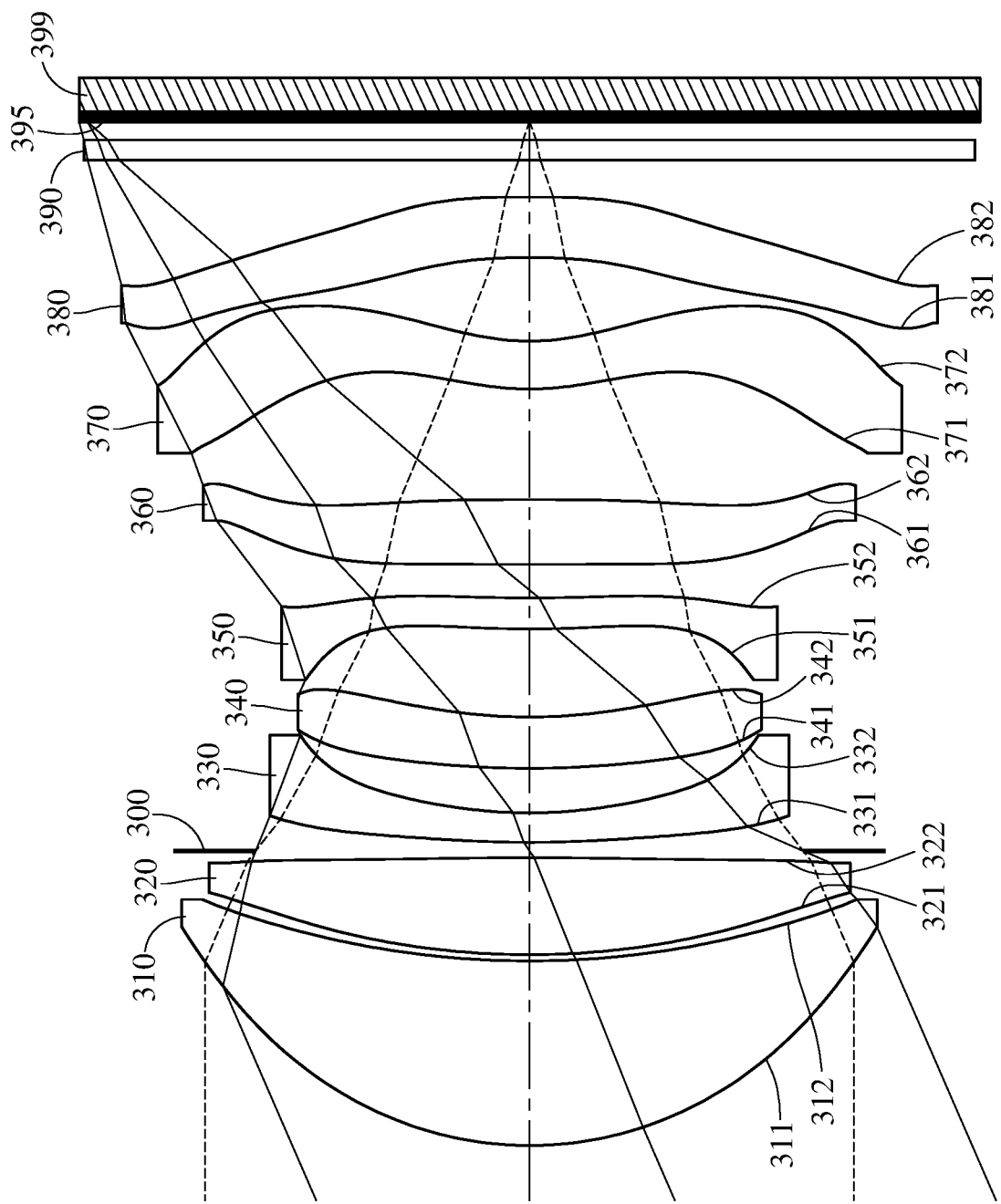
FIG. 5 is a schematic view of an image capturing unit according to the 3rd embodiment of the present disclosure.
Figure 6:
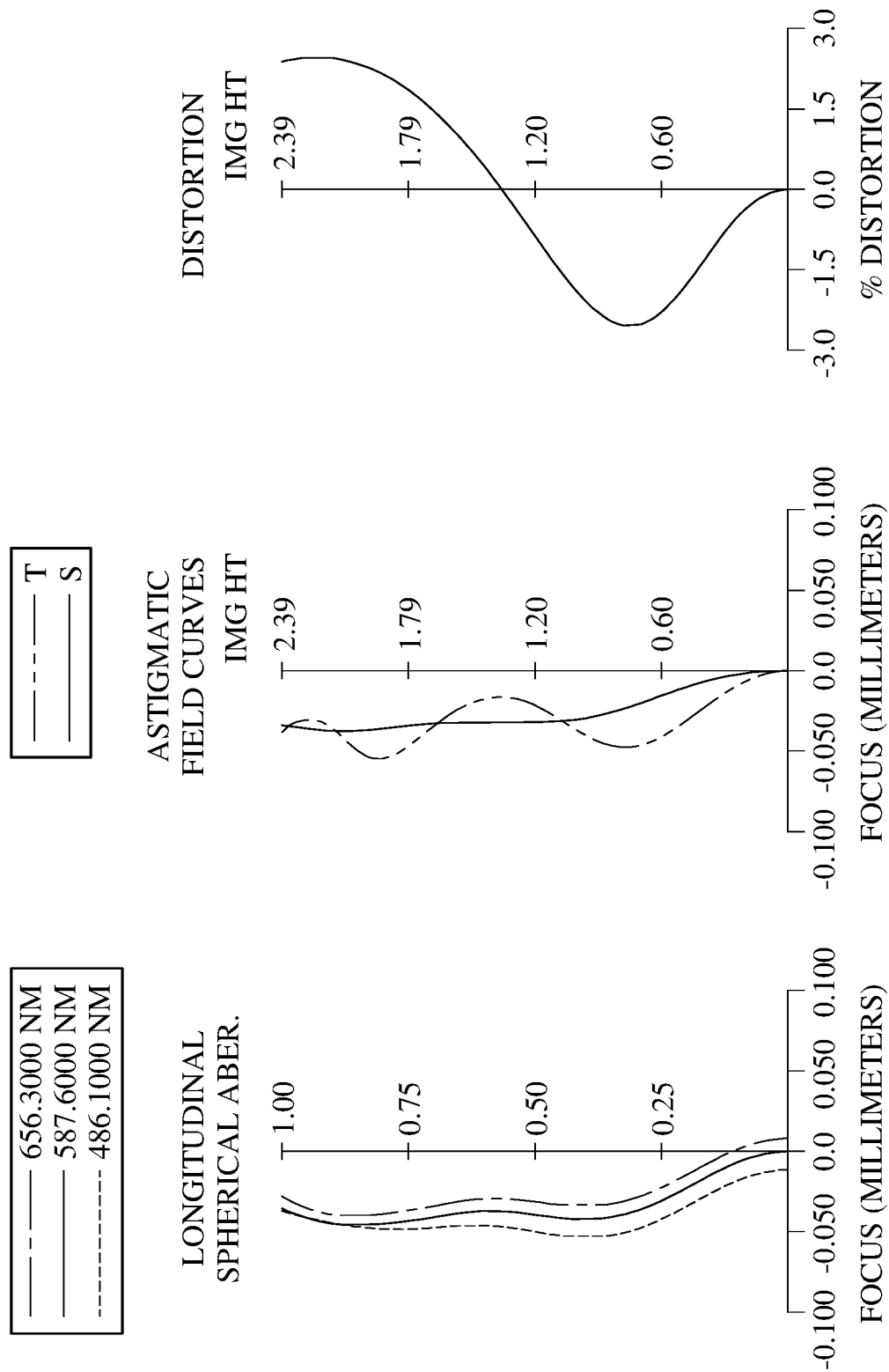
FIG. 6 shows spherical aberration curves, astigmatic field curves and a distortion curve of the image capturing unit according to the 3rd embodiment.

FIG. 5 is a schematic view of an image capturing unit according to the 3rd embodiment of the present disclosure. FIG. 6 shows, in order from left to right, spherical aberration curves, astigmatic field curves and a distortion curve of the image capturing unit according to the 3rd embodiment. In FIG. 5, the image capturing unit includes the imaging lens system (its reference numeral is omitted) of the present disclosure and an image sensor 399. The imaging lens system includes, in order from an object side to an image side, a first lens element 310, a second lens element 320, an aperture stop 300, a third lens element 330, a fourth lens element 340, a fifth lens element 350, a sixth lens element 360, a seventh lens element 370, an eighth lens element 380, a filter 390 and an image surface 395. The imaging lens system includes eight lens elements (310, 320, 330, 340, 350, 360, 370 and 380) with no additional lens element disposed between each of the adjacent eight lens elements.

The first lens element 310 with positive refractive power has an object-side surface 311 being convex in a paraxial region thereof and an image-side surface 312 being concave in a paraxial region thereof. The first lens element 310 is made of plastic material and has the object-side surface 311 and the image-side surface 312 being both aspheric.

The second lens element 320 with positive refractive power has an object-side surface 321 being convex in a paraxial region thereof and an image-side surface 322 being convex in a paraxial region thereof. The second lens element 320 is made of plastic material and has the object-side surface 321 and the image-side surface 322 being both aspheric. The object-side surface 321 of the second lens element 320 has one inflection point. The image-side surface 322 of the second lens element 320 has two inflection points.

The third lens element 330 with negative refractive power has an object-side surface 331 being convex in a paraxial region thereof and an image-side surface 332 being concave in a paraxial region thereof. The third lens element 330 is made of plastic material and has the object-side surface 331 and the image-side surface 332 being both aspheric.

The fourth lens element 340 with negative refractive power has an object-side surface 341 being convex in a paraxial region thereof and an image-side surface 342 being concave in a paraxial region thereof. The fourth lens element 340 is made of plastic material and has the object-side surface 341 and the image-side surface 342 being both aspheric. The image-side surface 342 of the fourth lens element 340 has one inflection point.

The fifth lens element 350 with positive refractive power has an object-side surface 351 being convex in a paraxial region thereof and an image-side surface 352 being concave in a paraxial region thereof. The fifth lens element 350 is made of plastic material and has the object-side surface 351 and the image-side surface 352 being both aspheric. The object-side surface 351 of the fifth lens element 350 has two inflection points. The image-side surface 352 of the fifth lens element 350 has two inflection points.

The sixth lens element 360 with positive refractive power has an object-side surface 361 being convex in a paraxial region thereof and an image-side surface 362 being planar in a paraxial region thereof. The sixth lens element 360 is made of plastic material and has the object-side surface 361 and the image-side surface 362 being both aspheric. The object-side surface 361 of the sixth lens element 360 has three inflection points. The image-side surface 362 of the sixth lens element 360 has three inflection points.

The seventh lens element 370 with negative refractive power has an object-side surface 371 being convex in a paraxial region thereof and an image-side surface 372 being concave in a paraxial region thereof. The seventh lens element 370 is made of plastic material and has the object-side surface 371 and the image-side surface 372 being both aspheric. The object-side surface 371 of the seventh lens element 370 has three inflection points. The image-side surface 372 of the seventh lens element 370 has two inflection points. The image-side surface 372 of the seventh lens element 370 has at least one critical point in an off-axis region thereof.

The eighth lens element 380 with negative refractive power has an object-side surface 381 being concave in a paraxial region thereof and an image-side surface 382 being convex in a paraxial region thereof. The eighth lens element 380 is made of plastic material and has the object-side surface 381 and the image-side surface 382 being both aspheric. The object-side surface 381 of the eighth lens element 380 has four inflection points. The image-side surface 382 of the eighth lens element 380 has four inflection points.

The filter 390 is made of glass material and located between the eighth lens element 380 and the image surface 395, and will not affect the focal length of the imaging lens system. The image sensor 399 is disposed on or near the image surface 395 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 380 is V8, and a refractive index of the eighth lens element 380 is N8.

The focal length of the imaging lens system is f, a curvature radius of an object-side surface of one lens element of the imaging lens system is Ro, a curvature radius of an image-side surface of the lens element is Ri, and one (the sixth lens element 360) of the eight lens elements (310, 320, 330, 340, 350, 360, 370 and 380) satisfies |f/Ro|+|f/Ri|<0.50. In detail, a curvature radius of the object-side surface 361 of the sixth lens element 360 is R11, a curvature radius of the image-side surface 362 of the sixth lens element 360 is R12, and |f/R11|+|f/R12|=0.26.

The detailed optical data of the 3rd embodiment are shown in Table 5 and the aspheric surface data are shown in Table 6 below.

TABLE 5

3rd Embodiment
f = 5.44 mm, Fno = 1.55, HFOV = 23.4 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 1.933 (ASP) | 1.000 | Plastic | 1.545 | 56.1 | 5.24 |
| 2 | | 4.882 (ASP) | 0.034 | | | | |
| 3 | Lens 2 | 4.368 (ASP) | 0.525 | Plastic | 1.545 | 56.1 | 6.85 |
| 4 | | −24.642 (ASP) | 0.037 | | | | |
| 5 | Ape. Stop | Plano | 0.046 | | | | |
| 6 | Lens 3 | 5.938 (ASP) | 0.160 | Plastic | 1.669 | 19.5 | −7.00 |
| 7 | | 2.589 (ASP) | 0.241 | | | | |
| 8 | Lens 4 | 5.106 (ASP) | 0.278 | Plastic | 1.639 | 23.5 | −10.42 |
| 9 | | 2.828 (ASP) | 0.477 | | | | |
| 10 | Lens 5 | 5.698 (ASP) | 0.168 | Plastic | 1.650 | 21.5 | 27.93 |
| 11 | | 8.205 (ASP) | 0.181 | | | | |
| 12 | Lens 6 | 21.021 (ASP) | 0.351 | Plastic | 1.672 | 18.8 | 31.29 |
| 13 | | ∞ (ASP) | 0.600 | | | | |
| 14 | Lens 7 | 1.557 (ASP) | 0.259 | Plastic | 1.544 | 55.9 | −19.57 |
| 15 | | 1.279 (ASP) | 0.453 | | | | |
| 16 | Lens 8 | −3.923 (ASP) | 0.327 | Plastic | 1.688 | 18.7 | −6.98 |
| 17 | | −22.218 (ASP) | 0.200 | | | | |
| 18 | Filter | Plano | 0.110 | Glass | 1.517 | 64.2 | — |
| 19 | | Plano | 0.096 | | | | |
| 20 | Image | Plano | — | | | | |

Note:
Reference wavelength is 587.6 nm (d-line).

TABLE 6

Aspheric Coefficients

| Surface # | | | | | | |
|---|---|---|---|---|---|---|
| | 1 | 2 | 3 | 4 | 6 | 7 |
| k= | -2.8473E-01 | -2.0699E-01 | 7.1295E-02 | 8.2073E+01 | -1.3421E+01 | -7.0746E+00 |
| A4= | 1.8820E-03 | -1.9981E-03 | -2.4268E-03 | 1.2180E-02 | -4.1338E-02 | 1.6480E-03 |
| A6= | 1.0394E-03 | 4.2295E-03 | 6.4874E-03 | -9.3393E-04 | 6.6041E-03 | 1.4507E-03 |
| A8= | -5.6986E-04 | -2.5212E-03 | -3.2498E-03 | -1.7021E-03 | 3.3731E-02 | 3.5160E-02 |
| A10= | 2.8654E-04 | 4.5154E-04 | 3.6115E-04 | 6.7222E-04 | -2.5193E-02 | -3.0206E-04 |
| A12= | -6.1949E-05 | — | — | -1.7790E-04 | 7.9099E-03 | -5.4998E-03 |
| A14= | — | — | — | 2.3254E-05 | -9.8203E-04 | 2.8390E-03 |

| Surface # | | | | | |
|---|---|---|---|---|---|
| | 8 | 9 | 10 | 11 | 12 | 13 |
| k= | -4.9629E+00 | 1.7708E+00 | -1.9480E+01 | -8.4012E+01 | -5.0000E+01 | 3.6991E+01 |
| A4= | -1.5027E-02 | -6.6964E-02 | -4.2935E-02 | -7.0940E-02 | -9.5163E-02 | -1.2368E-01 |
| A6= | -1.7762E-03 | 3.1895E-02 | -2.9514E-01 | 1.3155E-01 | 1.6925E-01 | 1.8191E-01 |
| A8= | 3.5862E-02 | -4.3379E-02 | 6.1495E-01 | -1.2811E-01 | -9.8991E-02 | -1.4316E-01 |
| A10= | -2.3655E-02 | 4.1881E-02 | -9.7046E-01 | 2.8721E-01 | 2.9907E-02 | 7.4071E-02 |
| A12= | 1.2553E-02 | -2.7510E-02 | 9.4500E-01 | -2.6435E-01 | -4.1308E-03 | -2.1950E-02 |
| A14= | -3.0673E-03 | 4.9500E-03 | -5.0473E-01 | 1.1535E-01 | 9.8804E-05 | 3.3473E-03 |
| A16= | — | -2.4421E-04 | 1.0934E-01 | -1.9269E-02 | — | -2.1886E-04 |

| Surface # | | | |
|---|---|---|---|
| | 14 | 15 | 16 | 17 |
| k= | -6.2900E+00 | -1.8764E+00 | -3.7911E+01 | 9.0000E+01 |
| A4= | -1.5798E-01 | -2.6035E-01 | -3.7070E-01 | -4.8686E-01 |
| A6= | -5.8481E-02 | 1.2129E-01 | 6.2273E-01 | 6.4468E-01 |
| A8= | 8.0356E-02 | -2.6659E-02 | -4.9667E-01 | -4.3100E-01 |
| A10= | -2.1259E-02 | -3.5085E-03 | 2.2892E-01 | 1.6724E-01 |
| A12= | -4.2909E-03 | 3.5173E-03 | -6.4120E-02 | -3.8509E-02 |
| A14= | 2.9734E-03 | -8.9257E-04 | 1.0694E-02 | 5.0442E-03 |
| A16= | -3.8440E-04 | 9.6523E-05 | -9.6727E-04 | -3.2801E-04 |
| A18= | — | -2.4892E-06 | 3.6172E-05 | 7.0598E-06 |

In the 3rd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 3rd embodiment, so an explanation in this regard will not be provided again.

Moreover, these parameters can be calculated from Table 5 and Table 6 as the following values and satisfy the following conditions:

| 3rd Embodiment | | | |
|---|---|---|---|
| f [mm] | 5.44 | EPD/BL | 8.65 |
| Fno | 1.55 | f/EPD | 1.55 |
| HFOV [deg.] | 23.4 | (Y11 − ImgH)/EPD | −0.15 |
| V8 | 18.7 | f × tan(HFOV)/EPD | 0.67 |
| Vmin | 18.7 | (|Y11 − Y82| + BL)/f | 0.13 |
| ΣVi | 270.0 | (Y82 − Y51)/(Y11 − Y51) | 1.49 |
| Nmax | 1.688 | (|Y11 − Y82| + |Y82 − ImgH|)/f | 0.09 |
| (Vi/Ni)min | 11.08 | f/ImgH | 2.27 |
| ΣCT/ΣAT | 1.48 | Yc72/f | 0.21 |
| R1/CT1 | 1.93 | |f/R1| + |f/R2| | 3.93 |
| BL/CT1 | 0.41 | |f/R3| + |f/R4| | 1.47 |
| R8/f | 0.52 | |f/R5| + |f/R6| | 3.01 |
| (R11 + R12)/ | −1.00 | |f/R7| + |f/R8| | 2.99 |
| (R11 − R12) | | |f/R9| + |f/R10| | 1.62 |
| (R13 − R14)/ | 0.10 | |f/R11| + |f/R12| | 0.26 |
| (R13 + R14) | | |f/R13| + |f/R14| | 7.74 |
| f/f1 | 1.04 | |f/R15| + |f/R16| | 1.63 |
| f/f5 | 0.19 | V1/N1 | 36.30 |
| f5/f7 | −1.43 | V2/N2 | 36.30 |
| f8/f5 | −0.25 | V3/N3 | 11.66 |

-continued

| 3rd Embodiment | | | |
|---|---|---|---|
| f/f5 + f/f6 | 0.37 | V4/N4 | 14.34 |
| ImgH [mm] | 2.39 | V5/N5 | 13.01 |
| TL [mm] | 5.54 | V6/N6 | 11.24 |
| TL/f | 1.02 | V7/N7 | 36.23 |
| TL/EPD | 1.58 | V8/N8 | 11.08 |
| SL/TL | 0.71 | — | — |
| BL/TD | 0.08 | | |
| EPD/ImgH | 1.47 | | |

4th Embodiment

Figure 7:
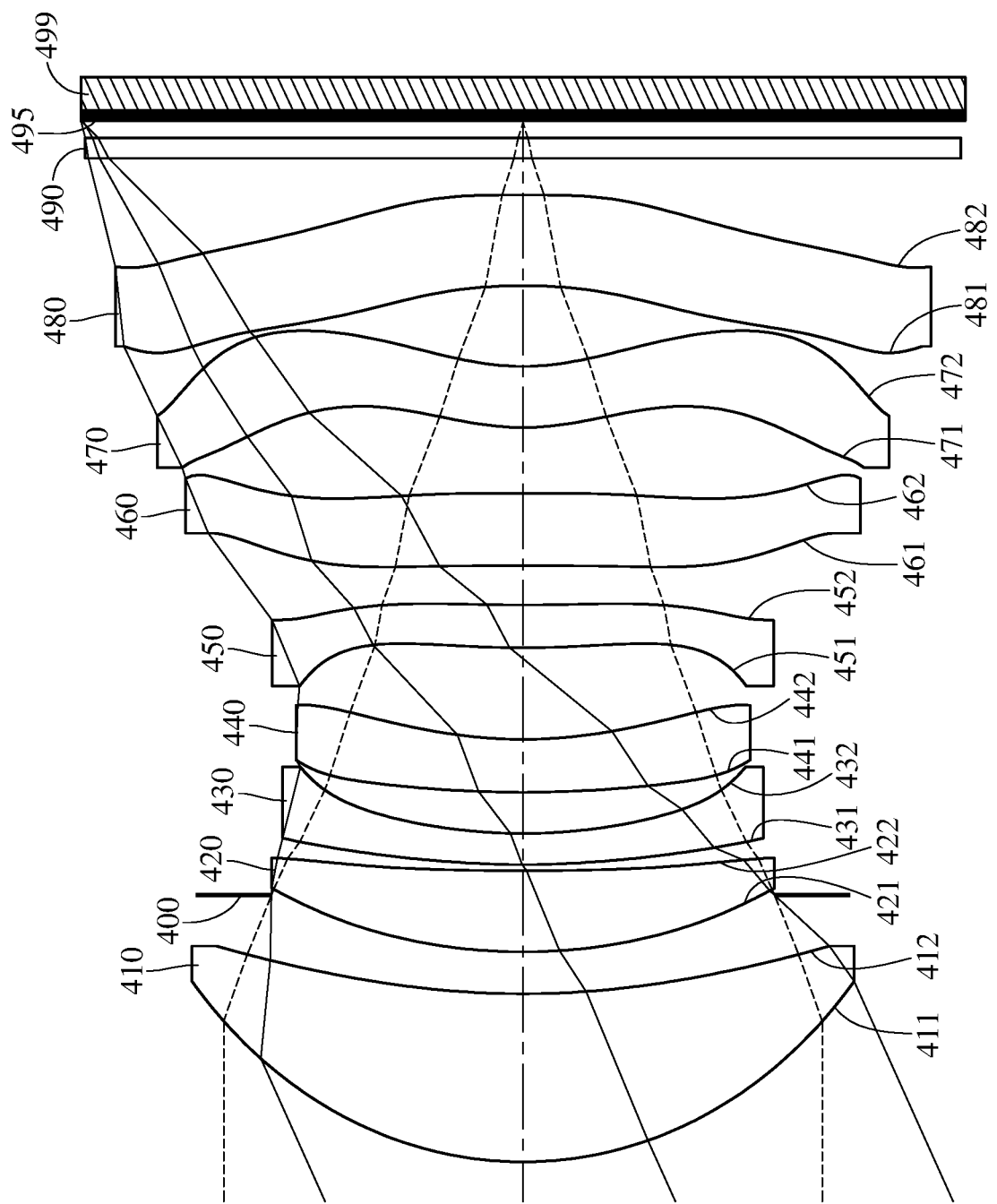
FIG. 7 is a schematic view of an image capturing unit according to the 4th embodiment of the present disclosure.
Figure 8:
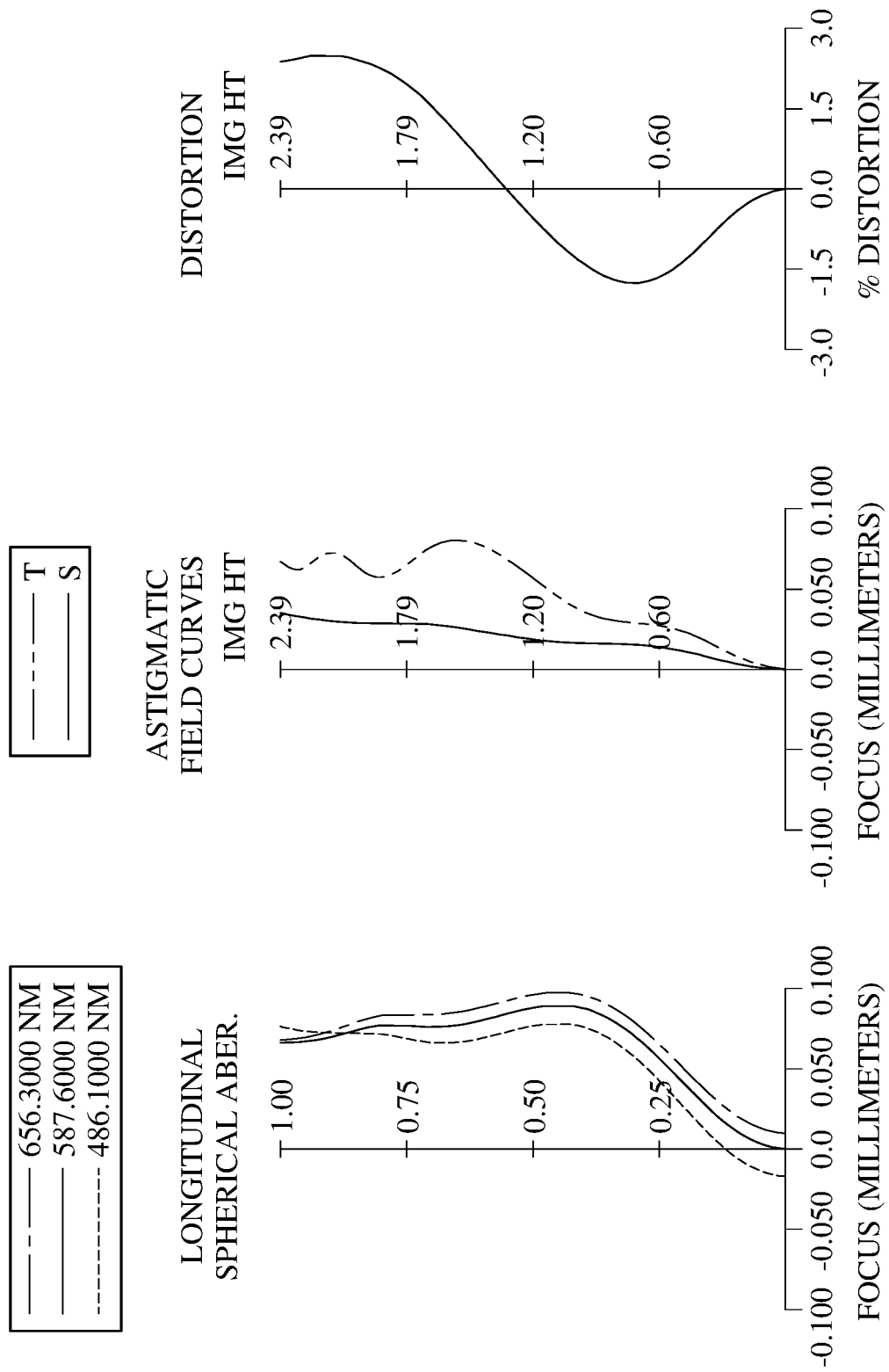
FIG. 8 shows spherical aberration curves, astigmatic field curves and a distortion curve of the image capturing unit according to the 4th embodiment.

FIG. 7 is a schematic view of an image capturing unit according to the 4th embodiment of the present disclosure. FIG. 8 shows, in order from left to right, spherical aberration curves, astigmatic field curves and a distortion curve of the image capturing unit according to the 4th embodiment. In FIG. 7, the image capturing unit includes the imaging lens system (its reference numeral is omitted) of the present disclosure and an image sensor 499. The imaging lens system includes, in order from an object side to an image side, a first lens element 410, an aperture stop 400, a second lens element 420, a third lens element 430, a fourth lens element 440, a fifth lens element 450, a sixth lens element 460, a seventh lens element 470, an eighth lens element 480, a filter 490 and an image surface 495. The imaging lens system includes eight lens elements (410, 420, 430, 440, 450, 460, 470 and 480) with no additional lens element disposed between each of the adjacent eight lens elements.

The first lens element 410 with positive refractive power has an object-side surface 411 being convex in a paraxial region thereof and an image-side surface 412 being concave in a paraxial region thereof. The first lens element 410 is made of plastic material and has the object-side surface 411 and the image-side surface 412 being both aspheric. The image-side surface 412 of the first lens element 410 has one inflection point.

The second lens element 420 with positive refractive power has an object-side surface 421 being convex in a paraxial region thereof and an image-side surface 422 being concave in a paraxial region thereof. The second lens element 420 is made of plastic material and has the object-side surface 421 and the image-side surface 422 being both aspheric. The object-side surface 421 of the second lens element 420 has one inflection point. The image-side surface 422 of the second lens element 420 has one inflection point.

The third lens element 430 with negative refractive power has an object-side surface 431 being convex in a paraxial region thereof and an image-side surface 432 being concave in a paraxial region thereof. The third lens element 430 is made of plastic material and has the object-side surface 431 and the image-side surface 432 being both aspheric.

The fourth lens element 440 with negative refractive power has an object-side surface 441 being convex in a paraxial region thereof and an image-side surface 442 being concave in a paraxial region thereof. The fourth lens element 440 is made of plastic material and has the object-side surface 441 and the image-side surface 442 being both aspheric. The image-side surface 442 of the fourth lens element 440 has one inflection point.

The fifth lens element 450 with positive refractive power has an object-side surface 451 being convex in a paraxial region thereof and an image-side surface 452 being concave in a paraxial region thereof. The fifth lens element 450 is made of plastic material and has the object-side surface 451 and the image-side surface 452 being both aspheric. The object-side surface 451 of the fifth lens element 450 has one inflection point. The image-side surface 452 of the fifth lens element 450 has three inflection points.

The sixth lens element 460 with negative refractive power has an object-side surface 461 being convex in a paraxial region thereof and an image-side surface 462 being concave in a paraxial region thereof. The sixth lens element 460 is made of plastic material and has the object-side surface 461 and the image-side surface 462 being both aspheric. The object-side surface 461 of the sixth lens element 460 has three inflection points. The image-side surface 462 of the sixth lens element 460 has three inflection points.

The seventh lens element 470 with positive refractive power has an object-side surface 471 being convex in a paraxial region thereof and an image-side surface 472 being concave in a paraxial region thereof. The seventh lens element 470 is made of plastic material and has the object-side surface 471 and the image-side surface 472 being both aspheric. The object-side surface 471 of the seventh lens element 470 has three inflection points. The image-side surface 472 of the seventh lens element 470 has two inflection points. The image-side surface 472 of the seventh lens element 470 has at least one critical point in an off-axis region thereof.

The eighth lens element 480 with negative refractive power has an object-side surface 481 being concave in a paraxial region thereof and an image-side surface 482 being convex in a paraxial region thereof. The eighth lens element 480 is made of plastic material and has the object-side surface 481 and the image-side surface 482 being both aspheric. The object-side surface 481 of the eighth lens element 480 has four inflection points. The image-side surface 482 of the eighth lens element 480 has four inflection points.

The filter 490 is made of glass material and located between the eighth lens element 480 and the image surface 495, and will not affect the focal length of the imaging lens system. The image sensor 499 is disposed on or near the image surface 495 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 480 is V8, and a refractive index of the eighth lens element 480 is N8.

The focal length of the imaging lens system is f, a curvature radius of an object-side surface of one lens element of the imaging lens system is Ro, a curvature radius of an image-side surface of the lens element is Ri, and one (the sixth lens element 460) of the eight lens elements (410, 420, 430, 440, 450, 460, 470 and 480) satisfies |f/Ro|+|f/Ri|<0.50. In detail, a curvature radius of the object-side surface 461 of the sixth lens element 460 is R11, a curvature radius of the image-side surface 462 of the sixth lens element 460 is R12, and |f/R11|+|f/R12|=0.09.

The detailed optical data of the 4th embodiment are shown in Table 7 and the aspheric surface data are shown in Table 8 below.

TABLE 7

4th Embodiment
f = 5.11 mm, Fno = 1.57, HFOV = 24.2 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 2.020 (ASP) | 0.914 | Plastic | 1.545 | 56.1 | 5.80 |
| 2 | | 4.710 (ASP) | 0.537 | | | | |
| 3 | Ape. Stop | Plano | −0.309 | | | | |
| 4 | Lens 2 | 3.010 (ASP) | 0.441 | Plastic | 1.545 | 56.1 | 7.01 |
| 5 | | 13.493 (ASP) | 0.033 | | | | |
| 6 | Lens 3 | 4.232 (ASP) | 0.170 | Plastic | 1.669 | 19.5 | −12.86 |
| 7 | | 2.790 (ASP) | 0.224 | | | | |
| 8 | Lens 4 | 5.971 (ASP) | 0.288 | Plastic | 1.639 | 23.5 | −7.33 |
| 9 | | 2.575 (ASP) | 0.498 | | | | |
| 10 | Lens 5 | 5.170 (ASP) | 0.233 | Plastic | 1.634 | 23.8 | 16.48 |
| 11 | | 10.052 (ASP) | 0.213 | | | | |
| 12 | Lens 6 | 248.862 (ASP) | 0.394 | Plastic | 1.672 | 18.8 | −147.01 |
| 13 | | 70.673 (ASP) | 0.358 | | | | |
| 14 | Lens 7 | 1.376 (ASP) | 0.332 | Plastic | 1.544 | 55.9 | 55.58 |

TABLE 7-continued

4th Embodiment
f = 5.11 mm, Fno = 1.57, HFOV = 24.2 deg.

| Surface # | | Curvature Radius | Thickness | Material | Index | Abbe # | Focal Length |
|---|---|---|---|---|---|---|---|
| 15 | | 1.319 (ASP) | 0.439 | | | | |
| 16 | Lens 8 | −3.198 (ASP) | 0.493 | Plastic | 1.688 | 18.7 | −5.05 |
| 17 | | −42.623 (ASP) | 0.200 | | | | |
| 18 | Filter | Plano | 0.110 | Glass | 1.517 | 64.2 | — |
| 19 | | Plano | 0.093 | | | | |
| 20 | Image | Plano | — | | | | |

Note:
Reference wavelength is 587.6 nm (d-line).

TABLE 8

Aspheric Coefficients

| Surface # | | | | | |
|---|---|---|---|---|---|
| 1 | 2 | 4 | 5 | 6 | 7 |

| | | | | | | |
|---|---|---|---|---|---|---|
| k= | −3.4968E−01 | −2.0956E+00 | 5.0721E−01 | −8.8110E+01 | −1.3202E+01 | −7.1241E+00 |
| A4= | 1.1721E−03 | −1.2972E−03 | 5.4549E−03 | −3.5948E−02 | −1.2265E−01 | −4.7252E−02 |
| A6= | 7.3647E−04 | −4.1381E−03 | −1.1228E−02 | 1.2482E−01 | 3.1370E−01 | 2.1096E−01 |
| A8= | 1.0042E−03 | 2.1185E−03 | 1.1629E−02 | −1.3875E−01 | −3.9570E−01 | −2.6860E−01 |
| A10= | −1.1053E−03 | −3.2130E−04 | −3.4987E−03 | 7.6075E−02 | 2.6774E−01 | 1.8015E−01 |
| A12= | 4.0452E−04 | — | — | −2.1630E−02 | −9.2147E−02 | −3.7392E−02 |
| A14= | −4.9171E−05 | — | — | 2.5688E−03 | 1.2722E−02 | −1.4644E−03 |

| Surface # | | | | | |
|---|---|---|---|---|---|
| 8 | 9 | 10 | 11 | 12 | 13 |

| | | | | | | |
|---|---|---|---|---|---|---|
| k= | −8.2316E+00 | 1.5801E+00 | 1.5540E+00 | −6.5852E+01 | −9.0000E+01 | −8.1932E+01 |
| A4= | −4.0957E−02 | −4.9406E−02 | −6.4130E−02 | −8.4105E−02 | −9.7195E−02 | −1.8836E−01 |
| A6= | 1.2456E−01 | 8.3163E−03 | −2.2198E−01 | −5.2042E−02 | 1.7255E−01 | 3.0782E−01 |
| A8= | −2.2457E−01 | −2.0170E−02 | 5.8295E−01 | 1.7177E−01 | −9.5845E−02 | −2.5004E−01 |
| A10= | 2.3105E−01 | −1.2852E−02 | −9.5006E−01 | −1.9332E−01 | 2.6121E−02 | 1.2825E−01 |
| A12= | −1.1076E−01 | 4.5849E−02 | 8.3052E−01 | 1.0183E−01 | −3.1740E−03 | −4.0188E−02 |
| A14= | 2.1589E−02 | −3.9534E−02 | −3.7594E−01 | −1.9452E−02 | 5.2188E−05 | 6.9832E−03 |
| A16= | — | 1.0442E−02 | 6.8047E−02 | −2.4035E−05 | | −5.2202E−04 |

| Surface # | | | |
|---|---|---|---|
| 14 | 15 | 16 | 17 |

| | | | | |
|---|---|---|---|---|
| k= | −5.2821E+00 | −1.7111E+00 | −4.5299E+01 | 7.0253E+01 |
| A4= | −2.3302E−01 | −3.1245E−01 | −3.7587E−01 | −4.8200E−01 |
| A6= | 1.6306E−01 | 2.8410E−01 | 6.8210E−01 | 7.0440E−01 |
| A8= | −1.4779E−01 | −2.2614E−01 | −6.3365E−01 | −5.7091E−01 |
| A10= | 1.0030E−01 | 1.2843E−01 | 3.6597E−01 | 2.9805E−01 |
| A12= | −3.9799E−02 | −4.8245E−02 | −1.3717E−01 | −1.0387E−01 |
| A14= | 8.3399E−03 | 1.1107E−02 | 3.3029E−02 | 2.4110E−02 |
| A16= | −7.1097E−04 | −1.4261E−03 | −4.8998E−03 | −3.5971E−03 |
| A18= | — | 7.9558E−05 | 4.0727E−04 | 3.1337E−04 |
| A20= | — | — | −1.4552E−05 | −1.2129E−05 |

In the 4th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 4th embodiment, so an explanation in this regard will not be provided again.

Moreover, these parameters can be calculated from Table 7 and Table 8 as the following values and satisfy the following conditions:

| 4th Embodiment | | | |
|---|---|---|---|
| f [mm] | 5.11 | EPD/BL | 8.06 |
| Fno | 1.57 | f/EPD | 1.57 |
| HFOV [deg.] | 24.2 | (Y11 − ImgH)/EPD | −0.18 |
| V8 | 18.7 | f × tan(HFOV)/EPD | 0.70 |
| Vmin | 18.7 | (|Y11 − Y82| + BL)/f | 0.16 |
| ΣVi | 272.4 | (Y82 − Y51)/(Y11 − Y51) | 1.71 |
| Nmax | 1.688 | (|Y11 − Y82| + |Y82 − ImgH|)/f | 0.12 |
| (Vi/Ni)min | 11.08 | f/ImgH | 2.14 |
| ΣCT/ΣAT | 1.64 | Yc72/f | 0.23 |
| R1/CT1 | 2.21 | |f/R1| + |f/R2| | 3.61 |
| BL/CT1 | 0.44 | |f/R3| + |f/R4| | 2.07 |
| R8/f | 0.50 | |f/R5| + |f/R6| | 3.04 |
| (R11 + R12)/(R11 − R12) | 1.79 | |f/R7| + |f/R8| | 2.84 |
| | | |f/R9| + |f/R10| | 1.50 |
| (R13 − R14)/(R13 + R14) | 0.02 | |f/R11| + |f/R12| | 0.09 |
| | | |f/R13| + |f/R14| | 7.58 |
| f/f1 | 0.88 | |f/R15| + |f/R16| | 1.72 |
| f/f5 | 0.31 | V1/N1 | 36.30 |
| f5/f7 | 0.30 | V2/N2 | 36.30 |
| f8/f5 | −0.31 | V3/N3 | 11.66 |
| f/f5 + f/f6 | 0.28 | V4/N4 | 14.34 |
| ImgH [mm] | 2.39 | V5/N5 | 14.59 |
| TL [mm] | 5.66 | V6/N6 | 11.24 |
| TL/f | 1.11 | V7/N7 | 36.23 |
| TL/EPD | 1.74 | V8/N8 | 11.08 |
| SL/TL | 0.74 | — | — |
| BL/TD | 0.08 | | |
| EPD/ImgH | 1.36 | | |

5th Embodiment

Figure 9:
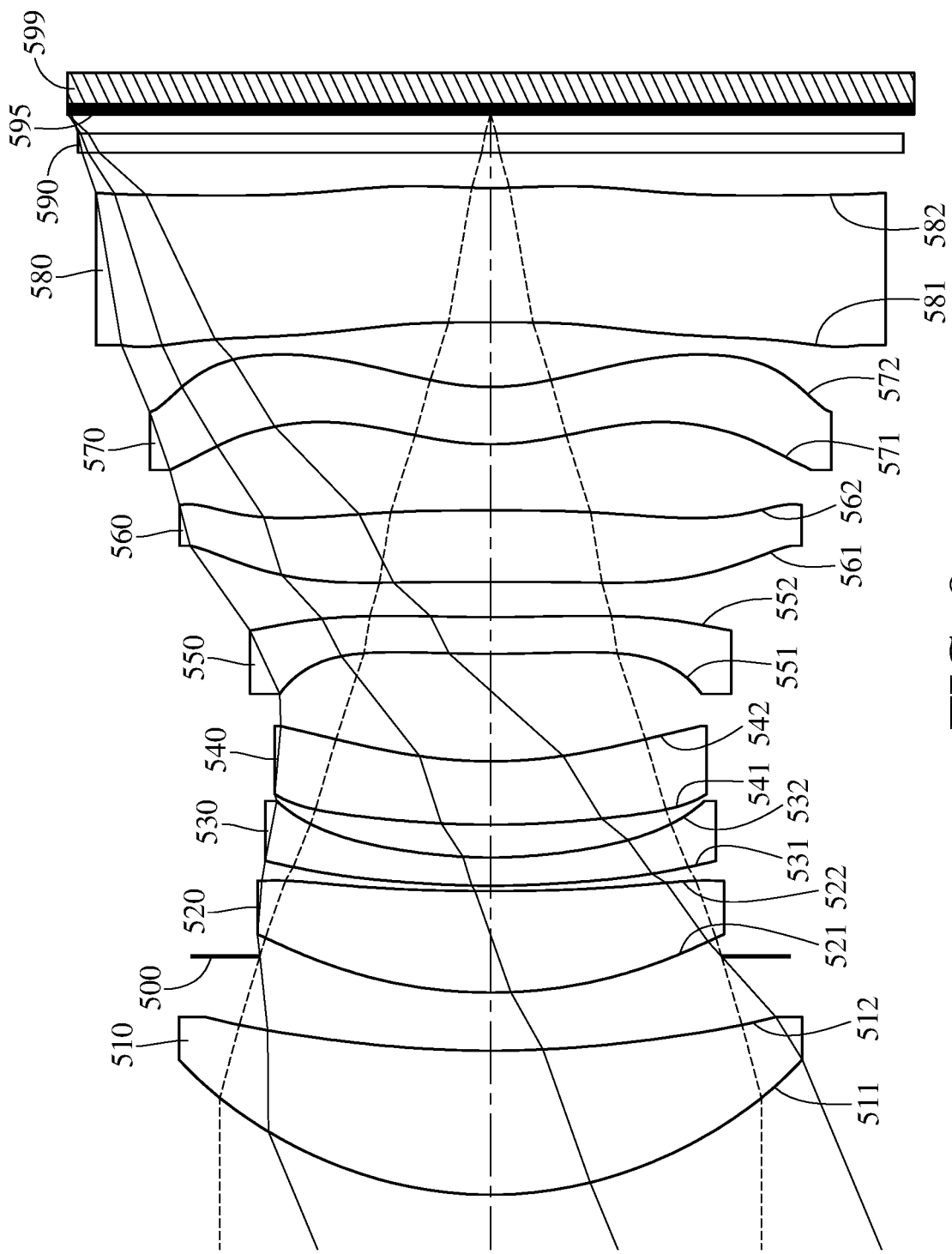
FIG. 9 is a schematic view of an image capturing unit according to the 5th embodiment of the present disclosure.
Figure 10:
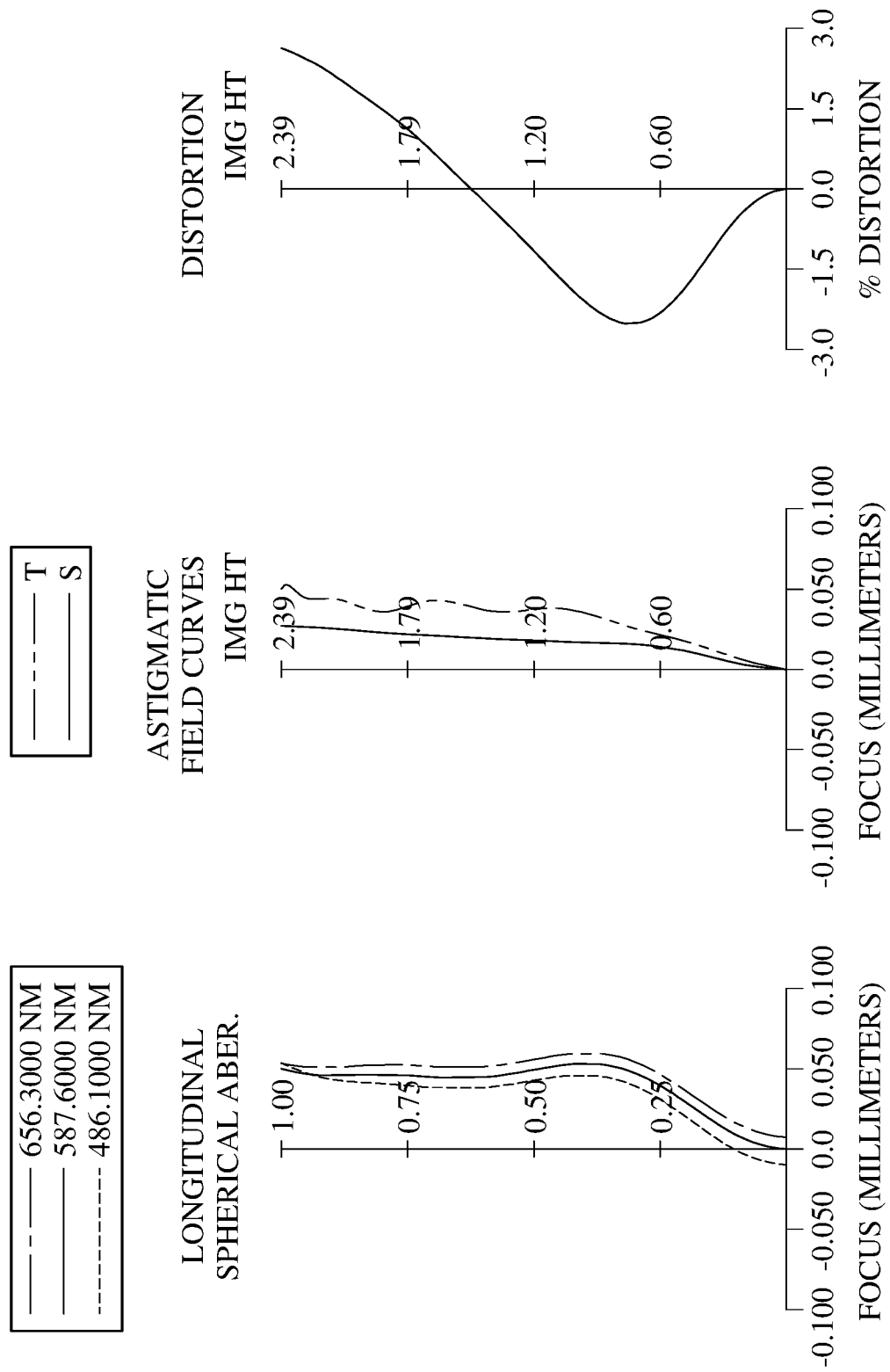
FIG. 10 shows spherical aberration curves, astigmatic field curves and a distortion curve of the image capturing unit according to the 5th embodiment.

FIG. 9 is a schematic view of an image capturing unit according to the 5th embodiment of the present disclosure. FIG. 10 shows, in order from left to right, spherical aberration curves, astigmatic field curves and a distortion curve of the image capturing unit according to the 5th embodiment. In FIG. 9, the image capturing unit includes the imaging lens system (its reference numeral is omitted) of the present disclosure and an image sensor 599. The imaging lens system includes, in order from an object side to an image side, a first lens element 510, an aperture stop 500, a second lens element 520, a third lens element 530, a fourth lens element 540, a fifth lens element 550, a sixth lens element 560, a seventh lens element 570, an eighth lens element 580, a filter 590 and an image surface 595. The imaging lens system includes eight lens elements (510, 520, 530, 540, 550, 560, 570 and 580) with no additional lens element disposed between each of the adjacent eight lens elements.

The first lens element 510 with positive refractive power has an object-side surface 511 being convex in a paraxial region thereof and an image-side surface 512 being concave in a paraxial region thereof. The first lens element 510 is made of plastic material and has the object-side surface 511 and the image-side surface 512 being both aspheric.

The second lens element 520 with positive refractive power has an object-side surface 521 being convex in a paraxial region thereof and an image-side surface 522 being concave in a paraxial region thereof. The second lens element 520 is made of plastic material and has the object-side surface 521 and the image-side surface 522 being both aspheric. The object-side surface 521 of the second lens element 520 has one inflection point. The image-side surface 522 of the second lens element 520 has one inflection point.

The third lens element 530 with negative refractive power has an object-side surface 531 being convex in a paraxial region thereof and an image-side surface 532 being concave in a paraxial region thereof. The third lens element 530 is made of plastic material and has the object-side surface 531 and the image-side surface 532 being both aspheric. The object-side surface 531 of the third lens element 530 has one inflection point.

The fourth lens element 540 with negative refractive power has an object-side surface 541 being convex in a paraxial region thereof and an image-side surface 542 being concave in a paraxial region thereof. The fourth lens element 540 is made of plastic material and has the object-side surface 541 and the image-side surface 542 being both aspheric. The image-side surface 542 of the fourth lens element 540 has two inflection points.

The fifth lens element 550 with positive refractive power has an object-side surface 551 being convex in a paraxial region thereof and an image-side surface 552 being concave in a paraxial region thereof. The fifth lens element 550 is made of plastic material and has the object-side surface 551 and the image-side surface 552 being both aspheric. The object-side surface 551 of the fifth lens element 550 has one inflection point. The image-side surface 552 of the fifth lens element 550 has three inflection points.

The sixth lens element 560 with positive refractive power has an object-side surface 561 being convex in a paraxial region thereof and an image-side surface 562 being convex in a paraxial region thereof. The sixth lens element 560 is made of plastic material and has the object-side surface 561 and the image-side surface 562 being both aspheric. The object-side surface 561 of the sixth lens element 560 has three inflection points. The image-side surface 562 of the sixth lens element 560 has two inflection points.

The seventh lens element 570 with negative refractive power has an object-side surface 571 being convex in a paraxial region thereof and an image-side surface 572 being concave in a paraxial region thereof. The seventh lens element 570 is made of plastic material and has the object-side surface 571 and the image-side surface 572 being both aspheric. The object-side surface 571 of the seventh lens element 570 has three inflection points. The image-side surface 572 of the seventh lens element 570 has two inflection points. The image-side surface 572 of the seventh lens element 570 has at least one critical point in an off-axis region thereof.

The eighth lens element 580 with negative refractive power has an object-side surface 581 being convex in a paraxial region thereof and an image-side surface 582 being concave in a paraxial region thereof. The eighth lens element 580 is made of plastic material and has the object-side surface 581 and the image-side surface 582 being both aspheric. The object-side surface 581 of the eighth lens element 580 has four inflection points. The image-side surface 582 of the eighth lens element 580 has three inflection points.

The filter 590 is made of glass material and located between the eighth lens element 580 and the image surface 595, and will not affect the focal length of the imaging lens system. The image sensor 599 is disposed on or near the image surface 595 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 580 is V8, and a refractive index of the eighth lens element 580 is N8.

The focal length of the imaging lens system is f, a curvature radius of an object-side surface of one lens element of the imaging lens system is Ro, a curvature radius of an image-side surface of the lens element is Ri, and one (the sixth lens element 560) of the eight lens elements (510, 520, 530, 540, 550, 560, 570 and 580) satisfies |f/Ro|+|f/Ri|<0.50. In detail, a curvature radius of the object-side surface 561 of the sixth lens element 560 is R11, a curvature radius of the image-side surface 562 of the sixth lens element 560 is R12, and |f/R11|+|f/R12|=0.19.

The detailed optical data of the 5th embodiment are shown in Table 9 and the aspheric surface data are shown in Table 10 below.

TABLE 9

5th Embodiment
f = 5.52 mm, Fno = 1.80, HFOV = 22.6 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 2.325 (ASP) | 0.816 | Plastic | 1.545 | 56.1 | 6.30 |
| 2 | | 6.320 (ASP) | 0.535 | | | | |
| 3 | Ape. Stop | Plano | −0.205 | | | | |
| 4 | Lens 2 | 2.873 (ASP) | 0.575 | Plastic | 1.545 | 56.1 | 6.54 |
| 5 | | 13.813 (ASP) | 0.030 | | | | |
| 6 | Lens 3 | 4.660 (ASP) | 0.160 | Plastic | 1.669 | 19.5 | −10.22 |
| 7 | | 2.733 (ASP) | 0.186 | | | | |
| 8 | Lens 4 | 5.323 (ASP) | 0.359 | Plastic | 1.639 | 23.5 | −8.99 |
| 9 | | 2.689 (ASP) | 0.609 | | | | |
| 10 | Lens 5 | 7.094 (ASP) | 0.208 | Plastic | 1.639 | 23.5 | 105.91 |
| 11 | | 7.835 (ASP) | 0.199 | | | | |
| 12 | Lens 6 | 58.599 (ASP) | 0.406 | Plastic | 1.672 | 18.8 | 43.69 |
| 13 | | −58.673 (ASP) | 0.375 | | | | |
| 14 | Lens 7 | 1.514 (ASP) | 0.325 | Plastic | 1.544 | 55.9 | −42.55 |
| 15 | | 1.314 (ASP) | 0.366 | | | | |
| 16 | Lens 8 | 142.857 (ASP) | 0.761 | Plastic | 1.688 | 18.7 | −5.24 |
| 17 | | 3.511 (ASP) | 0.200 | | | | |
| 18 | Filter | Plano | 0.110 | Glass | 1.517 | 64.2 | — |
| 19 | | Plano | 0.107 | | | | |
| 20 | Image | Plano | — | | | | |

Note:
Reference wavelength is 587.6 nm (d-line).

TABLE 10

Aspheric Coefficients

| | Surface # | | | | | |
|---|---|---|---|---|---|---|
| | 1 | 2 | 4 | 5 | 6 | 7 |
| k= | −3.9245E−01 | −1.9478E+00 | 4.3070E−01 | −7.5158E+01 | −1.0444E+01 | −8.5708E+00 |
| A4= | 1.1932E−04 | 3.9517E−03 | 2.4226E−02 | 3.0236E−02 | −1.2099E−01 | −8.2592E−02 |
| A6= | 8.0959E−04 | −1.3133E−02 | −2.2118E−02 | −3.8967E−02 | 2.3049E−01 | 2.4203E−01 |
| A8= | −8.6902E−04 | 7.1284E−03 | −1.0389E−03 | 6.4043E−02 | −1.8703E−01 | −2.1529E−01 |
| A10= | 1.9060E−04 | −1.2500E−03 | 9.3825E−03 | −6.6288E−02 | 8.6067E−02 | 9.0817E−02 |
| A12= | 6.8738E−05 | 4.7403E−05 | −3.5364E−03 | 3.0402E−02 | −3.4271E−02 | 7.0803E−04 |
| A14= | −1.3004E−05 | — | — | −5.3697E−03 | 1.4229E−02 | −6.9636E−03 |
| A16= | — | — | — | — | −3.0092E−03 | — |

| | Surface # | | | | | |
|---|---|---|---|---|---|---|
| | 8 | 9 | 10 | 11 | 12 | 13 |
| k= | −9.5921E+00 | 2.0205E+00 | 7.5969E−01 | −9.0000E+01 | 5.0000E+01 | 9.0000E+01 |
| A4= | −1.3190E−02 | −3.6618E−02 | −1.7908E−01 | −1.9711E−01 | −1.0436E−01 | −1.0630E−01 |
| A6= | 2.8986E−02 | −2.7624E−02 | 3.0368E−01 | 4.3135E−01 | 2.0625E−01 | 1.1738E−01 |
| A8= | −8.0123E−02 | 5.8477E−03 | −6.4496E−01 | −6.7619E−01 | −1.4579E−01 | −5.0056E−02 |
| A10= | 1.0982E−01 | −1.5558E−02 | 7.1197E−01 | 6.5792E−01 | 5.7647E−02 | 5.5756E−03 |
| A12= | −5.6748E−02 | 5.5312E−02 | −4.5868E−01 | −3.8918E−01 | −1.2967E−02 | 4.4246E−03 |
| A14= | 1.1499E−02 | −5.3705E−02 | 1.5422E−01 | 1.2723E−01 | 1.5208E−03 | −1.7704E−03 |
| A16= | — | 1.6290E−02 | −2.1553E−02 | −1.7366E−02 | −7.8767E−05 | 1.8200E−04 |

TABLE 10-continued

| Aspheric Coefficients | | | | |
|---|---|---|---|---|
| Surface # | | | | |
| | 14 | 15 | 16 | 17 |
| k= | −4.2671E+00 | −1.6654E+00 | 1.8959E+01 | −5.4326E+01 |
| A4= | −1.8360E−01 | −3.6624E−01 | −3.4287E−01 | −4.2527E−01 |
| A6= | 9.1247E−02 | 4.0388E−01 | 6.3805E−01 | 6.3437E−01 |
| A8= | −9.0141E−02 | −3.8209E−01 | −6.3537E−01 | −5.1373E−01 |
| A10= | 7.8925E−02 | 2.4788E−01 | 3.9994E−01 | 2.6524E−01 |
| A12= | −3.6860E−02 | −1.0099E−01 | −1.6456E−01 | −9.0825E−02 |
| A14= | 8.3300E−03 | 2.4104E−02 | 4.3847E−02 | 2.0541E−02 |
| A16= | −7.2271E−04 | −2.9506E−03 | −7.2748E−03 | −2.9480E−03 |
| A18= | — | 1.0127E−04 | 6.8359E−04 | 2.4309E−04 |
| A20= | — | 7.9184E−06 | −2.7833E−05 | −8.7658E−06 |

In the 5th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 5th embodiment, so an explanation in this regard will not be provided again.

Moreover, these parameters can be calculated from Table 9 and Table 10 as the following values and satisfy the following conditions:

| 5th Embodiment | | | |
|---|---|---|---|
| f [mm] | 5.52 | EPD/BL | 7.35 |
| Fno | 1.80 | f/EPD | 1.80 |
| HFOV [deg.] | 22.6 | (Y11 − ImgH)/EPD | −0.20 |
| V8 | 18.7 | f × tan(HFOV)/EPD | 0.75 |
| Vmin | 18.7 | (|Y11 − Y82| + BL)/f | 0.16 |
| ΣVi | 272.0 | (Y82 − Y51)/(Y11 − Y51) | 1.82 |
| Nmax | 1.688 | (|Y11 − Y82| + |Y82 − ImgH|)/f | 0.11 |
| (Vi/Ni)min | 11.08 | f/ImgH | 2.31 |
| ΣCT/ΣAT | 1.72 | Yc72/f | 0.22 |
| R1/CT1 | 2.85 | |f/R1| + |f/R2| | 3.25 |
| BL/CT1 | 0.51 | |f/R3| + |f/R4| | 2.32 |
| R8/f | 0.49 | |f/R5| + |f/R6| | 3.20 |
| (R11 + R12)/ | −0.00063 | |f/R7| + |f/R8| | 3.09 |
| (R11 − R12) | | |f/R9| + |f/R10| | 1.48 |
| (R13 − R14)/ | 0.07 | |f/R11| + |f/R12| | 0.19 |
| (R13 + R14) | | |f/R13| + |f/R14| | 7.85 |
| f/f1 | 0.88 | |f/R15| + |f/R16| | 1.61 |
| f/f5 | 0.05 | V1/N1 | 36.30 |
| f5/f7 | −2.49 | V2/N2 | 36.30 |
| f8/f5 | −0.05 | V3/N3 | 11.66 |
| f/f5 + f/f6 | 0.18 | V4/N4 | 14.34 |
| ImgH [mm] | 2.39 | V5/N5 | 14.34 |
| TL [mm] | 6.12 | V6/N6 | 11.24 |
| TL/f | 1.11 | V7/N7 | 36.23 |
| TL/EPD | 2.00 | V8/N8 | 11.08 |
| SL/TL | 0.78 | — | — |
| BL/TD | 0.07 | | |
| EPD/ImgH | 1.28 | | |

6th Embodiment

Figure 11:
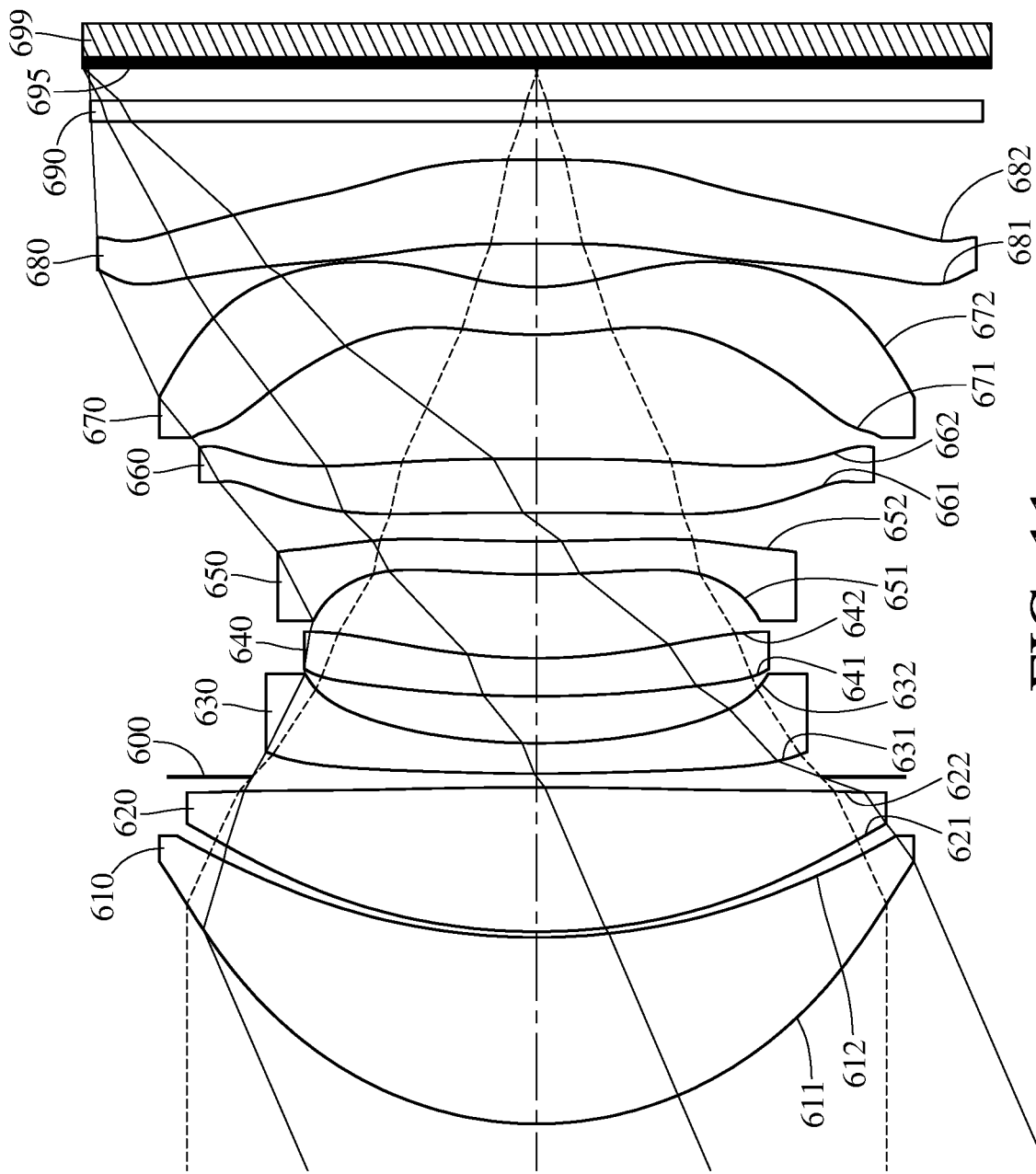
FIG. 11 is a schematic view of an image capturing unit according to the 6th embodiment of the present disclosure.
Figure 12:
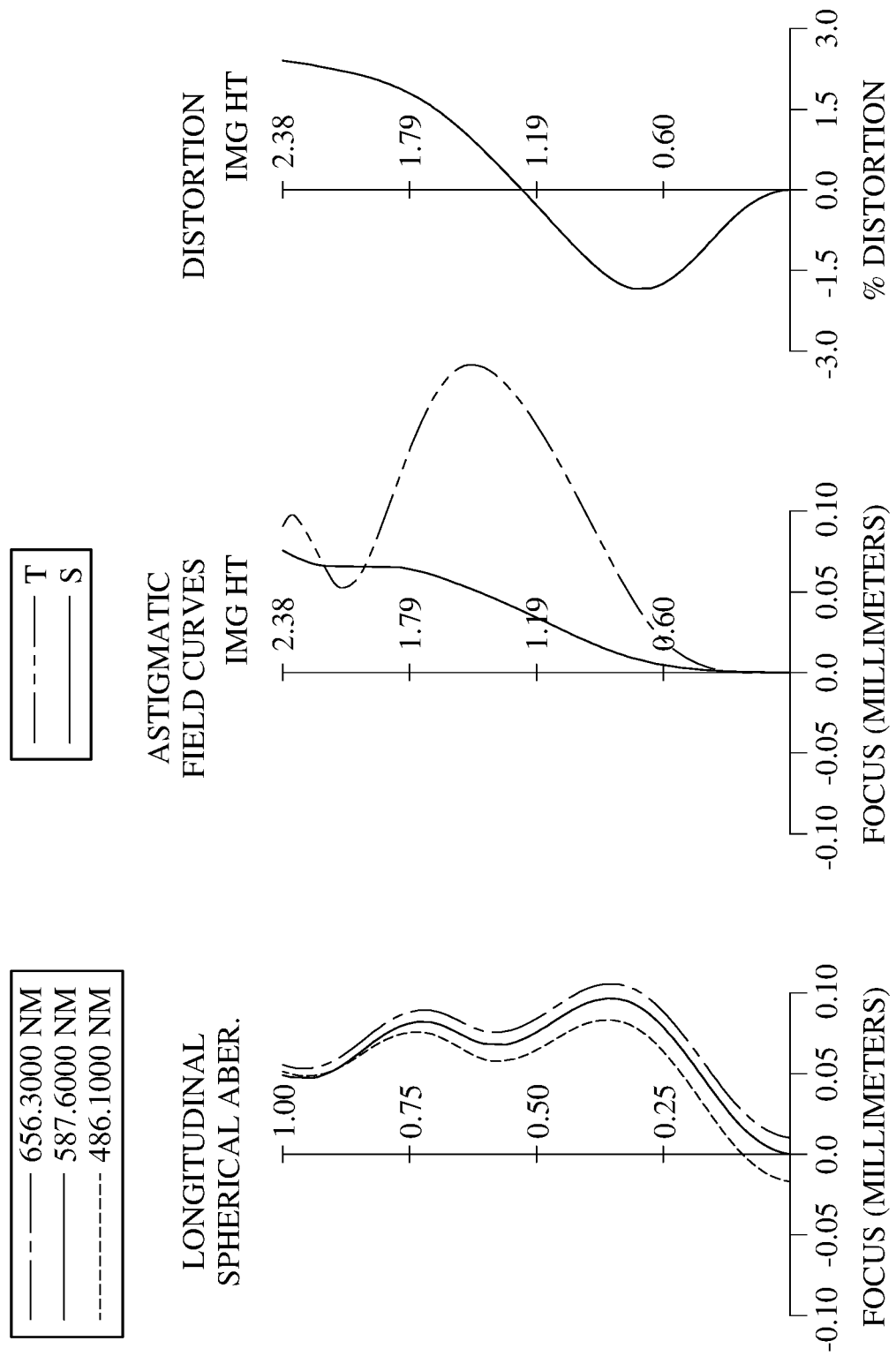
FIG. 12 shows spherical aberration curves, astigmatic field curves and a distortion curve of the image capturing unit according to the 6th embodiment.

FIG. 11 is a schematic view of an image capturing unit according to the 6th embodiment of the present disclosure. FIG. 12 shows, in order from left to right, spherical aberration curves, astigmatic field curves and a distortion curve of the image capturing unit according to the 6th embodiment. In FIG. 11, the image capturing unit includes the imaging lens system (its reference numeral is omitted) of the present disclosure and an image sensor 699. The imaging lens system includes, in order from an object side to an image side, a first lens element 610, a second lens element 620, an aperture stop 600, a third lens element 630, a fourth lens element 640, a fifth lens element 650, a sixth lens element 660, a seventh lens element 670, an eighth lens element 680, a filter 690 and an image surface 695. The imaging lens system includes eight lens elements (610, 620, 630, 640, 650, 660, 670 and 680) with no additional lens element disposed between each of the adjacent eight lens elements.

The first lens element 610 with positive refractive power has an object-side surface 611 being convex in a paraxial region thereof and an image-side surface 612 being concave in a paraxial region thereof. The first lens element 610 is made of plastic material and has the object-side surface 611 and the image-side surface 612 being both aspheric. The object-side surface 611 of the first lens element 610 has one inflection point.

The second lens element 620 with positive refractive power has an object-side surface 621 being convex in a paraxial region thereof and an image-side surface 622 being convex in a paraxial region thereof. The second lens element 620 is made of plastic material and has the object-side surface 621 and the image-side surface 622 being both aspheric. The image-side surface 622 of the second lens element 620 has two inflection points.

The third lens element 630 with negative refractive power has an object-side surface 631 being convex in a paraxial region thereof and an image-side surface 632 being concave in a paraxial region thereof. The third lens element 630 is made of plastic material and has the object-side surface 631 and the image-side surface 632 being both aspheric.

The fourth lens element 640 with negative refractive power has an object-side surface 641 being convex in a paraxial region thereof and an image-side surface 642 being concave in a paraxial region thereof. The fourth lens element 640 is made of plastic material and has the object-side surface 641 and the image-side surface 642 being both aspheric. The image-side surface 642 of the fourth lens element 640 has one inflection point.

The fifth lens element 650 with positive refractive power has an object-side surface 651 being convex in a paraxial region thereof and an image-side surface 652 being concave in a paraxial region thereof. The fifth lens element 650 is made of plastic material and has the object-side surface 651 and the image-side surface 652 being both aspheric. The object-side surface 651 of the fifth lens element 650 has one inflection point. The image-side surface 652 of the fifth lens element 650 has three inflection points.

The sixth lens element 660 with positive refractive power has an object-side surface 661 being convex in a paraxial region thereof and an image-side surface 662 being convex in a paraxial region thereof. The sixth lens element 660 is made of plastic material and has the object-side surface 661 and the image-side surface 662 being both aspheric. The object-side surface 661 of the sixth lens element 660 has three inflection points. The image-side surface 662 of the sixth lens element 660 has two inflection points.

The seventh lens element 670 with negative refractive power has an object-side surface 671 being convex in a paraxial region thereof and an image-side surface 672 being concave in a paraxial region thereof. The seventh lens element 670 is made of plastic material and has the object-side surface 671 and the image-side surface 672 being both aspheric. The object-side surface 671 of the seventh lens element 670 has three inflection points. The image-side surface 672 of the seventh lens element 670 has one inflection point. The image-side surface 672 of the seventh lens element 670 has at least one critical point in an off-axis region thereof.

The eighth lens element 680 with positive refractive power has an object-side surface 681 being concave in a paraxial region thereof and an image-side surface 682 being convex in a paraxial region thereof. The eighth lens element 680 is made of plastic material and has the object-side surface 681 and the image-side surface 682 being both aspheric. The object-side surface 681 of the eighth lens element 680 has four inflection points. The image-side surface 682 of the eighth lens element 680 has six inflection points.

The filter 690 is made of glass material and located between the eighth lens element 680 and the image surface 695, and will not affect the focal length of the imaging lens system. The image sensor 699 is disposed on or near the image surface 695 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 680 is V8, and a refractive index of the eighth lens element 680 is N8.

The focal length of the imaging lens system is f, a curvature radius of an object-side surface of one lens element of the imaging lens system is Ro, a curvature radius of an image-side surface of the lens element is Ri, and two (the sixth lens element 660 and the eighth lens element 680) of the eight lens elements (610, 620, 630, 640, 650, 660, 670 and 680) satisfy |f/Ro|+|f/Ri|<0.50. In detail, a curvature radius of the object-side surface 661 of the sixth lens element 660 is R11, a curvature radius of the image-side surface 662 of the sixth lens element 660 is R12, and |f/R11|+|f/R12|=0.14; a curvature radius of the object-side surface 681 of the eighth lens element 680 is R15, a curvature radius of the image-side surface 682 of the eighth lens element 680 is R16, and |f/R15|+|f/R16|=0.31.

The detailed optical data of the 6th embodiment are shown in Table 11 and the aspheric surface data are shown in Table 12 below.

TABLE 11

6th Embodiment
f = 5.29 mm, Fno = 1.44, HFOV = 23.4 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 1.875 (ASP) | 0.980 | Plastic | 1.545 | 56.1 | 6.13 |
| 2 | | 3.487 (ASP) | 0.030 | | | | |
| 3 | Lens 2 | 3.167 (ASP) | 0.758 | Plastic | 1.545 | 56.1 | 5.27 |
| 4 | | −28.233 (ASP) | 0.056 | | | | |
| 5 | Ape. Stop | Plano | 0.016 | | | | |
| 6 | Lens 3 | 8.835 (ASP) | 0.160 | Plastic | 1.669 | 19.5 | −6.98 |
| 7 | | 3.032 (ASP) | 0.247 | | | | |
| 8 | Lens 4 | 6.128 (ASP) | 0.200 | Plastic | 1.639 | 23.5 | −9.65 |
| 9 | | 3.033 (ASP) | 0.440 | | | | |
| 10 | Lens 5 | 4.670 (ASP) | 0.174 | Plastic | 1.650 | 21.5 | 18.53 |
| 11 | | 7.514 (ASP) | 0.150 | | | | |
| 12 | Lens 6 | 86.072 (ASP) | 0.283 | Plastic | 1.672 | 18.8 | 54.59 |
| 13 | | −63.851 (ASP) | 0.653 | | | | |
| 14 | Lens 7 | 1.983 (ASP) | 0.250 | Plastic | 1.544 | 55.9 | −5.13 |
| 15 | | 1.108 (ASP) | 0.228 | | | | |
| 16 | Lens 8 | −77.715 (ASP) | 0.441 | Plastic | 1.688 | 18.7 | 44.02 |
| 17 | | −21.842 (ASP) | 0.200 | | | | |
| 18 | Filter | Plano | 0.110 | Glass | 1.517 | 64.2 | — |
| 19 | | Plano | 0.170 | | | | |
| 20 | Image | Plano | — | | | | |

Note:
Reference wavelength is 587.6 nm (d-line).

TABLE 12

Aspheric Coefficients

| | Surface # | | | | | |
|---|---|---|---|---|---|---|
| | 1 | 2 | 3 | 4 | 6 | 7 |
| k= | −2.9987E−01 | −2.8667E−01 | 1.6017E−01 | 8.9940E+01 | −1.6056E+01 | −7.6812E+00 |
| A4= | −9.0393E−03 | −3.5745E−03 | −2.7682E−03 | −1.1569E−02 | −1.1218E−01 | −6.9545E−02 |

TABLE 12-continued

Aspheric Coefficients

| | | | | | | |
|---|---|---|---|---|---|---|
| A6= | 1.4943E−02 | 6.7680E−03 | 5.3631E−03 | 3.2951E−02 | 2.2318E−01 | 3.0679E−01 |
| A8= | −9.5400E−03 | −3.1125E−03 | −2.3768E−03 | −2.5115E−02 | −2.3558E−01 | −4.3066E−01 |
| A10= | 3.1104E−03 | 4.0788E−04 | 2.4100E−04 | 9.5283E−03 | 1.3957E−01 | 3.5646E−01 |
| A12= | −3.9413E−04 | — | — | −1.8658E−03 | −4.1536E−02 | −1.7387E−01 |
| A14= | — | — | — | 1.4868E−04 | 4.9452E−03 | 4.4190E−02 |

Surface #

| | 8 | 9 | 10 | 11 | 12 | 13 |
|---|---|---|---|---|---|---|
| k= | −1.3391E+01 | 2.0407E+00 | −1.1843E+01 | −4.2685E+01 | −5.0000E+01 | 7.8245E+01 |
| A4= | −4.9793E−02 | −7.0119E−02 | −7.5137E−02 | −1.4123E−01 | −1.0310E−01 | −9.5361E−02 |
| A6= | 2.1320E−01 | 7.4146E−02 | −8.9966E−02 | 3.2300E−01 | 1.6570E−01 | 1.1258E−01 |
| A8= | −3.2457E−01 | −1.3825E−02 | 1.2466E−01 | −6.2816E−01 | −7.2489E−02 | −6.3377E−02 |
| A10= | 2.0937E−01 | −2.3542E−01 | −2.1807E−02 | 6.0871E−01 | 6.3589E−03 | 2.3809E−02 |
| A12= | −5.4262E−02 | 3.2231E−01 | 4.1894E−02 | −2.9492E−01 | 4.0891E−03 | −4.6356E−03 |
| A14= | 5.9311E−03 | −1.6462E−01 | 1.3178E−01 | 6.9447E−02 | −9.6065E−04 | 2.9119E−04 |
| A16= | — | 2.9398E−02 | −6.8777E−02 | −6.3802E−03 | — | — |

Surface #

| | 14 | 15 | 16 | 17 |
|---|---|---|---|---|
| k= | −1.0796E+01 | −4.6820E+00 | 5.8009E+01 | 8.3614E+01 |
| A4= | −3.1062E−01 | −2.7419E−01 | −3.3896E−01 | −4.5239E−01 |
| A6= | −1.9264E−02 | 1.2752E−01 | 5.2119E−01 | 5.5455E−01 |
| A8= | 1.7837E−01 | −2.2808E−02 | −3.7993E−01 | −3.0923E−01 |
| A10= | −1.0037E−01 | −3.2557E−03 | 1.5597E−01 | 8.6629E−02 |
| A12= | 1.6696E−02 | 1.6441E−03 | −3.7626E−02 | −9.6990E−03 |
| A14= | 1.7146E−03 | −2.1007E−04 | 5.1899E−03 | −6.5805E−04 |
| A16= | −5.4247E−04 | 1.0790E−05 | −3.6618E−04 | 2.5956E−04 |
| A18= | — | — | 9.5770E−06 | −1.7478E−05 |

In the 6th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 6th embodiment, so an explanation in this regard will not be provided again.

Moreover, these parameters can be calculated from Table 11 and Table 12 as the following values and satisfy the following conditions:

| 6th Embodiment | | | |
|---|---|---|---|
| f [mm] | 5.29 | EPD/BL | 7.64 |
| Fno | 1.44 | f/EPD | 1.44 |
| HFOV [deg.] | 23.4 | (Y11 − ImgH)/EPD | −0.11 |
| V8 | 18.7 | f × tan(HFOV)/EPD | 0.62 |
| Vmin | 18.7 | (|Y11 − Y82| + BL)/f | 0.15 |
| ΣVi | 270.0 | (Y82 − Y51)/(Y11 − Y51) | 1.40 |
| Nmax | 1.688 | (|Y11 − Y82| + |Y82 − ImgH|)/f | 0.08 |
| (Vi/Ni)min | 11.08 | f/ImgH | 2.22 |
| ΣCT/ΣAT | 1.78 | Yc72/f | 0.17 |
| R1/CT1 | 1.91 | f/R1| + |f/R2| | 4.33 |
| BL/CT1 | 0.49 | |f/R3| + |f/R4| | 1.86 |
| R8/f | 0.57 | |f/R5| + |f/R6| | 2.34 |
| (R11 + R12)/ | 0.15 | |f/R7| + |f/R8| | 2.61 |
| (R11 − R12) | | |f/R9| + |f/R10| | 1.84 |
| (R13 − R14)/ | 0.28 | |f/R11| + |f/R12| | 0.14 |
| (R13 + R14) | | |f/R13| + |f/R14| | 7.44 |
| f/f1 | 0.86 | |f/R15| + |f/R16| | 0.31 |
| f/f5 | 0.29 | V1/N1 | 36.30 |
| f5/f7 | −3.61 | V2/N2 | 36.30 |
| f8/f5 | 2.38 | V3/N3 | 11.66 |
| f/f5 + f/f6 | 0.38 | V4/N4 | 14.34 |
| ImgH [mm] | 2.38 | V5/N5 | 13.01 |
| TL [mm] | 5.55 | V6/N6 | 11.24 |

-continued

| 6th Embodiment | | | |
|---|---|---|---|
| TL/f | 1.05 | V7/N7 | 36.23 |
| TL/EPD | 1.51 | V8/N8 | 11.08 |
| SL/TL | 0.67 | — | — |
| BL/TD | 0.09 | | |
| EPD/ImgH | 1.54 | | |

7th Embodiment

Figure 13:
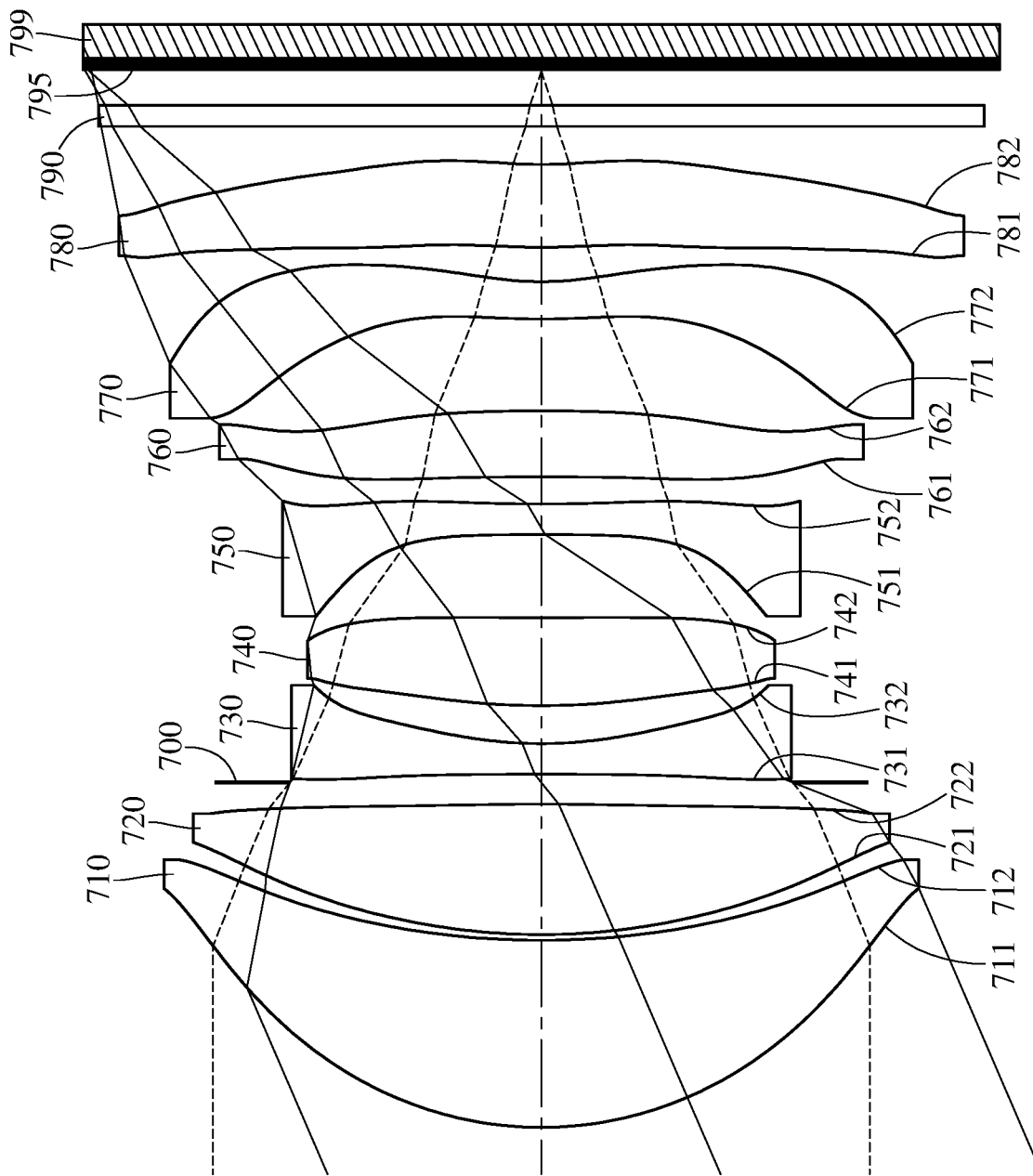
FIG. 13 is a schematic view of an image capturing unit according to the 7th embodiment of the present disclosure.
Figure 14:
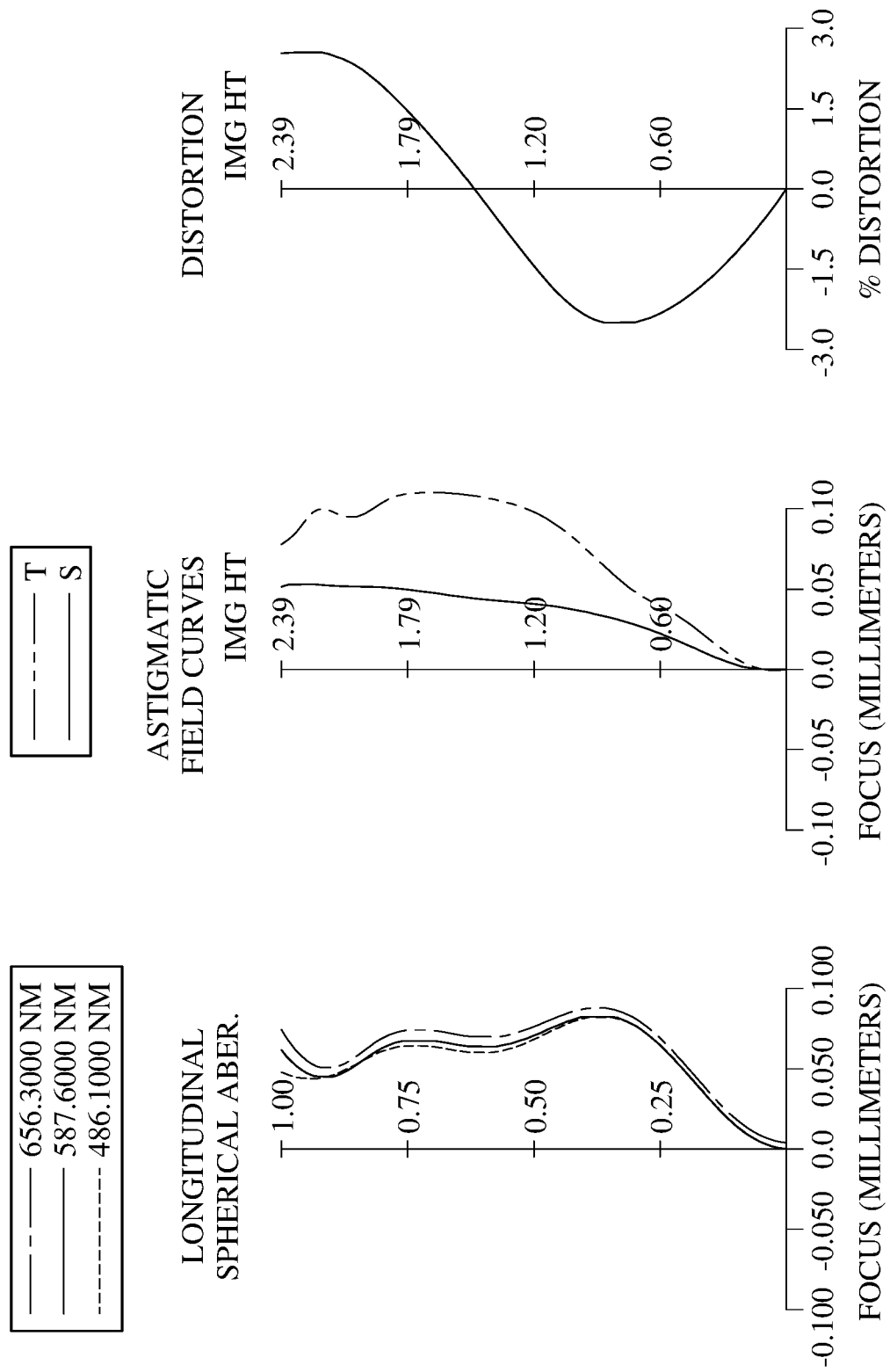
FIG. 14 shows spherical aberration curves, astigmatic field curves and a distortion curve of the image capturing unit according to the 7th embodiment.

FIG. 13 is a schematic view of an image capturing unit according to the 7th embodiment of the present disclosure. FIG. 14 shows, in order from left to right, spherical aberration curves, astigmatic field curves and a distortion curve of the image capturing unit according to the 7th embodiment. In FIG. 13, the image capturing unit includes the imaging lens system (its reference numeral is omitted) of the present disclosure and an image sensor 799. The imaging lens system includes, in order from an object side to an image side, a first lens element 710, a second lens element 720, an aperture stop 700, a third lens element 730, a fourth lens element 740, a fifth lens element 750, a sixth lens element 760, a seventh lens element 770, an eighth lens element 780, a filter 790 and an image surface 795. The imaging lens system includes eight lens elements (710, 720, 730, 740, 750, 760, 770 and 780) with no additional lens element disposed between each of the adjacent eight lens elements.

The first lens element 710 with positive refractive power has an object-side surface 711 being convex in a paraxial region thereof and an image-side surface 712 being concave in a paraxial region thereof. The first lens element 710 is made of plastic material and has the object-side surface 711 and the image-side surface 712 being both aspheric. The object-side surface 711 of the first lens element 710 has one inflection point. The image-side surface 712 of the first lens element 710 has one inflection point.

The second lens element 720 with positive refractive power has an object-side surface 721 being convex in a paraxial region thereof and an image-side surface 722 being convex in a paraxial region thereof. The second lens element 720 is made of plastic material and has the object-side surface 721 and the image-side surface 722 being both aspheric. The object-side surface 721 of the second lens element 720 has one inflection point. The image-side surface 722 of the second lens element 720 has two inflection points.

The third lens element 730 with negative refractive power has an object-side surface 731 being concave in a paraxial region thereof and an image-side surface 732 being concave in a paraxial region thereof. The third lens element 730 is made of plastic material and has the object-side surface 731 and the image-side surface 732 being both aspheric. The object-side surface 731 of the third lens element 730 has one inflection point.

The fourth lens element 740 with positive refractive power has an object-side surface 741 being convex in a paraxial region thereof and an image-side surface 742 being concave in a paraxial region thereof. The fourth lens element 740 is made of plastic material and has the object-side surface 741 and the image-side surface 742 being both aspheric. The object-side surface 741 of the fourth lens element 740 has three inflection points. The image-side surface 742 of the fourth lens element 740 has one inflection point.

The fifth lens element 750 with negative refractive power has an object-side surface 751 being concave in a paraxial region thereof and an image-side surface 752 being concave in a paraxial region thereof. The fifth lens element 750 is made of plastic material and has the object-side surface 751 and the image-side surface 752 being both aspheric. The image-side surface 752 of the fifth lens element 750 has two inflection points.

The sixth lens element 760 with positive refractive power has an object-side surface 761 being concave in a paraxial region thereof and an image-side surface 762 being convex in a paraxial region thereof. The sixth lens element 760 is made of plastic material and has the object-side surface 761 and the image-side surface 762 being both aspheric. The object-side surface 761 of the sixth lens element 760 has two inflection points. The image-side surface 762 of the sixth lens element 760 has two inflection points.

The seventh lens element 770 with negative refractive power has an object-side surface 771 being convex in a paraxial region thereof and an image-side surface 772 being concave in a paraxial region thereof. The seventh lens element 770 is made of plastic material and has the object-side surface 771 and the image-side surface 772 being both aspheric. The object-side surface 771 of the seventh lens element 770 has two inflection points. The image-side surface 772 of the seventh lens element 770 has one inflection point. The image-side surface 772 of the seventh lens element 770 has at least one critical point in an off-axis region thereof.

The eighth lens element 780 with negative refractive power has an object-side surface 781 being convex in a paraxial region thereof and an image-side surface 782 being concave in a paraxial region thereof. The eighth lens element 780 is made of plastic material and has the object-side surface 781 and the image-side surface 782 being both aspheric. The object-side surface 781 of the eighth lens element 780 has six inflection points. The image-side surface 782 of the eighth lens element 780 has four inflection points.

The filter 790 is made of glass material and located between the eighth lens element 780 and the image surface 795, and will not affect the focal length of the imaging lens system. The image sensor 799 is disposed on or near the image surface 795 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 780 is V8, and a refractive index of the eighth lens element 780 is N8.

The detailed optical data of the 7th embodiment are shown in Table 13 and the aspheric surface data are shown in Table 14 below.

TABLE 13

7th Embodiment
f = 5.32 mm, Fno = 1.55, HFOV = 23.3 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.911 | (ASP) | 0.980 | Plastic | 1.545 | 56.1 | 5.43 |
| 2 | | 4.418 | (ASP) | 0.030 | | | | |
| 3 | Lens 2 | 3.392 | (ASP) | 0.683 | Plastic | 1.545 | 56.1 | 5.23 |
| 4 | | −16.475 | (ASP) | 0.114 | | | | |
| 5 | Ape. Stop | Plano | | 0.043 | | | | |
| 6 | Lens 3 | −46.816 | (ASP) | 0.160 | Plastic | 1.669 | 19.5 | −3.16 |
| 7 | | 2.214 | (ASP) | 0.199 | | | | |
| 8 | Lens 4 | 3.785 | (ASP) | 0.461 | Plastic | 1.639 | 23.5 | 6.09 |
| 9 | | 132.551 | (ASP) | 0.435 | | | | |
| 10 | Lens 5 | −21.491 | (ASP) | 0.160 | Plastic | 1.650 | 21.5 | −9.51 |
| 11 | | 8.712 | (ASP) | 0.142 | | | | |
| 12 | Lens 6 | −44.889 | (ASP) | 0.346 | Plastic | 1.672 | 18.8 | 28.09 |
| 13 | | −13.328 | (ASP) | 0.481 | | | | |
| 14 | Lens 7 | 3.748 | (ASP) | 0.195 | Plastic | 1.544 | 55.9 | −4.83 |
| 15 | | 1.515 | (ASP) | 0.180 | | | | |
| 16 | Lens 8 | 2.939 | (ASP) | 0.434 | Plastic | 1.688 | 18.7 | −11.29 |
| 17 | | 2.004 | (ASP) | 0.200 | | | | |

TABLE 13-continued

7th Embodiment
f = 5.32 mm, Fno = 1.55, HFOV = 23.3 deg.

| Surface # | | Curvature Radius | Thickness | Material | Index | Abbe # | Focal Length |
|---|---|---|---|---|---|---|---|
| 18 | Filter | Plano | 0.110 | Glass | 1.517 | 64.2 | — |
| 19 | | Plano | 0.188 | | | | |
| 20 | Image | Plano | — | | | | |

Note:
Reference wavelength is 587.6 nm (d-line).

TABLE 14

Aspheric Coefficients

| Surface # | 1 | 2 | 3 | 4 | 6 | 7 |
|---|---|---|---|---|---|---|
| k = | −2.9619E−01 | 4.5805E−01 | −1.8563E−01 | −9.0000E+01 | −9.0000E+01 | −1.0548E+01 |
| A4 = | −3.4463E−03 | 3.2884E−03 | −9.1374E−03 | 2.8920E−02 | −1.6164E−02 | 5.1733E−02 |
| A6 = | 1.0872E−02 | −3.1477E−03 | 3.4998E−03 | −1.3163E−02 | 8.6334E−03 | −9.7889E−02 |
| A8 = | −7.6822E−03 | 2.3344E−03 | 8.7197E−04 | −4.0372E−03 | −4.6348E−02 | 1.6607E−02 |
| A10 = | 2.7650E−03 | −5.0328E−04 | −4.2578E−04 | 4.9520E−03 | 6.9534E−02 | 4.6548E−02 |
| A12 = | −4.0325E−04 | — | — | −1.4605E−03 | −3.5103E−02 | 2.5890E−03 |
| A14 = | — | — | — | 1.4177E−04 | 6.0059E−03 | −7.8640E−03 |

| Surface # | 8 | 9 | 10 | 11 | 12 | 13 |
|---|---|---|---|---|---|---|
| k = | −1.7482E+01 | 9.0000E+01 | 3.6643E+01 | 1.7836E+01 | −5.0000E+01 | 5.3745E+01 |
| A4 = | 1.8160E−02 | −1.8922E−02 | −7.1981E−02 | −2.8384E−02 | −7.3197E−02 | −1.1356E−01 |
| A6 = | 3.0824E−02 | 6.7119E−02 | −2.7462E−01 | −1.3255E−01 | 1.2676E−01 | 1.2830E−01 |
| A8 = | −2.3577E−01 | −2.4892E−01 | 3.0838E−01 | 1.6948E−01 | −6.6003E−02 | −9.5037E−02 |
| A10 = | 2.6225E−01 | 2.8018E−01 | −2.6693E−01 | −9.9344E−02 | 1.5285E−02 | 5.5286E−02 |
| A12 = | −8.9463E−02 | −1.3636E−01 | 8.2093E−02 | 2.7386E−02 | 1.0886E−05 | −1.6691E−02 |
| A14 = | 4.3740E−03 | 1.8151E−02 | 4.1255E−02 | 2.7742E−03 | −5.2513E−04 | 1.8728E−03 |
| A16 = | — | 2.4829E−03 | −2.0828E−02 | −2.2156E−03 | — | — |

| Surface # | 14 | 15 | 16 | 17 |
|---|---|---|---|---|
| k = | −6.0047E+00 | −6.8378E+00 | −9.0000E+01 | −9.0000E+01 |
| A4 = | −3.9122E−01 | −3.8687E−01 | −3.8899E−01 | −3.0485E−01 |
| A6 = | 3.0048E−01 | 4.9620E−01 | 6.4983E−01 | 2.8636E−01 |
| A8 = | −1.9286E−01 | −3.8201E−01 | −5.2621E−01 | −1.0189E−01 |
| A10 = | 1.0870E−01 | 1.7122E−01 | 2.4087E−01 | −6.4814E−03 |
| A12 = | −4.7081E−02 | −4.3978E−02 | −6.4934E−02 | 1.6352E−02 |
| A14 = | 1.1921E−02 | 5.9117E−03 | 1.0130E−02 | −5.1361E−03 |
| A16 = | −1.2166E−03 | −3.1991E−04 | −8.3739E−04 | 6.9069E−04 |
| A18 = | — | — | 2.8008E−05 | −3.5209E−05 |

In the 7th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 7th embodiment, so an explanation in this regard will not be provided again.

Moreover, these parameters can be calculated from Table 13 and Table 14 as the following values and satisfy the following conditions:

| 7th Embodiment | | | |
|---|---|---|---|
| f [mm] | 5.32 | EPD/BL | 6.90 |
| Fno | 1.55 | f/EPD | 1.55 |
| HFOV [deg.] | 23.3 | (Y11 − ImgH)/EPD | −0.12 |
| V8 | 18.7 | f × tan(HFOV)/EPD | 0.67 |
| Vmin | 18.7 | (|Y11 − Y82| + BL)/f | 0.14 |
| ΣVi | 270.0 | (Y82 − Y51)/(Y11 − Y51) | 1.30 |
| Nmax | 1.688 | (|Y11 − Y82| + |Y82 − ImgH|)/f | 0.08 |
| (Vi/Ni)min | 11.08 | f/ImgH | 2.23 |
| ΣCT/ΣAT | 2.11 | Yc72/f | 0.18 |
| R1/CT1 | 1.95 | |f/R1| + |f/R2| | 3.99 |
| BL/CT1 | 0.51 | |f/R3| + |f/R4| | 1.89 |
| R8/f | 24.90 | |f/R5| + |f/R6| | 2.52 |
| (R11 + R12)/(R11 − R12) | 1.84 | |f/R7| + |f/R8| | 1.45 |
| | | |f/R9| + |f/R10| | 0.86 |
| (R13 − R14)/(R13 + R14) | 0.42 | |f/R11| + |f/R12| | 0.52 |
| | | |f/R13| + |f/R14| | 4.93 |
| f/f1 | 0.98 | |f/R15| + |f/R16| | 4.47 |
| f/f5 | −0.56 | V1/N1 | 36.30 |
| f5/f7 | 1.97 | V2/N2 | 36.30 |
| f8/f5 | 1.19 | V3/N3 | 11.66 |
| f/f5 + f/f6 | −0.37 | V4/N4 | 14.34 |
| ImgH [mm] | 2.39 | V5/N5 | 13.01 |
| TL [mm] | 5.54 | V6/N6 | 11.24 |
| TL/f | 1.04 | V7/N7 | 36.23 |
| TL/EPD | 1.61 | V8/N8 | 11.08 |
| SL/TL | 0.67 | — | — |
| BL/TD | 0.10 | | |
| EPD/ImgH | 1.44 | | |

8th Embodiment

Figure 15:
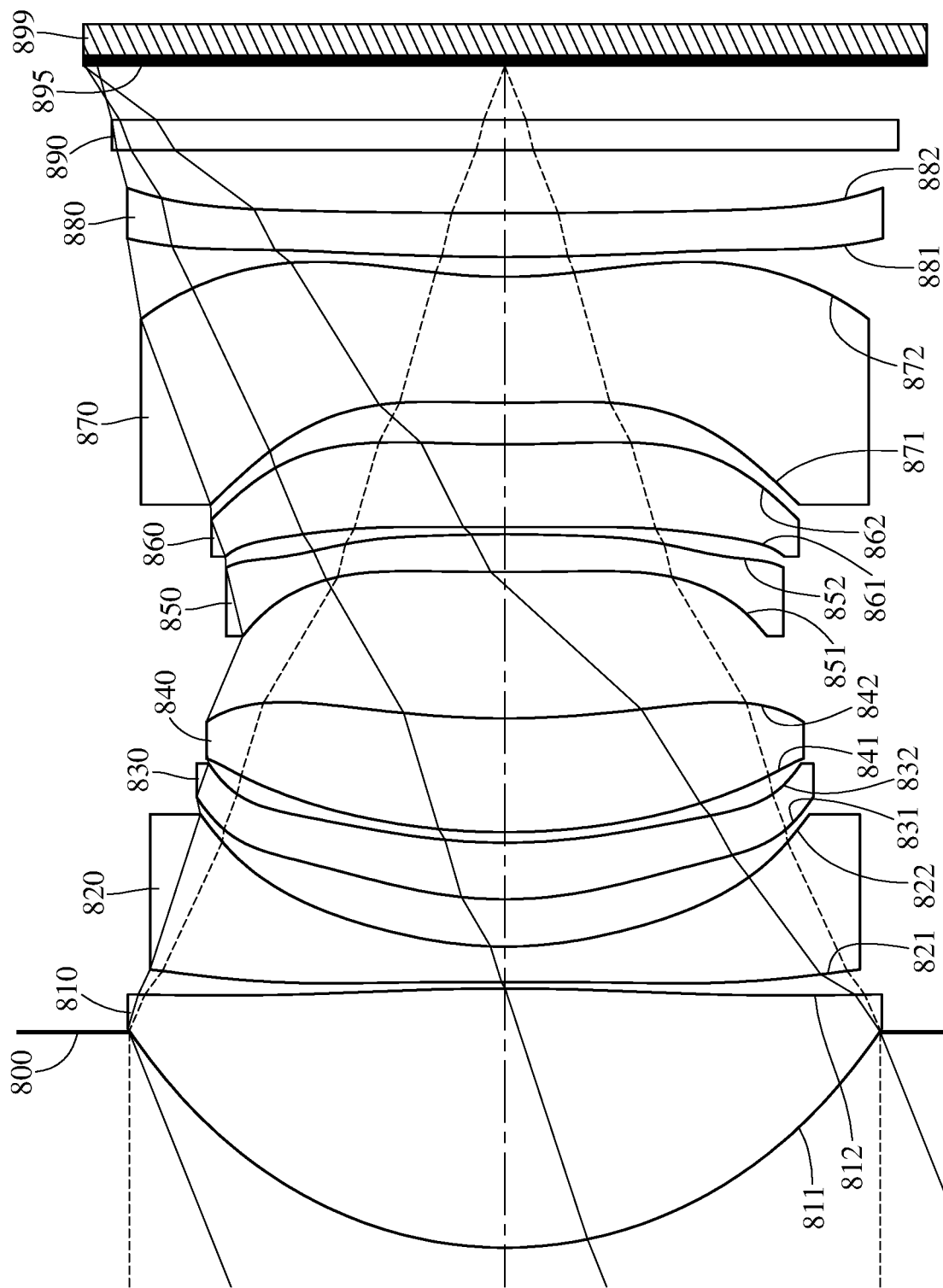
FIG. 15 is a schematic view of an image capturing unit according to the 8th embodiment of the present disclosure.
Figure 16:
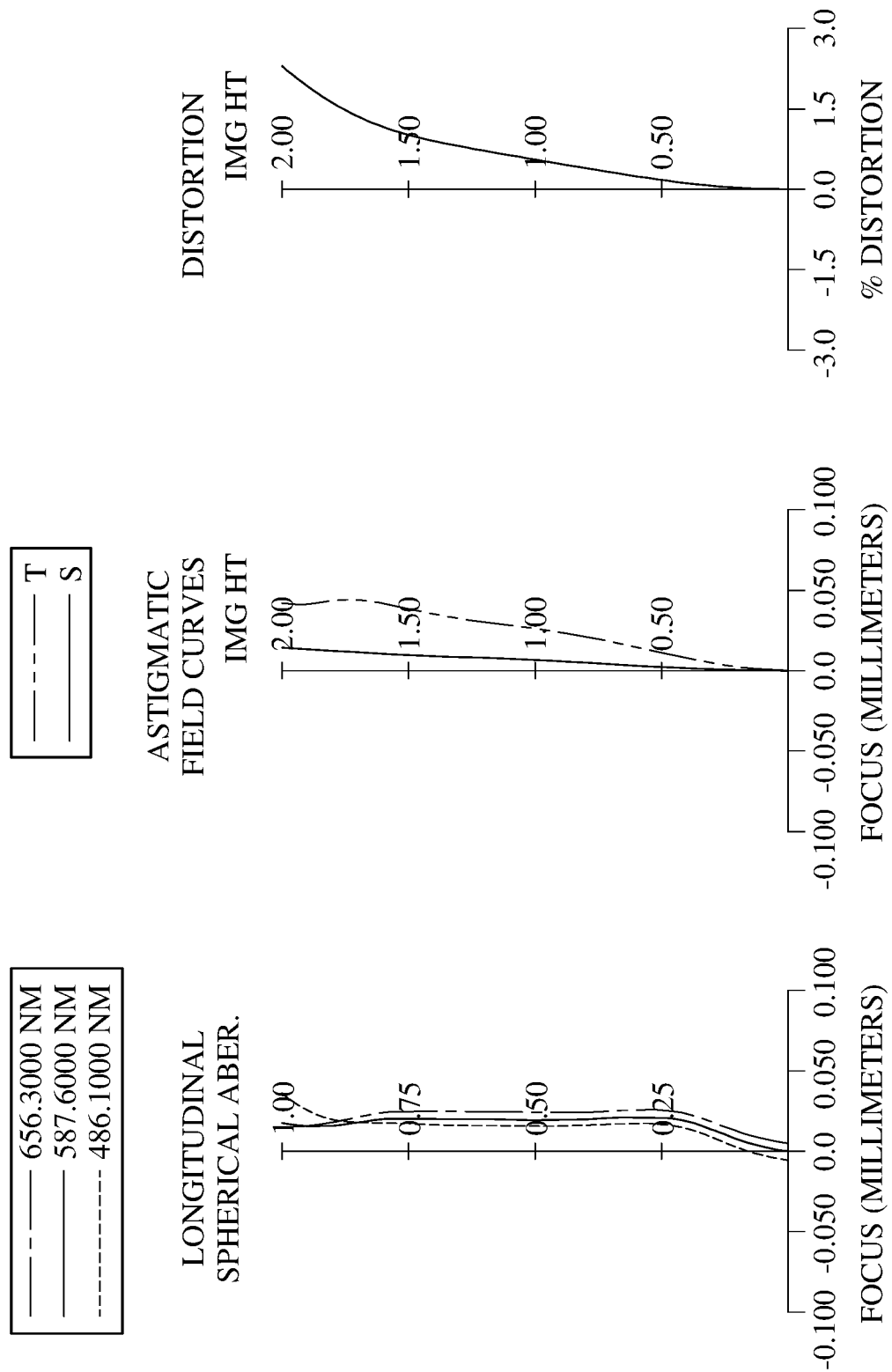
FIG. 16 shows spherical aberration curves, astigmatic field curves and a distortion curve of the image capturing unit according to the 8th embodiment.

FIG. 15 is a schematic view of an image capturing unit according to the 8th embodiment of the present disclosure. FIG. 16 shows, in order from left to right, spherical aberration curves, astigmatic field curves and a distortion curve of the image capturing unit according to the 8th embodiment. In FIG. 15, the image capturing unit includes the imaging lens system (its reference numeral is omitted) of the present disclosure and an image sensor 899. The imaging lens system includes, in order from an object side to an image side, an aperture stop 800, a first lens element 810, a second lens element 820, a third lens element 830, a fourth lens element 840, a fifth lens element 850, a sixth lens element 860, a seventh lens element 870, an eighth lens element 880, a filter 890 and an image surface 895. The imaging lens system includes eight lens elements (810, 820, 830, 840, 850, 860, 870 and 880) with no additional lens element disposed between each of the adjacent eight lens elements.

The first lens element 810 with positive refractive power has an object-side surface 811 being convex in a paraxial region thereof and an image-side surface 812 being convex in a paraxial region thereof. The first lens element 810 is made of plastic material and has the object-side surface 811 and the image-side surface 812 being both aspheric. The image-side surface 812 of the first lens element 810 has one inflection point.

The second lens element 820 with negative refractive power has an object-side surface 821 being convex in a paraxial region thereof and an image-side surface 822 being concave in a paraxial region thereof. The second lens element 820 is made of plastic material and has the object-side surface 821 and the image-side surface 822 being both aspheric. The object-side surface 821 of the second lens element 820 has three inflection points. The image-side surface 822 of the second lens element 820 has one inflection point.

The third lens element 830 with positive refractive power has an object-side surface 831 being convex in a paraxial region thereof and an image-side surface 832 being concave in a paraxial region thereof. The third lens element 830 is made of plastic material and has the object-side surface 831 and the image-side surface 832 being both aspheric. The object-side surface 831 of the third lens element 830 has two inflection points.

The fourth lens element 840 with positive refractive power has an object-side surface 841 being convex in a paraxial region thereof and an image-side surface 842 being concave in a paraxial region thereof. The fourth lens element 840 is made of plastic material and has the object-side surface 841 and the image-side surface 842 being both aspheric. The object-side surface 841 of the fourth lens element 840 has one inflection point. The image-side surface 842 of the fourth lens element 840 has one inflection point.

The fifth lens element 850 with positive refractive power has an object-side surface 851 being convex in a paraxial region thereof and an image-side surface 852 being convex in a paraxial region thereof. The fifth lens element 850 is made of plastic material and has the object-side surface 851 and the image-side surface 852 being both aspheric. The object-side surface 851 of the fifth lens element 850 has one inflection point. The image-side surface 852 of the fifth lens element 850 has two inflection points.

The sixth lens element 860 with negative refractive power has an object-side surface 861 being concave in a paraxial region thereof and an image-side surface 862 being concave in a paraxial region thereof. The sixth lens element 860 is made of plastic material and has the object-side surface 861 and the image-side surface 862 being both aspheric. The object-side surface 861 of the sixth lens element 860 has two inflection points. The image-side surface 862 of the sixth lens element 860 has one inflection point.

The seventh lens element 870 with negative refractive power has an object-side surface 871 being convex in a paraxial region thereof and an image-side surface 872 being concave in a paraxial region thereof. The seventh lens element 870 is made of plastic material and has the object-side surface 871 and the image-side surface 872 being both aspheric. The object-side surface 871 of the seventh lens element 870 has one inflection point. The image-side surface 872 of the seventh lens element 870 has one inflection point. The image-side surface 872 of the seventh lens element 870 has at least one critical point in an off-axis region thereof.

The eighth lens element 880 with positive refractive power has an object-side surface 881 being convex in a paraxial region thereof and an image-side surface 882 being concave in a paraxial region thereof. The eighth lens element 880 is made of plastic material and has the object-side surface 881 and the image-side surface 882 being both aspheric. The object-side surface 881 of the eighth lens element 880 has two inflection points.

The filter 890 is made of glass material and located between the eighth lens element 880 and the image surface 895, and will not affect the focal length of the imaging lens system. The image sensor 899 is disposed on or near the image surface 895 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 880 is V8, and a refractive index of the eighth lens element 880 is N8.

The detailed optical data of the 8th embodiment are shown in Table 15 and the aspheric surface data are shown in Table 16 below.

TABLE 15

8th Embodiment
f = 4.87 mm, Fno = 1.36, HFOV = 21.8 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −1.028 | | | | |
| 2 | Lens 1 | 1.934 | (ASP) | 1.236 | Plastic | 1.545 | 56.0 | 3.18 |
| 3 | | −13.003 | (ASP) | 0.030 | | | | |
| 4 | Lens 2 | 43.718 | (ASP) | 0.170 | Plastic | 1.614 | 26.0 | −3.23 |
| 5 | | 1.894 | (ASP) | 0.226 | | | | |
| 6 | Lens 3 | 1.962 | (ASP) | 0.270 | Plastic | 1.582 | 30.2 | 8.87 |
| 7 | | 3.003 | (ASP) | 0.050 | | | | |

TABLE 15-continued

8th Embodiment
f = 4.87 mm, Fno = 1.36, HFOV = 21.8 deg.

| Surface # | | Curvature Radius | | Thickness | Material | Index | Abbe # | Focal Length |
|---|---|---|---|---|---|---|---|---|
| 8 | Lens 4 | 3.234 | (ASP) | 0.543 | Plastic | 1.530 | 55.8 | 21.41 |
| 9 | | 4.260 | (ASP) | 0.698 | | | | |
| 10 | Lens 5 | 12.479 | (ASP) | 0.180 | Plastic | 1.584 | 28.2 | 7.56 |
| 11 | | −6.807 | (ASP) | 0.035 | | | | |
| 12 | Lens 6 | −21.586 | (ASP) | 0.394 | Plastic | 1.614 | 26.0 | −7.60 |
| 13 | | 5.992 | (ASP) | 0.198 | | | | |
| 14 | Lens 7 | 5.941 | (ASP) | 0.601 | Plastic | 1.582 | 30.2 | −6.79 |
| 15 | | 2.286 | (ASP) | 0.095 | | | | |
| 16 | Lens 8 | 12.070 | (ASP) | 0.209 | Plastic | 1.669 | 19.5 | 30.78 |
| 17 | | 28.978 | (ASP) | 0.300 | | | | |
| 18 | Filter | Plano | | 0.145 | Glass | 1.517 | 64.2 | — |
| 19 | | Plano | | 0.258 | | | | |
| 20 | Image | Plano | | — | | | | |

Note:
Reference wavelength is 587.6 nm (d-line).

TABLE 16

Aspheric Coefficients

| Surface # | 2 | 3 | 4 | 5 | 6 | 7 |
|---|---|---|---|---|---|---|
| k = | −4.0887E−01 | 2.4806E+01 | −9.0000E+01 | −8.1291E+00 | −1.5828E+01 | −2.9794E+01 |
| A4 = | 2.1793E−03 | −7.4888E−03 | −9.5426E−02 | 2.9820E−02 | 2.1306E−01 | 1.4667E−01 |
| A6 = | 4.0592E−03 | 3.9245E−02 | 1.5810E−01 | −3.6952E−02 | −4.5215E−01 | −3.2185E−01 |
| A8 = | −3.4405E−03 | −2.8167E−02 | −1.1192E−01 | 1.1117E−01 | 4.6739E−01 | 3.6335E−01 |
| A10 = | 1.8385E−03 | 9.6744E−03 | 4.3312E−02 | −9.0744E−02 | −2.7920E−01 | −2.3181E−01 |
| A12 = | −4.5180E−04 | −1.6484E−03 | −9.0000E−03 | 2.5488E−02 | 8.9907E−02 | 7.1271E−02 |
| A14 = | 3.9578E−05 | 1.1183E−04 | 8.3006E−04 | 3.6688E−03 | −8.7261E−03 | −8.0636E−04 |
| A16 = | — | — | −1.3960E−05 | −2.1202E−03 | −1.0200E−03 | −2.5882E−03 |

| Surface # | 8 | 9 | 10 | 11 | 12 | 13 |
|---|---|---|---|---|---|---|
| k = | −5.6238E−01 | −1.7584E+00 | 7.7610E+01 | 2.1137E+01 | 4.0565E+01 | −8.2800E+01 |
| A4 = | −1.7222E−04 | −3.6150E−02 | −8.9824E−02 | 2.3488E−01 | 2.2626E−01 | −1.5351E−01 |
| A6 = | −3.9382E−02 | 3.6464E−03 | 1.6830E−02 | −8.2089E−01 | −8.3108E−01 | 9.1000E−02 |
| A8 = | 1.3858E−01 | 1.3204E−02 | −3.4820E−01 | 9.5210E−01 | 1.1720E+00 | −1.0561E−01 |
| A10 = | −1.5548E−01 | −3.9764E−02 | 5.3314E−01 | −4.7173E−01 | −8.6223E−01 | 5.0282E−02 |
| A12 = | 7.5781E−02 | 2.3860E−02 | −3.2357E−01 | 1.0104E−01 | 3.3253E−01 | −8.3698E−03 |
| A14 = | −1.3615E−02 | −4.6269E−03 | 6.9518E−02 | −7.5991E−03 | −5.4134E−02 | 2.2299E−04 |

| Surface # | 14 | 15 | 16 | 17 |
|---|---|---|---|---|
| k = | 1.3977E+01 | −3.8327E−01 | 3.3367E+01 | −8.2360E+01 |
| A4 = | −3.8915E−01 | −2.5620E−01 | −2.8843E−02 | −2.6637E−02 |
| A6 = | 2.1273E−01 | 1.7862E−01 | 6.0179E−02 | 5.2147E−02 |
| A8 = | −3.1668E−02 | −1.2081E−01 | −8.3670E−02 | −4.9687E−02 |
| A10 = | −9.8250E−02 | 5.2131E−02 | 5.2508E−02 | 2.5677E−02 |
| A12 = | 8.3916E−02 | −1.2452E−02 | −1.6380E−02 | −6.8438E−03 |
| A14 = | −2.5052E−02 | 1.4066E−03 | 2.5226E−03 | 8.8750E−04 |
| A16 = | 2.3496E−03 | −4.9718E−05 | −1.5397E−04 | −4.3471E−05 |

In the 8th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 8th embodiment, so an explanation in this regard will not be provided again.

Moreover, these parameters can be calculated from Table 15 and Table 16 as the following values and satisfy the following conditions:

| 8th Embodiment | | | |
|---|---|---|---|
| f [mm] | 4.87 | EPD/BL | 5.09 |
| Fno | 1.36 | f/EPD | 1.36 |
| HFOV [deg.] | 21.8 | (Y11 − ImgH)/EPD | −0.06 |
| V8 | 19.5 | f × tan(HFOV)/EPD | 0.54 |
| Vmin | 19.5 | (|Y11 − Y82| + BL)/f | 0.15 |
| ΣVi | 271.9 | (Y82 − Y51)/(Y11 − Y51) | 1.01 |
| Nmax | 1.669 | (|Y11 − Y82| + |Y82 − ImgH|)/f | 0.04 |
| (Vi/Ni)min | 11.66 | f/ImgH | 2.43 |
| ΣCT/ΣAT | 2.70 | Yc72/f | 0.18 |
| R1/CT1 | 1.56 | |f/R1| + |f/R2| | 2.89 |
| BL/CT1 | 0.57 | |f/R3| + |f/R4| | 2.68 |
| R8/f | 0.88 | |f/R5| + |f/R6| | 4.10 |
| (R11 + R12)/ (R11 − R12) | 0.57 | |f/R7| + |f/R8| | 2.65 |
| | | |f/R9| + |f/R10| | 1.10 |
| (R13 − R14)/ (R13 + R14) | 0.44 | |f/R11| + |f/R12| | 1.04 |
| | | |f/R13| + |f/R14| | 2.95 |
| f/f1 | 1.53 | |f/R15| + |f/R16| | 0.57 |
| f/f5 | 0.64 | V1/N1 | 36.27 |
| f5/f7 | −1.11 | V2/N2 | 16.09 |
| f8/f5 | 4.07 | V3/N3 | 19.11 |
| f/f5 + f/f6 | 0.0030 | V4/N4 | 36.45 |
| ImgH [mm] | 2.00 | V5/N5 | 17.80 |
| TL [mm] | 5.64 | V6/N6 | 16.09 |
| TL/f | 1.16 | V7/N7 | 19.11 |
| TL/EPD | 1.58 | V8/N8 | 11.66 |
| SL/TL | 0.82 | — | — |
| BL/TD | 0.14 | | |
| EPD/ImgH | 1.79 | | |

9th Embodiment

Figure 17:
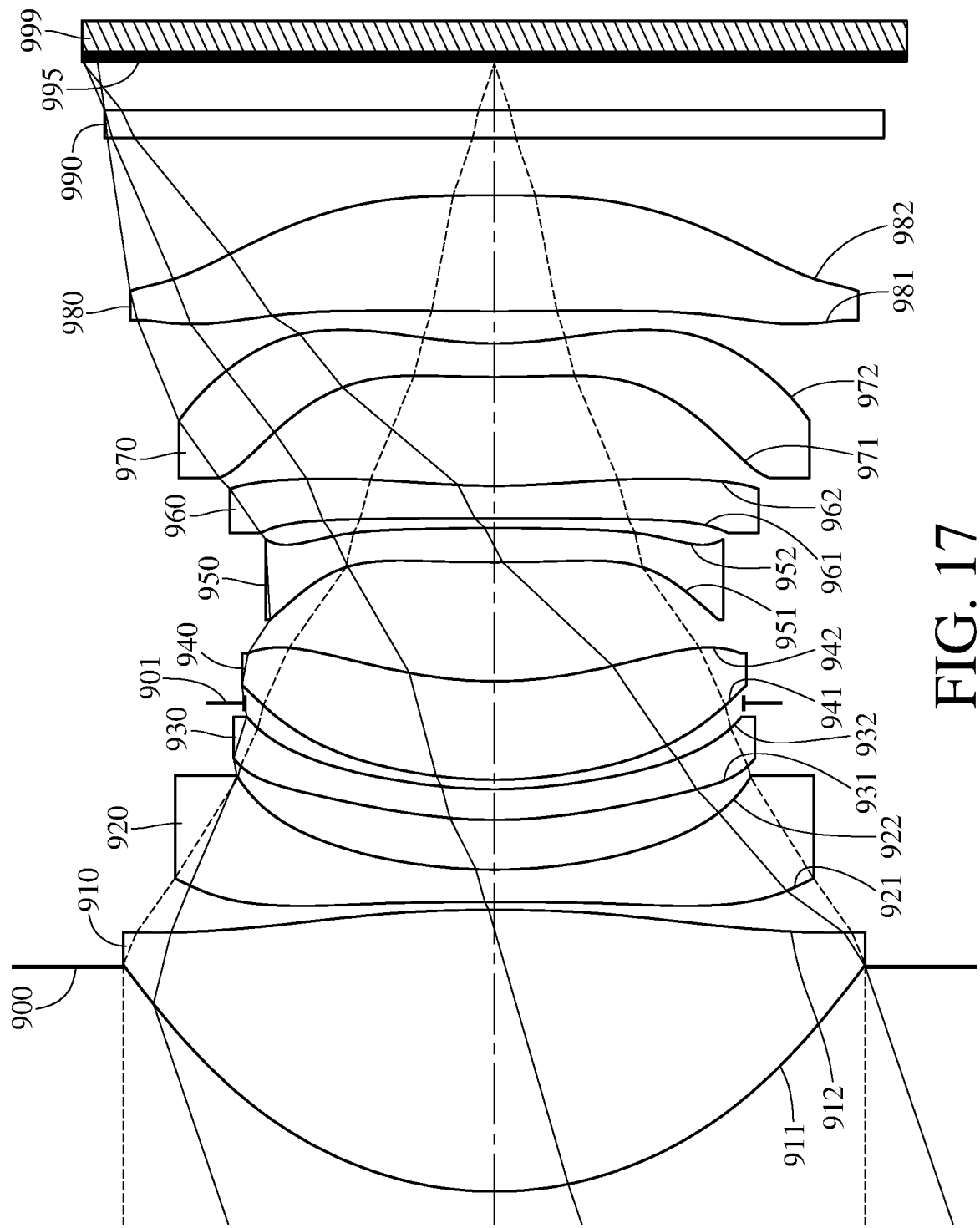
FIG. 17 is a schematic view of an image capturing unit according to the 9th embodiment of the present disclosure.
Figure 18:
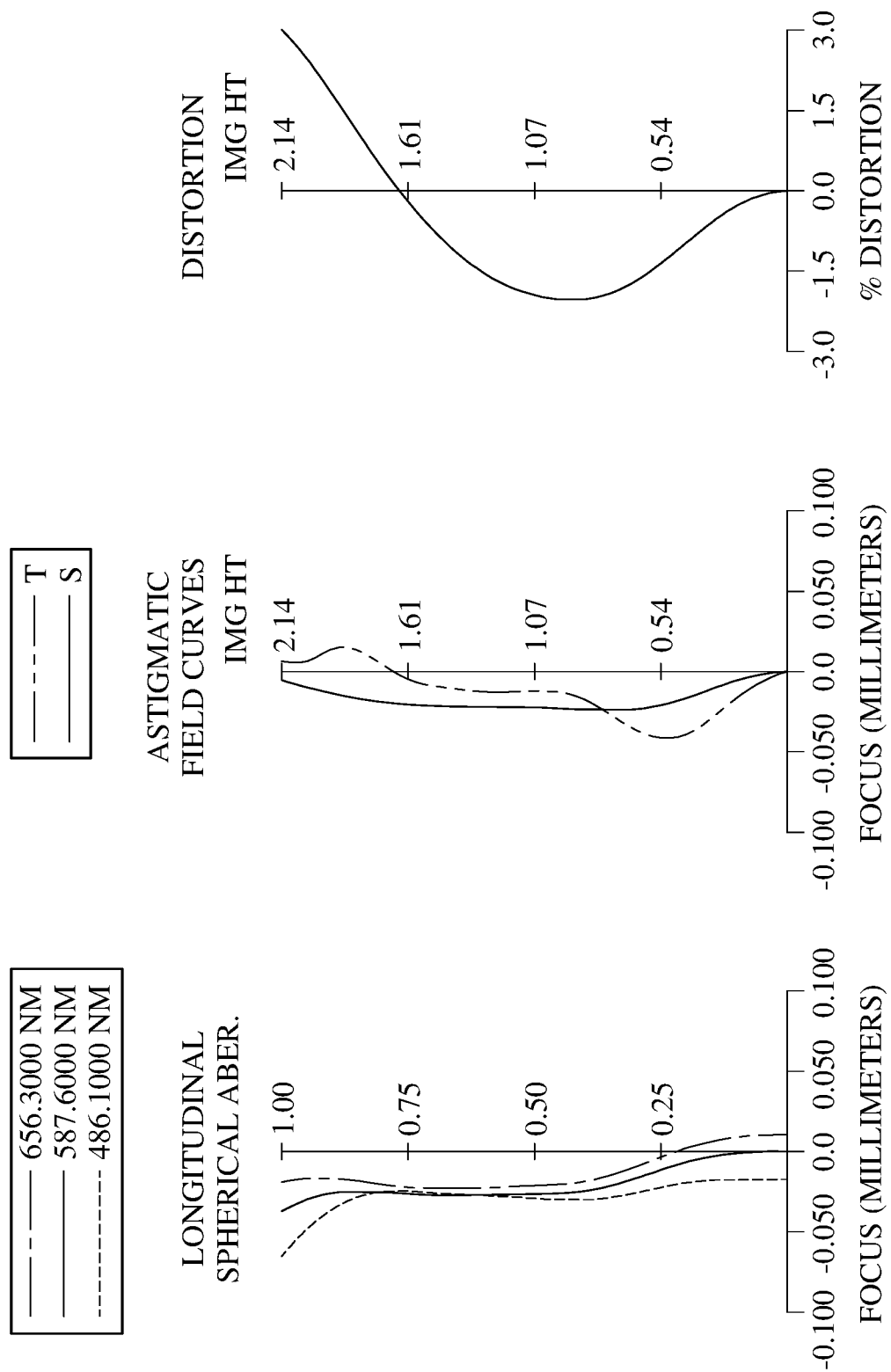
FIG. 18 shows spherical aberration curves, astigmatic field curves and a distortion curve of the image capturing unit according to the 9th embodiment.

FIG. 17 is a schematic view of an image capturing unit according to the 9th embodiment of the present disclosure. FIG. 18 shows, in order from left to right, spherical aberration curves, astigmatic field curves and a distortion curve of the image capturing unit according to the 9th embodiment. In FIG. 17, the image capturing unit includes the imaging lens system (its reference numeral is omitted) of the present disclosure and an image sensor 999. The imaging lens system includes, in order from an object side to an image side, an aperture stop 900, a first lens element 910, a second lens element 920, a third lens element 930, a stop 901, a fourth lens element 940, a fifth lens element 950, a sixth lens element 960, a seventh lens element 970, an eighth lens element 980, a filter 990 and an image surface 995. The imaging lens system includes eight lens elements (910, 920, 930, 940, 950, 960, 970 and 980) with no additional lens element disposed between each of the adjacent eight lens elements.

The first lens element 910 with positive refractive power has an object-side surface 911 being convex in a paraxial region thereof and an image-side surface 912 being convex in a paraxial region thereof. The first lens element 910 is made of plastic material and has the object-side surface 911 and the image-side surface 912 being both aspheric. The image-side surface 912 of the first lens element 910 has one inflection point.

The second lens element 920 with negative refractive power has an object-side surface 921 being convex in a paraxial region thereof and an image-side surface 922 being concave in a paraxial region thereof. The second lens element 920 is made of plastic material and has the object-side surface 921 and the image-side surface 922 being both aspheric. The object-side surface 921 of the second lens element 920 has three inflection points.

The third lens element 930 with positive refractive power has an object-side surface 931 being convex in a paraxial region thereof and an image-side surface 932 being concave in a paraxial region thereof. The third lens element 930 is made of plastic material and has the object-side surface 931 and the image-side surface 932 being both aspheric.

The fourth lens element 940 with negative refractive power has an object-side surface 941 being convex in a paraxial region thereof and an image-side surface 942 being concave in a paraxial region thereof. The fourth lens element 940 is made of plastic material and has the object-side surface 941 and the image-side surface 942 being both aspheric. The object-side surface 941 of the fourth lens element 940 has one inflection point. The image-side surface 942 of the fourth lens element 940 has one inflection point.

The fifth lens element 950 with positive refractive power has an object-side surface 951 being convex in a paraxial region thereof and an image-side surface 952 being convex in a paraxial region thereof. The fifth lens element 950 is made of plastic material and has the object-side surface 951 and the image-side surface 952 being both aspheric. The object-side surface 951 of the fifth lens element 950 has three inflection points. The image-side surface 952 of the fifth lens element 950 has one inflection point.

The sixth lens element 960 with negative refractive power has an object-side surface 961 being convex in a paraxial region thereof and an image-side surface 962 being concave in a paraxial region thereof. The sixth lens element 960 is made of plastic material and has the object-side surface 961 and the image-side surface 962 being both aspheric. The object-side surface 961 of the sixth lens element 960 has one inflection point. The image-side surface 962 of the sixth lens element 960 has one inflection point.

The seventh lens element 970 with negative refractive power has an object-side surface 971 being convex in a paraxial region thereof and an image-side surface 972 being concave in a paraxial region thereof. The seventh lens element 970 is made of plastic material and has the object-side surface 971 and the image-side surface 972 being both aspheric. The object-side surface 971 of the seventh lens element 970 has two inflection points. The image-side surface 972 of the seventh lens element 970 has one inflection point. The image-side surface 972 of the seventh lens element 970 has at least one critical point in an off-axis region thereof.

The eighth lens element 980 with positive refractive power has an object-side surface 981 being convex in a paraxial region thereof and an image-side surface 982 being convex in a paraxial region thereof. The eighth lens element 980 is made of plastic material and has the object-side surface 981 and the image-side surface 982 being both aspheric. The object-side surface 981 of the eighth lens element 980 has three inflection points. The image-side surface 982 of the eighth lens element 980 has two inflection points.

The filter 990 is made of glass material and located between the eighth lens element 980 and the image surface 995, and will not affect the focal length of the imaging lens system. The image sensor 999 is disposed on or near the image surface 995 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 980 is V8, and a refractive index of the eighth lens element 980 is N8.

The detailed optical data of the 9th embodiment are shown in Table 17 and the aspheric surface data are shown in Table 18 below.

TABLE 17

9th Embodiment
f = 6.15 mm, Fno = 1.59, HFOV = 18.8 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −1.173 | | | | |
| 2 | Lens 1 | 1.935 | (ASP) | 1.470 | Plastic | 1.545 | 56.0 | 3.14 |
| 3 | | −10.786 | (ASP) | 0.040 | | | | |
| 4 | Lens 2 | 87.418 | (ASP) | 0.170 | Plastic | 1.614 | 26.0 | −4.57 |
| 5 | | 2.718 | (ASP) | 0.260 | | | | |
| 6 | Lens 3 | 2.532 | (ASP) | 0.160 | Plastic | 1.582 | 30.2 | 356.57 |
| 7 | | 2.504 | (ASP) | 0.450 | | | | |
| 8 | Stop | Plano | | −0.400 | | | | |
| 9 | Lens 4 | 2.371 | (ASP) | 0.514 | Plastic | 1.530 | 55.8 | −287.79 |
| 10 | | 2.160 | (ASP) | 0.621 | | | | |
| 11 | Lens 5 | 8.576 | (ASP) | 0.180 | Plastic | 1.584 | 28.2 | 7.32 |
| 12 | | −8.459 | (ASP) | 0.049 | | | | |
| 13 | Lens 6 | 45.591 | (ASP) | 0.170 | Plastic | 1.614 | 26.0 | −5.99 |
| 14 | | 3.395 | (ASP) | 0.568 | | | | |
| 15 | Lens 7 | 5.412 | (ASP) | 0.175 | Plastic | 1.582 | 30.2 | −5.23 |
| 16 | | 1.927 | (ASP) | 0.168 | | | | |
| 17 | Lens 8 | 12.327 | (ASP) | 0.606 | Plastic | 1.669 | 19.5 | 10.88 |
| 18 | | −17.395 | (ASP) | 0.300 | | | | |
| 19 | Filter | Plano | | 0.145 | Glass | 1.517 | 64.2 | — |
| 20 | | Plano | | 0.253 | | | | |
| 21 | Image | Plano | | — | | | | |

Note:
Reference wavelength is 587.6 nm (d-line).
An effective radius of the stop 901 (Surface 8) is 1.301 mm.

TABLE 18

Aspheric Coefficients

| Surface # | 2 | 3 | 4 | 5 | 6 | 7 |
|---|---|---|---|---|---|---|
| k = | −4.5860E−01 | 2.8791E+01 | −8.9603E+01 | −7.8897E+00 | −1.9952E+01 | −2.1118E+01 |
| A4 = | 2.3046E−03 | −7.5505E−02 | −1.0641E−01 | −3.6631E−03 | 3.6026E−03 | 7.0356E−02 |
| A6 = | 5.5485E−03 | 1.0539E−01 | 1.3737E−01 | 1.1723E−01 | 7.9698E−02 | −2.2493E−01 |
| A8 = | −5.3536E−03 | −6.2893E−02 | −7.7905E−02 | −1.5940E−01 | −1.5189E−01 | 5.1587E−01 |
| A10 = | 3.0692E−03 | 2.1028E−02 | 2.5447E−02 | 1.3071E−01 | 1.2113E−01 | −5.0920E−01 |
| A12 = | −8.6766E−04 | −3.7284E−03 | −3.9228E−03 | −5.3401E−02 | −4.7559E−02 | 2.3455E−01 |
| A14 = | 8.6524E−05 | 2.7703E−04 | 1.7136E−04 | 9.5932E−03 | 8.8955E−03 | −3.9828E−02 |

| Surface # | 9 | 10 | 11 | 12 | 13 | 14 |
|---|---|---|---|---|---|---|
| k = | 4.4541E−01 | −2.3276E+00 | −2.3063E+01 | 2.2304E+01 | −9.0000E+01 | −8.2800E+01 |
| A4 = | 2.6219E−02 | −2.4030E−02 | −1.4750E−02 | 1.5878E−01 | −9.8609E−02 | −5.1954E−02 |
| A6 = | −2.9684E−01 | −7.7358E−02 | −3.7102E−01 | −3.4130E−01 | 2.2516E−01 | −1.9037E−02 |
| A8 = | 6.9634E−01 | 1.1534E−01 | 3.2261E−01 | 1.5569E−01 | −3.1129E−01 | 6.4470E−02 |
| A10 = | −6.7324E−01 | −8.4656E−02 | −3.5928E−01 | 1.6088E−02 | 2.4974E−01 | −4.9426E−02 |
| A12 = | 3.1218E−01 | 1.9508E−02 | 2.9734E−01 | −3.8652E−03 | −1.1711E−01 | 1.6523E−02 |
| A14 = | −5.6932E−02 | — | −8.3881E−02 | — | 2.2259E−02 | −2.3234E−03 |

| Surface # | 15 | 16 | 17 | 18 |
|---|---|---|---|---|
| k = | 1.1890E+01 | −1.0104E+00 | 3.4255E+01 | −8.2360E+01 |
| A4 = | −2.9706E−01 | −2.9732E−01 | −1.5346E−01 | −2.0739E−01 |
| A6 = | −1.3862E−01 | 1.1044E−01 | 2.7000E−01 | 1.6211E−01 |
| A8 = | 3.6718E−01 | 2.5399E−02 | −2.8846E−01 | −8.8193E−02 |
| A10 = | −3.1060E−01 | −9.1938E−02 | 1.6347E−01 | 3.0802E−02 |

TABLE 18-continued

| Aspheric Coefficients | | | | |
|---|---|---|---|---|
| A12 = | 1.2481E−01 | 6.0875E−02 | −4.9494E−02 | −6.1821E−03 |
| A14 = | −1.9124E−02 | −1.7009E−02 | 7.5349E−03 | 7.1398E−04 |
| A16 = | 1.1144E−04 | 1.7502E−03 | −4.0380E−04 | −4.3935E−05 |
| A18 = | — | — | −1.1557E−05 | — |

In the 9th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 9th embodiment, so an explanation in this regard will not be provided again.

Moreover, these parameters can be calculated from Table 17 and Table 18 as the following values and satisfy the following conditions:

| 9th Embodiment | | | |
|---|---|---|---|
| f [mm] | 6.15 | EPD/BL | 5.54 |
| Fno | 1.59 | f/EPD | 1.59 |
| HFOV [deg.] | 18.8 | (Y11 − ImgH)/EPD | −0.05 |
| V8 | 19.5 | f × tan(HFOV)/EPD | 0.54 |
| Vmin | 19.5 | (|Y11 − Y82| + BL)/f | 0.12 |
| ΣVi | 271.9 | (Y82 − Y51)/(Y11 − Y51) | 0.95 |
| Nmax | 1.669 | (|Y11 − Y82| + |Y82 − ImgH|)/f | 0.05 |
| (Vi/Ni)min | 11.66 | f/ImgH | 2.87 |
| ΣCT/ΣAT | 1.96 | Yc72/f | 0.13 |
| R1/CT1 | 1.32 | |f/R1| + |f/R2| | 3.75 |
| BL/CT1 | 0.48 | |f/R3| + |f/R4| | 2.33 |
| R8/f | 0.35 | |f/R5| + |f/R6| | 4.89 |
| (R11 + R12)/ | 1.16 | |f/R7| + |f/R8| | 5.44 |
| (R11 − R12) | | |f/R9| + |f/R10| | 1.44 |
| (R13 − R14)/ | 0.47 | |f/R11| + |f/R12| | 1.95 |
| (R13 + R14) | | |f/R13| + |f/R14| | 4.33 |
| f/f1 | 1.96 | |f/R15| + |f/R16| | 0.85 |
| f/f5 | 0.84 | V1/N1 | 36.27 |
| f5/f7 | −1.40 | V2/N2 | 16.09 |
| f8/f5 | 1.49 | V3/N3 | 19.11 |
| f/f5 + f/f6 | −0.19 | V4/N4 | 36.45 |
| ImgH [mm] | 2.14 | V5/N5 | 17.80 |
| TL [mm] | 5.90 | V6/N6 | 16.09 |
| TL/f | 0.96 | V7/N7 | 19.11 |
| TL/EPD | 1.52 | V8/N8 | 11.66 |
| SL/TL | 0.80 | — | — |
| BL/TD | 0.13 | | |
| EPD/ImgH | 1.81 | | |

10th Embodiment

Figure 19:
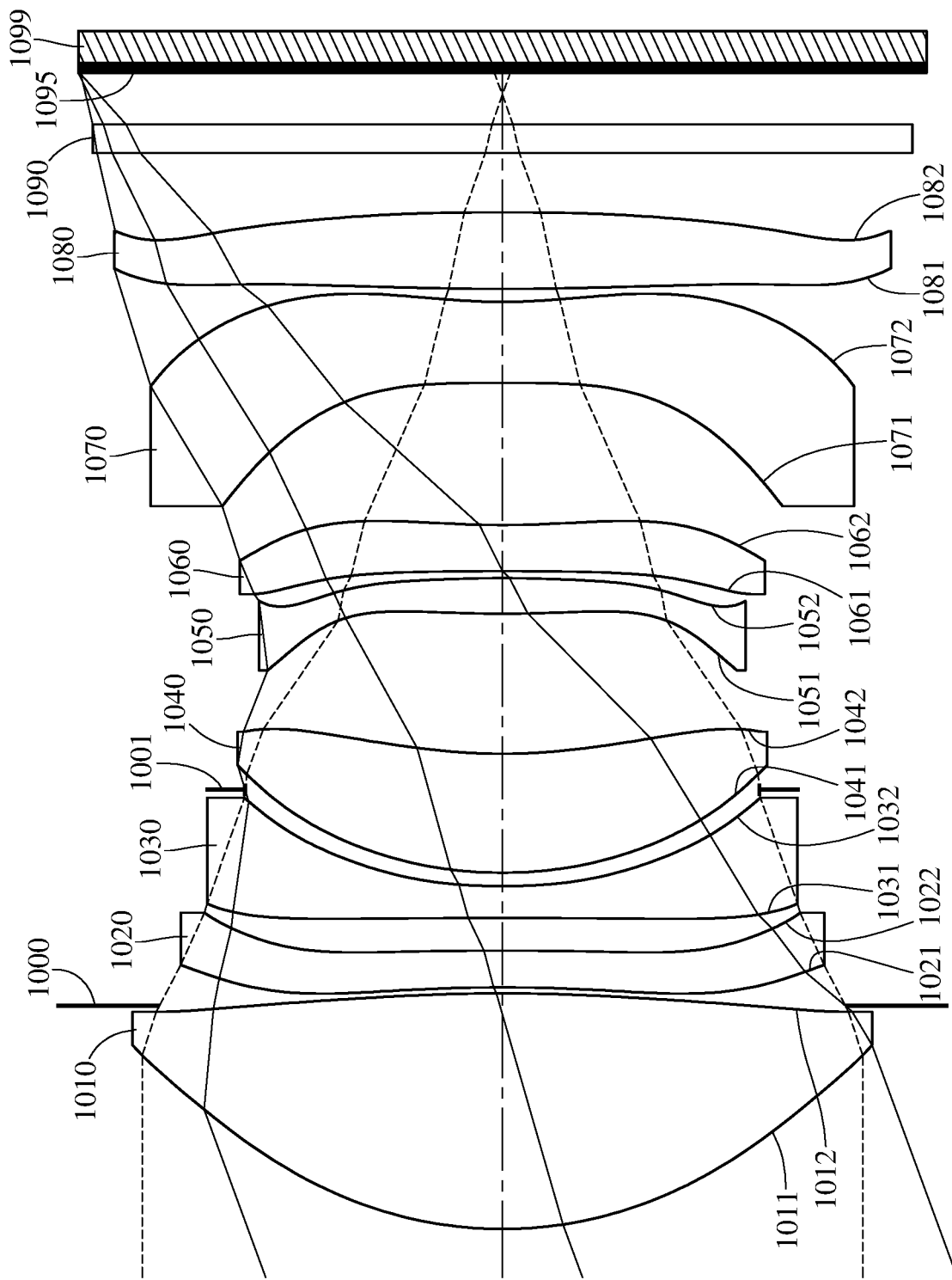
FIG. 19 is a schematic view of an image capturing unit according to the 10th embodiment of the present disclosure.
Figure 20:
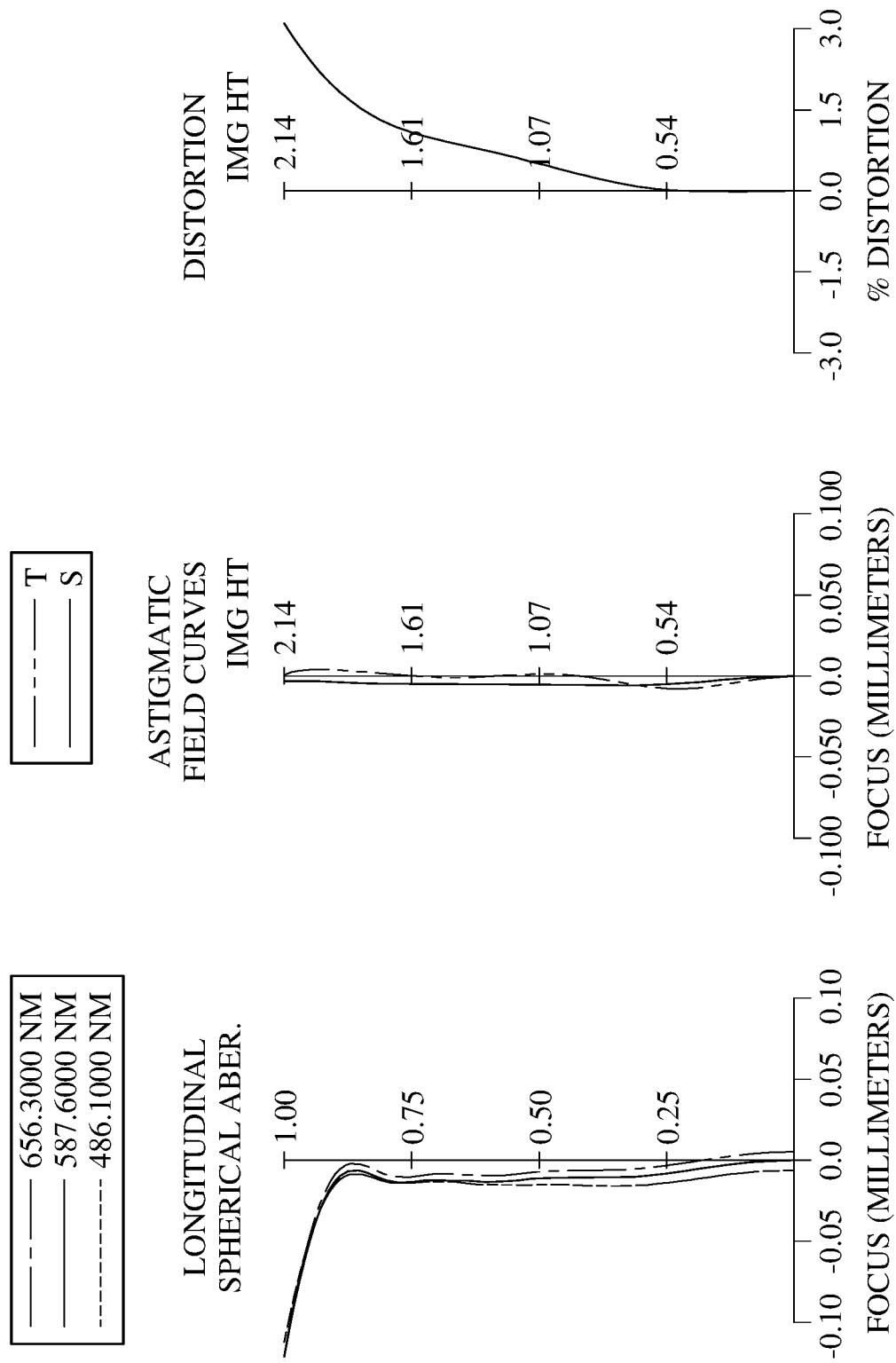
FIG. 20 shows spherical aberration curves, astigmatic field curves and a distortion curve of the image capturing unit according to the 10th embodiment.

FIG. 19 is a schematic view of an image capturing unit according to the 10th embodiment of the present disclosure. FIG. 20 shows, in order from left to right, spherical aberration curves, astigmatic field curves and a distortion curve of the image capturing unit according to the 10th embodiment. In FIG. 19, the image capturing unit includes the imaging lens system (its reference numeral is omitted) of the present disclosure and an image sensor 1099. The imaging lens system includes, in order from an object side to an image side, a first lens element 1010, an aperture stop 1000, a second lens element 1020, a third lens element 1030, a stop 1001, a fourth lens element 1040, a fifth lens element 1050, a sixth lens element 1060, a seventh lens element 1070, an eighth lens element 1080, a filter 1090 and an image surface 1095. The imaging lens system includes eight lens elements (1010, 1020, 1030, 1040, 1050, 1060, 1070 and 1080) with no additional lens element disposed between each of the adjacent eight lens elements.

The first lens element 1010 with positive refractive power has an object-side surface 1011 being convex in a paraxial region thereof and an image-side surface 1012 being convex in a paraxial region thereof. The first lens element 1010 is made of plastic material and has the object-side surface 1011 and the image-side surface 1012 being both aspheric. The image-side surface 1012 of the first lens element 1010 has one inflection point.

The second lens element 1020 with negative refractive power has an object-side surface 1021 being concave in a paraxial region thereof and an image-side surface 1022 being convex in a paraxial region thereof. The second lens element 1020 is made of plastic material and has the object-side surface 1021 and the image-side surface 1022 being both aspheric. The object-side surface 1021 of the second lens element 1020 has one inflection point. The image-side surface 1022 of the second lens element 1020 has one inflection point.

The third lens element 1030 with negative refractive power has an object-side surface 1031 being concave in a paraxial region thereof and an image-side surface 1032 being concave in a paraxial region thereof. The third lens element 1030 is made of plastic material and has the object-side surface 1031 and the image-side surface 1032 being both aspheric. The object-side surface 1031 of the third lens element 1030 has three inflection points. The image-side surface 1032 of the third lens element 1030 has one inflection point.

The fourth lens element 1040 with positive refractive power has an object-side surface 1041 being convex in a paraxial region thereof and an image-side surface 1042 being concave in a paraxial region thereof. The fourth lens element 1040 is made of plastic material and has the object-side surface 1041 and the image-side surface 1042 being both aspheric. The image-side surface 1042 of the fourth lens element 1040 has one inflection point.

The fifth lens element 1050 with positive refractive power has an object-side surface 1051 being convex in a paraxial region thereof and an image-side surface 1052 being convex in a paraxial region thereof. The fifth lens element 1050 is made of plastic material and has the object-side surface 1051 and the image-side surface 1052 being both aspheric. The object-side surface 1051 of the fifth lens element 1050 has one inflection point. The image-side surface 1052 of the fifth lens element 1050 has one inflection point.

The sixth lens element 1060 with negative refractive power has an object-side surface 1061 being concave in a paraxial region thereof and an image-side surface 1062 being concave in a paraxial region thereof. The sixth lens element 1060 is made of plastic material and has the object-side surface 1061 and the image-side surface 1062 being both aspheric. The object-side surface 1061 of the sixth lens element 1060 has one inflection point. The image-side surface 1062 of the sixth lens element 1060 has one inflection point.

The seventh lens element 1070 with negative refractive power has an object-side surface 1071 being concave in a paraxial region thereof and an image-side surface 1072 being concave in a paraxial region thereof. The seventh lens element 1070 is made of plastic material and has the object-side surface 1071 and the image-side surface 1072 being both aspheric. The image-side surface 1072 of the seventh lens element 1070 has one inflection point. The image-side surface 1072 of the seventh lens element 1070 has at least one critical point in an off-axis region thereof.

The eighth lens element 1080 with positive refractive power has an object-side surface 1081 being convex in a paraxial region thereof and an image-side surface 1082 being convex in a paraxial region thereof. The eighth lens element 1080 is made of plastic material and has the object-side surface 1081 and the image-side surface 1082 being both aspheric. The object-side surface 1081 of the eighth lens element 1080 has two inflection points. The image-side surface 1082 of the eighth lens element 1080 has one inflection point.

The filter 1090 is made of glass material and located between the eighth lens element 1080 and the image surface 1095, and will not affect the focal length of the imaging lens system. The image sensor 1099 is disposed on or near the image surface 1095 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V2/N2, wherein an abbe number of the second lens element 1020 is V2, and a refractive index of the second lens element 1020 is N2.

The detailed optical data of the 10th embodiment are shown in Table 19 and the aspheric surface data are shown in Table 20 below.

TABLE 19

10th Embodiment
f = 5.67 mm, Fno = 1.56, HFOV = 20.1 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 2.037 | (ASP) | 1.190 | Plastic | 1.545 | 56.0 | 3.21 |
| 2 | | −9.729 | (ASP) | −0.063 | | | | |
| 3 | Ape. Stop | Plano | | 0.093 | | | | |
| 4 | Lens 2 | −9.427 | (ASP) | 0.185 | Plastic | 1.660 | 20.4 | −16.40 |
| 5 | | −73.720 | (ASP) | 0.166 | | | | |
| 6 | Lens 3 | −31.250 | (ASP) | 0.160 | Plastic | 1.582 | 30.2 | −4.82 |
| 7 | | 3.087 | (ASP) | 0.488 | | | | |
| 8 | Stop | Plano | | −0.420 | | | | |
| 9 | Lens 4 | 2.163 | (ASP) | 0.601 | Plastic | 1.530 | 55.8 | 12.64 |
| 10 | | 2.885 | (ASP) | 0.707 | | | | |
| 11 | Lens 5 | 6.102 | (ASP) | 0.180 | Plastic | 1.584 | 28.2 | 5.20 |
| 12 | | −5.983 | (ASP) | 0.035 | | | | |
| 13 | Lens 6 | −19.306 | (ASP) | 0.233 | Plastic | 1.614 | 26.0 | −5.81 |
| 14 | | 4.392 | (ASP) | 0.718 | | | | |
| 15 | Lens 7 | −22.065 | (ASP) | 0.409 | Plastic | 1.534 | 55.9 | −4.75 |
| 16 | | 2.886 | (ASP) | 0.065 | | | | |
| 17 | Lens 8 | 12.419 | (ASP) | 0.387 | Plastic | 1.650 | 21.5 | 12.39 |
| 18 | | −22.684 | (ASP) | 0.300 | | | | |
| 19 | Filter | Plano | | 0.145 | Glass | 1.517 | 64.2 | — |
| 20 | | Plano | | 0.259 | | | | |
| 21 | Image | Plano | | — | | | | |

Note:
Reference wavelength is 587.6 nm (d-line).
An effective radius of the stop 1001 (Surface 8) is 1.298 mm.

TABLE 20

Aspheric Coefficients

| Surface # | 1 | 2 | 4 | 5 | 6 | 7 |
|---|---|---|---|---|---|---|
| k = | −6.0388E−01 | 2.5859E+01 | −8.8327E+01 | 9.0000E+01 | −9.0000E+01 | −3.8863E+00 |
| A4 = | 5.1124E−03 | −3.9301E−03 | −5.3078E−02 | −8.9970E−02 | 3.6956E−02 | 2.1089E−01 |
| A6 = | 1.0492E−03 | 3.9686E−02 | 1.2654E−01 | 1.9925E−01 | −6.7688E−02 | −2.7893E−01 |
| A8 = | −1.3832E−03 | −3.7029E−02 | −8.7424E−02 | −1.5907E−01 | 6.3790E−02 | 2.1480E−01 |
| A10 = | 9.3876E−04 | 1.6678E−02 | 3.5731E−02 | 8.7062E−02 | −2.6192E−02 | −8.4078E−02 |
| A12 = | −5.2700E−04 | −3.7331E−03 | −8.2279E−03 | −2.8741E−02 | 5.0722E−03 | 2.1428E−02 |
| A14 = | 8.7629E−05 | 3.4792E−04 | 7.8552E−04 | 4.0276E−03 | −3.0301E−04 | −3.7881E−03 |

| Surface # | 9 | 10 | 11 | 12 | 13 | 14 |
|---|---|---|---|---|---|---|
| k = | 4.0970E−01 | −2.6123E+00 | −4.5273E+01 | 1.2338E+01 | 5.0336E+01 | −8.2800E+01 |
| A4 = | 3.7133E−02 | −7.8789E−02 | −7.5384E−02 | 1.8170E−01 | 7.1945E−02 | −7.2376E−02 |
| A6 = | −4.5057E−02 | 5.7975E−02 | −1.8642E−01 | −5.7860E−01 | −3.5314E−01 | −5.7692E−02 |
| A8 = | 2.0861E−02 | −2.8864E−02 | 1.0991E−01 | 6.8105E−01 | 5.3027E−01 | 8.6130E−02 |
| A10 = | 6.4853E−03 | −3.9088E−03 | −1.7384E−01 | −5.6524E−01 | −4.6360E−01 | −8.7622E−02 |
| A12 = | −4.3362E−03 | 3.2084E−03 | 1.8136E−01 | 3.2872E−01 | 2.1671E−01 | 4.5144E−02 |
| A14 = | — | — | −5.3764E−02 | −7.7438E−02 | −3.9534E−02 | −8.2883E−03 |

TABLE 20-continued

Aspheric Coefficients

| Surface # | 15 | 16 | 17 | 18 |
|---|---|---|---|---|
| k = | −9.0000E+01 | 3.1752E−01 | 3.4255E+01 | −8.2360E+01 |
| A4 = | −2.5367E−01 | −2.3758E−01 | −5.0038E−02 | −6.0346E−02 |
| A6 = | 6.8531E−02 | 1.1153E−01 | 5.7099E−02 | 7.2670E−02 |
| A8 = | 3.9419E−02 | −3.5665E−02 | −4.0208E−02 | −4.7358E−02 |
| A10 = | −6.8865E−02 | −2.8165E−05 | 1.3143E−02 | 1.6165E−02 |
| A12 = | 3.7204E−02 | 4.1722E−03 | −1.7348E−03 | −3.1102E−03 |
| A14 = | −8.5730E−03 | −1.2749E−03 | 3.0961E−05 | 3.8782E−04 |
| A16 = | 6.8150E−04 | 1.2104E−04 | 6.9776E−06 | −2.6349E−05 |

In the 10th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 10th embodiment, so an explanation in this regard will not be provided again.

Moreover, these parameters can be calculated from Table 19 and Table 20 as the following values and satisfy the following conditions:

| 10th Embodiment | | | |
|---|---|---|---|
| f [mm] | 5.67 | EPD/BL | 5.16 |
| Fno | 1.56 | f/EPD | 1.56 |
| HFOV [deg.] | 20.1 | (Y11 − ImgH)/EPD | −0.08 |
| V8 | 21.5 | f × tan(HFOV)/EPD | 0.57 |
| Vmin | 20.4 | (|Y11 − Y82| + BL)/f | 0.14 |
| ΣVi | 294.0 | (Y82 − Y51)/(Y11 − Y51) | 1.16 |
| Nmax | 1.660 | (|Y11 − Y82| + |Y82 − ImgH|)/f | 0.05 |
| (Vi/Ni)min | 12.29 | f/ImgH | 2.65 |
| ΣCT/ΣAT | 1.87 | Yc72/f | 0.13 |
| R1/CT1 | 1.71 | |f/R1| + |f/R2| | 3.37 |
| BL/CT1 | 0.59 | |f/R3| + |f/R4| | 0.68 |
| R8/f | 0.51 | |f/R5| + |f/R6| | 2.02 |
| (R11 + R12)/ (R11 − R12) | 0.63 | |f/R7| + |f/R8| | 4.59 |
|  |  | |f/R9| + |f/R10| | 1.88 |
| (R13 − R14)/ (R13 + R14) | 1.30 | |f/R11| + |f/R12| | 1.58 |
|  |  | |f/R13| + |f/R14| | 2.22 |
| f/f1 | 1.77 | |f/R15| + |f/R16| | 0.71 |
| f/f5 | 1.09 | V1/N1 | 36.27 |
| f5/f7 | −1.09 | V2/N2 | 12.29 |
| f8/f5 | 2.38 | V3/N3 | 19.11 |
| f/f5 + f/f6 | 0.11 | V4/N4 | 36.45 |
| ImgH [mm] | 2.14 | V5/N5 | 17.80 |
| TL [mm] | 5.84 | V6/N6 | 16.09 |
| TL/f | 1.03 | V7/N7 | 36.46 |
| TL/EPD | 1.61 | V8/N8 | 13.01 |
| SL/TL | 0.81 | — | — |
| BL/TD | 0.14 |  |  |
| EPD/ImgH | 1.70 |  |  |

11th Embodiment

Figure 21:
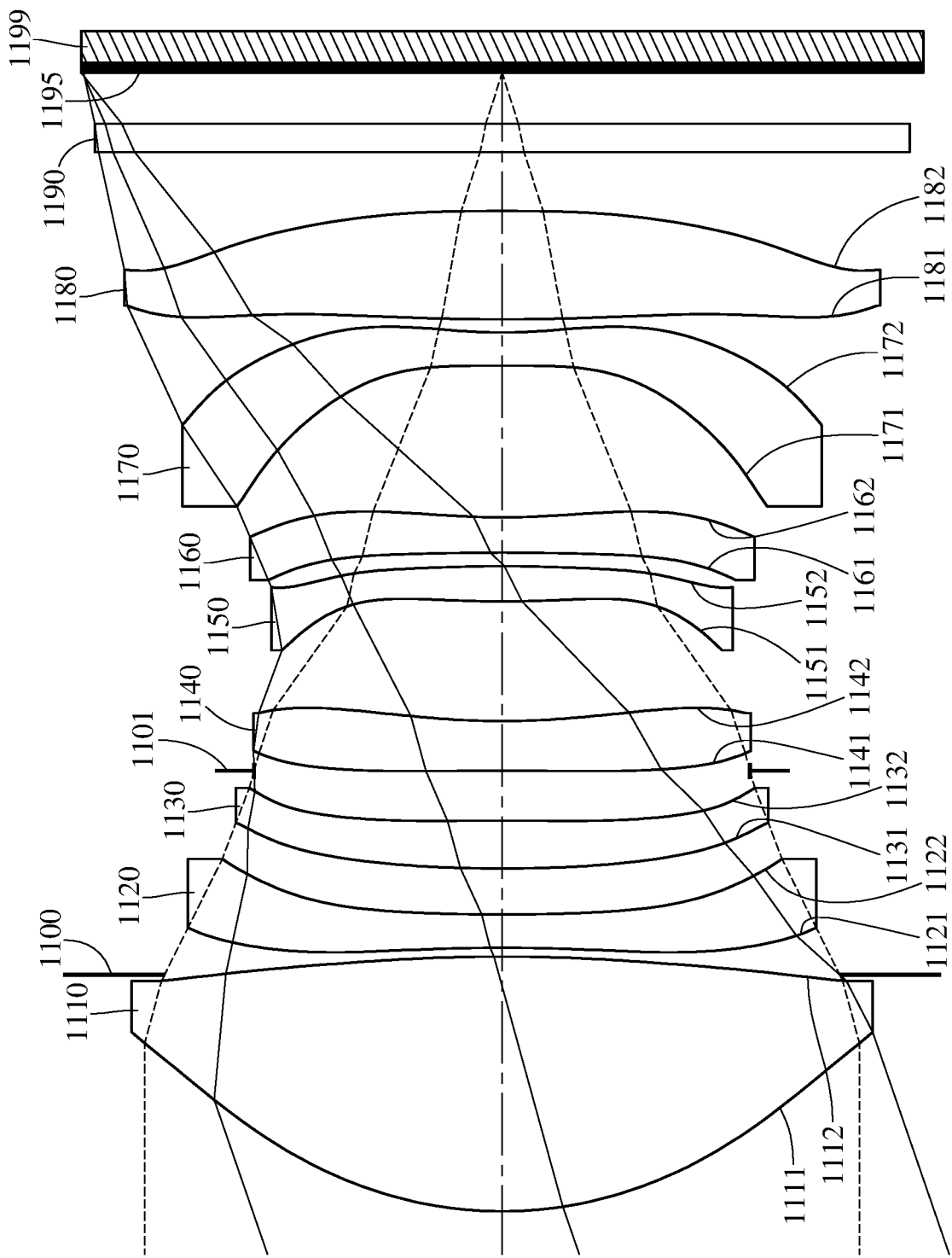
FIG. 21 is a schematic view of an image capturing unit according to the 11th embodiment of the present disclosure.
Figure 22:
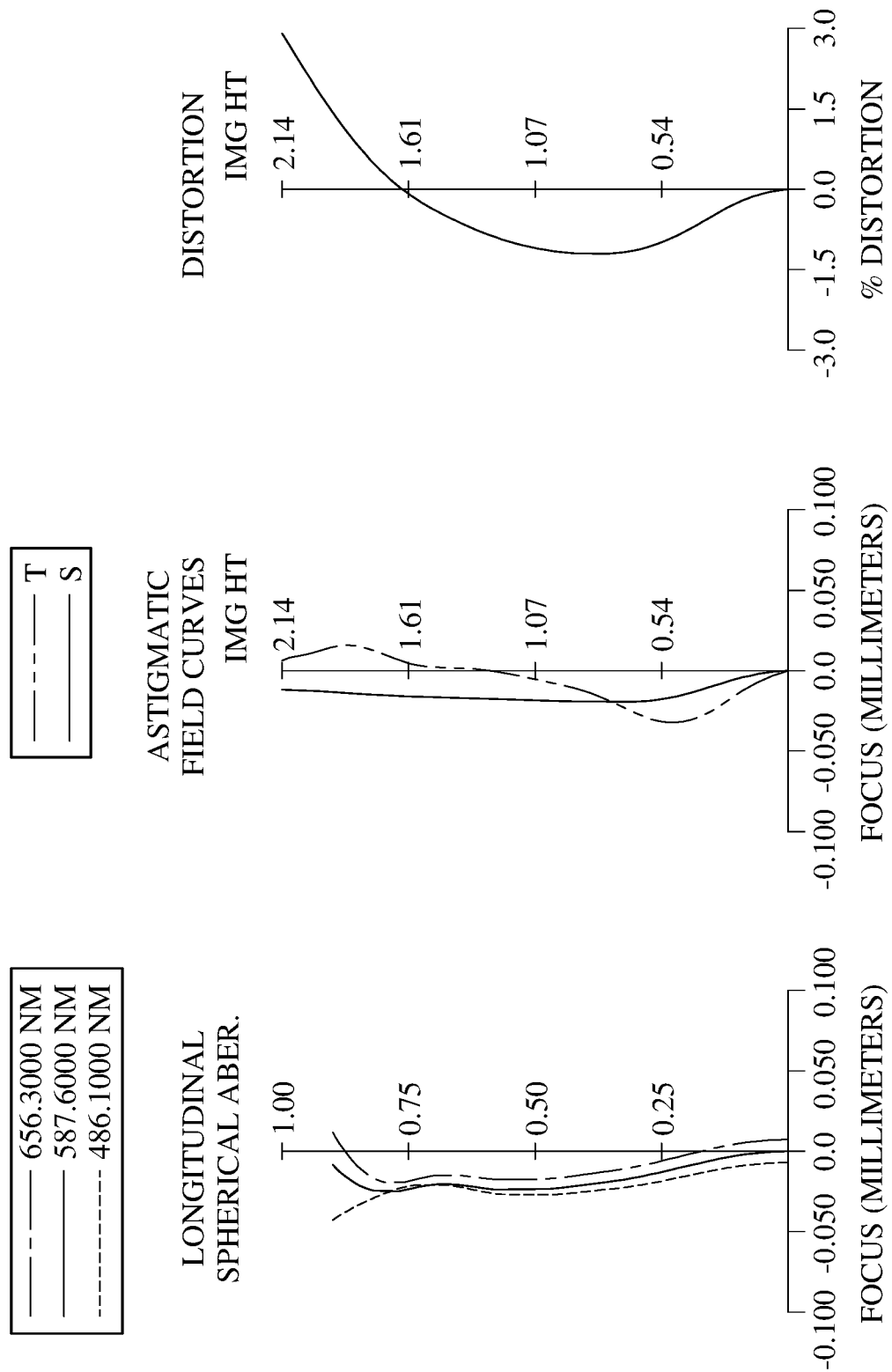
FIG. 22 shows spherical aberration curves, astigmatic field curves and a distortion curve of the image capturing unit according to the 11th embodiment.

FIG. 21 is a schematic view of an image capturing unit according to the 11th embodiment of the present disclosure. FIG. 22 shows, in order from left to right, spherical aberration curves, astigmatic field curves and a distortion curve of the image capturing unit according to the 11th embodiment. In FIG. 21, the image capturing unit includes the imaging lens system (its reference numeral is omitted) of the present disclosure and an image sensor 1199. The imaging lens system includes, in order from an object side to an image side, a first lens element 1110, an aperture stop 1100, a second lens element 1120, a third lens element 1130, a stop 1101, a fourth lens element 1140, a fifth lens element 1150, a sixth lens element 1160, a seventh lens element 1170, an eighth lens element 1180, a filter 1190 and an image surface 1195. The imaging lens system includes eight lens elements (1110, 1120, 1130, 1140, 1150, 1160, 1170 and 1180) with no additional lens element disposed between each of the adjacent eight lens elements.

The first lens element 1110 with positive refractive power has an object-side surface 1111 being convex in a paraxial region thereof and an image-side surface 1112 being convex in a paraxial region thereof. The first lens element 1110 is made of plastic material and has the object-side surface 1111 and the image-side surface 1112 being both aspheric. The object-side surface 1111 of the first lens element 1110 has two inflection points. The image-side surface 1112 of the first lens element 1110 has one inflection point.

The second lens element 1120 with negative refractive power has an object-side surface 1121 being concave in a paraxial region thereof and an image-side surface 1122 being concave in a paraxial region thereof. The second lens element 1120 is made of plastic material and has the object-side surface 1121 and the image-side surface 1122 being both aspheric. The object-side surface 1121 of the second lens element 1120 has one inflection point.

The third lens element 1130 with positive refractive power has an object-side surface 1131 being convex in a paraxial region thereof and an image-side surface 1132 being convex in a paraxial region thereof. The third lens element 1130 is made of plastic material and has the object-side surface 1131 and the image-side surface 1132 being both aspheric. The object-side surface 1131 of the third lens element 1130 has one inflection point. The image-side surface 1132 of the third lens element 1130 has two inflection points.

The fourth lens element 1140 with negative refractive power has an object-side surface 1141 being concave in a paraxial region thereof and an image-side surface 1142 being concave in a paraxial region thereof. The fourth lens element 1140 is made of plastic material and has the object-side surface 1141 and the image-side surface 1142 being both aspheric. The object-side surface 1141 of the fourth lens element 1140 has one inflection point. The image-side surface 1142 of the fourth lens element 1140 has one inflection point.

The fifth lens element 1150 with positive refractive power has an object-side surface 1151 being convex in a paraxial region thereof and an image-side surface 1152 being convex in a paraxial region thereof. The fifth lens element 1150 is made of plastic material and has the object-side surface 1151 and the image-side surface 1152 being both aspheric. The object-side surface 1151 of the fifth lens element 1150 has one inflection point. The image-side surface 1152 of the fifth lens element 1150 has one inflection point.

The sixth lens element 1160 with negative refractive power has an object-side surface 1161 being concave in a paraxial region thereof and an image-side surface 1162 being concave in a paraxial region thereof. The sixth lens element 1160 is made of plastic material and has the object-side surface 1161 and the image-side surface 1162 being both aspheric. The object-side surface 1161 of the sixth lens element 1160 has one inflection point. The image-side surface 1162 of the sixth lens element 1160 has two inflection points.

The seventh lens element 1170 with negative refractive power has an object-side surface 1171 being concave in a paraxial region thereof and an image-side surface 1172 being concave in a paraxial region thereof. The seventh lens element 1170 is made of plastic material and has the object-side surface 1171 and the image-side surface 1172 being both aspheric. The object-side surface 1171 of the seventh lens element 1170 has one inflection point. The image-side surface 1172 of the seventh lens element 1170 has two inflection points. The image-side surface 1172 of the seventh lens element 1170 has at least one critical point in an off-axis region thereof.

The eighth lens element 1180 with positive refractive power has an object-side surface 1181 being convex in a paraxial region thereof and an image-side surface 1182 being convex in a paraxial region thereof. The eighth lens element 1180 is made of plastic material and has the object-side surface 1181 and the image-side surface 1182 being both aspheric. The object-side surface 1181 of the eighth lens element 1180 has two inflection points. The image-side surface 1182 of the eighth lens element 1180 has one inflection point.

The filter 1190 is made of glass material and located between the eighth lens element 1180 and the image surface 1195, and will not affect the focal length of the imaging lens system. The image sensor 1199 is disposed on or near the image surface 1195 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V2/N2, wherein an abbe number of the second lens element 1120 is V2, and a refractive index of the second lens element 1120 is N2.

The detailed optical data of the 11th embodiment are shown in Table 21 and the aspheric surface data are shown in Table 22 below.

TABLE 21

11th Embodiment
f = 6.05 mm, Fno = 1.56, HFOV = 19.0 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 2.041 | (ASP) | 1.300 | Plastic | 1.545 | 56.0 | 3.21 |
| 2 | | −9.390 | (ASP) | −0.092 | | | | |
| 3 | Ape. Stop | Plano | | 0.137 | | | | |
| 4 | Lens 2 | −9.933 | (ASP) | 0.170 | Plastic | 1.669 | 19.5 | −7.46 |
| 5 | | 10.087 | (ASP) | 0.235 | | | | |
| 6 | Lens 3 | 7.810 | (ASP) | 0.244 | Plastic | 1.543 | 56.5 | 10.50 |
| 7 | | −20.922 | (ASP) | 0.255 | | | | |
| 8 | Stop | Plano | | 0.000 | | | | |
| 9 | Lens 4 | −23.137 | (ASP) | 0.253 | Plastic | 1.530 | 55.8 | −5.97 |
| 10 | | 3.682 | (ASP) | 0.611 | | | | |
| 11 | Lens 5 | 5.154 | (ASP) | 0.180 | Plastic | 1.584 | 28.2 | 5.03 |
| 12 | | −6.749 | (ASP) | 0.069 | | | | |
| 13 | Lens 6 | −13.738 | (ASP) | 0.180 | Plastic | 1.634 | 23.8 | −4.46 |
| 14 | | 3.575 | (ASP) | 0.774 | | | | |
| 15 | Lens 7 | −355.132 | (ASP) | 0.170 | Plastic | 1.534 | 55.9 | −4.73 |
| 16 | | 2.546 | (ASP) | 0.067 | | | | |
| 17 | Lens 8 | 11.545 | (ASP) | 0.553 | Plastic | 1.650 | 21.5 | 11.43 |
| 18 | | −20.482 | (ASP) | 0.300 | | | | |
| 19 | Filter | Plano | | 0.145 | Glass | 1.517 | 64.2 | — |
| 20 | | Plano | | 0.260 | | | | |
| 21 | Image | Plano | | — | | | | |

Note:
Reference wavelength is 587.6 nm (d-line).
An effective radius of the stop 1101 (Surface 8) is 1.265 mm.

TABLE 22

Aspheric Coefficients

| Surface # | 1 | 2 | 4 | 5 | 6 | 7 |
|---|---|---|---|---|---|---|
| k = | −6.3939E−01 | 2.1045E+01 | −9.0000E+01 | 4.1077E+01 | 2.6345E+01 | −2.2143E+01 |
| A4 = | 3.4326E−03 | −8.2005E−03 | −2.3078E−02 | −2.3231E−02 | 9.9879E−03 | 1.0848E−01 |
| A6 = | 3.6745E−03 | 3.8905E−02 | 9.3193E−02 | 1.0350E−01 | 2.0998E−02 | −6.4375E−02 |
| A8 = | −4.2343E−03 | −3.3080E−02 | −7.0499E−02 | −9.2155E−02 | −2.1418E−02 | 5.7529E−02 |
| A10 = | 2.4145E−03 | 1.3681E−02 | 2.8016E−02 | 5.8750E−02 | −8.6583E−03 | −8.8155E−02 |
| A12 = | −8.0969E−04 | −2.8282E−03 | −5.9948E−03 | −2.3192E−02 | 2.2703E−02 | 7.6999E−02 |
| A14 = | 9.6298E−05 | 2.4269E−04 | 5.7720E−04 | 3.7325E−03 | −7.7143E−03 | −2.1184E−02 |

TABLE 22-continued

Aspheric Coefficients

| Surface # | 9 | 10 | 11 | 12 | 13 | 14 |
|---|---|---|---|---|---|---|
| k = | −9.0000E+01 | −1.5896E+01 | −2.5589E+01 | 7.5808E+00 | 7.6794E+01 | −8.2800E+01 |
| A4 = | 5.2790E−02 | −5.2213E−02 | −1.1178E−01 | 1.4353E−01 | 4.1053E−02 | −1.4414E−02 |
| A6 = | 3.0264E−03 | 3.7691E−02 | −1.8788E−01 | −2.5331E−01 | −4.4534E−02 | −1.6864E−01 |
| A8 = | −3.3395E−02 | −3.4861E−02 | 5.7656E−02 | −8.3746E−02 | −1.4308E−01 | 2.0387E−01 |
| A10 = | 3.1214E−02 | 5.3918E−03 | 5.6074E−03 | 3.7276E−01 | 2.4471E−01 | −1.3827E−01 |
| A12 = | −7.3635E−03 | 1.3839E−03 | 2.8218E−02 | −2.5003E−01 | −1.6218E−01 | 4.9055E−02 |
| A14 = | — | — | −1.4163E−02 | 5.8622E−02 | 4.0037E−02 | −6.5344E−03 |

| Surface # | 15 | 16 | 17 | 18 |
|---|---|---|---|---|
| k = | −9.0000E+01 | 1.1562E+00 | 2.5391E+01 | −8.2360E+01 |
| A4 = | −5.0275E−01 | −4.2419E−01 | −1.8509E−02 | −1.4277E−01 |
| A6 = | 2.6023E−01 | 3.0687E−01 | 1.2189E−02 | 1.6314E−01 |
| A8 = | 9.1309E−02 | −2.3324E−01 | −2.6423E−02 | −1.0759E−01 |
| A10 = | −3.4470E−01 | 1.4395E−01 | 1.8001E−02 | 3.8397E−02 |
| A12 = | 3.4740E−01 | −5.5715E−02 | −5.5858E−03 | −7.5337E−03 |
| A14 = | −1.7004E−01 | 1.0895E−02 | 8.7325E−04 | 8.3110E−04 |
| A16 = | 3.2302E−02 | −8.1838E−04 | −5.6634E−05 | −4.4225E−05 |

In the 11th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 11th embodiment, so an explanation in this regard will not be provided again.

Moreover, these parameters can be calculated from Table 21 and Table 22 as the following values and satisfy the following conditions:

| 11th Embodiment | | | |
|---|---|---|---|
| f [mm] | 6.05 | EPD/BL | 5.50 |
| Fno | 1.56 | f/EPD | 1.56 |
| HFOV [deg.] | 19.0 | (Y11 − ImgH)/EPD | −0.05 |
| V8 | 21.5 | f × tan(HFOV)/EPD | 0.54 |
| Vmin | 19.5 | (|Y11 − Y82| + BL)/f | 0.12 |
| ΣVi | 317.2 | (Y82 − Y51)/(Y11 − Y51) | 0.96 |
| Nmax | 1.669 | (|Y11 − Y82| + |Y82 − ImgH|)/f | 0.04 |
| (Vi/Ni)min | 11.66 | f/ImgH | 2.83 |
| ΣCT/ΣAT | 1.48 | Yc72/f | 0.10 |
| R1/CT1 | 1.57 | |f/R1| + |f/R2| | 3.61 |
| BL/CT1 | 0.54 | |f/R3| + |f/R4| | 1.21 |
| R8/f | 0.61 | |f/R5| + |f/R6| | 1.06 |
| (R11 + R12)/(R11 − R12) | 0.59 | |f/R7| + |f/R8| | 1.91 |
|  |  | |f/R9| + |f/R10| | 2.07 |
| (R13 − R14)/(R13 + R14) | 1.01 | |f/R11| + |f/R12| | 2.13 |
|  |  | |f/R13| + |f/R14| | 2.40 |
| f/f1 | 1.89 | |f/R15| + |f/R16| | 0.82 |
| f/f5 | 1.20 | V1/N1 | 36.27 |
| f5/f7 | −1.06 | V2/N2 | 11.66 |
| f8/f5 | 2.27 | V3/N3 | 36.60 |
| f/f5 + f/f6 | −0.15 | V4/N4 | 36.45 |
| ImgH [mm] | 2.14 | V5/N5 | 17.80 |
| TL [mm] | 5.81 | V6/N6 | 14.59 |
| TL/f | 0.96 | V7/N7 | 36.46 |
| TL/EPD | 1.50 | V8/N8 | 13.01 |
| SL/TL | 0.79 | — | — |
| BL/TD | 0.14 |  |  |
| EPD/ImgH | 1.81 |  |  |

12th Embodiment

Figure 23:
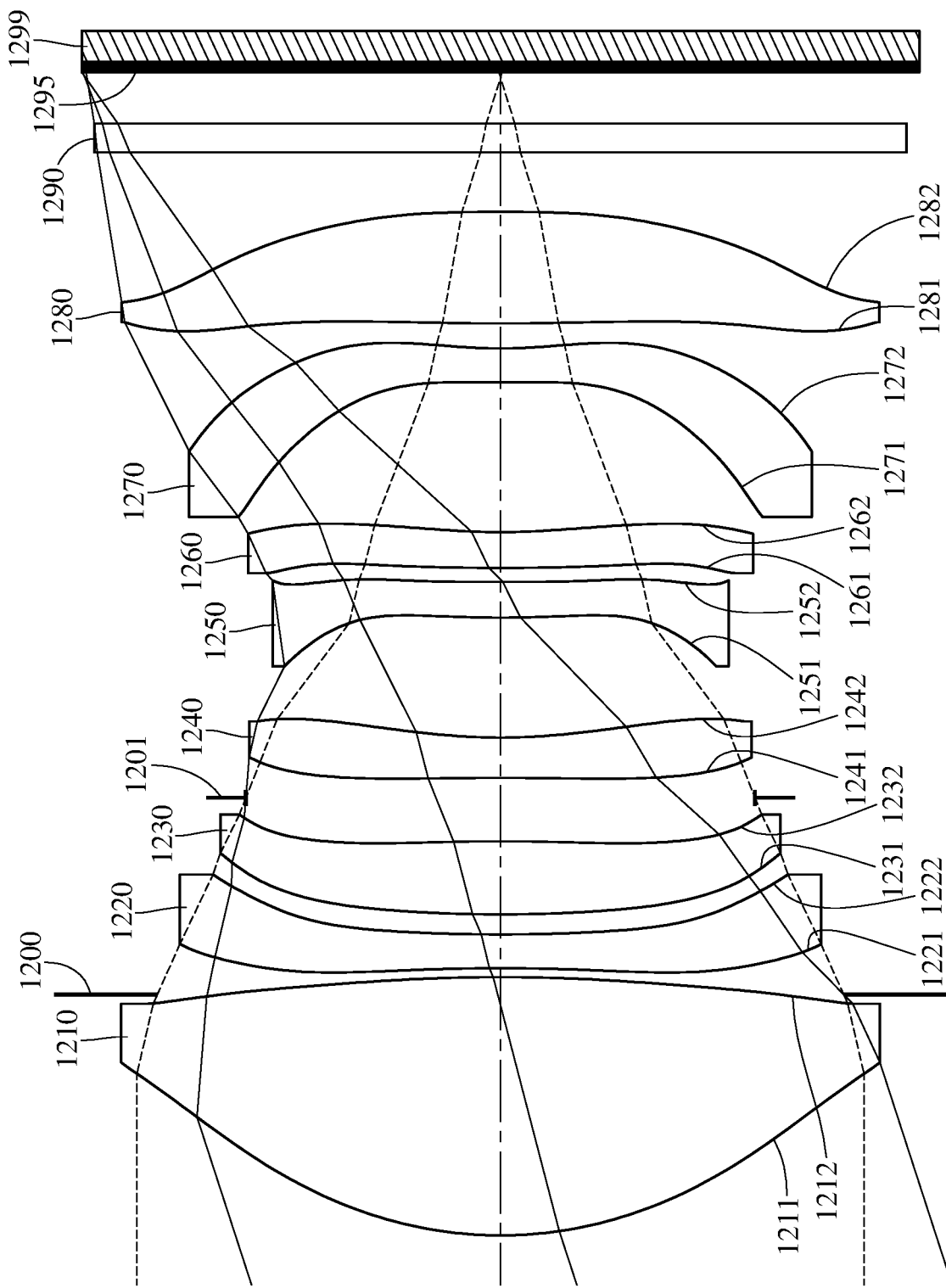
FIG. 23 is a schematic view of an image capturing unit according to the 12th embodiment of the present disclosure.
Figure 24:
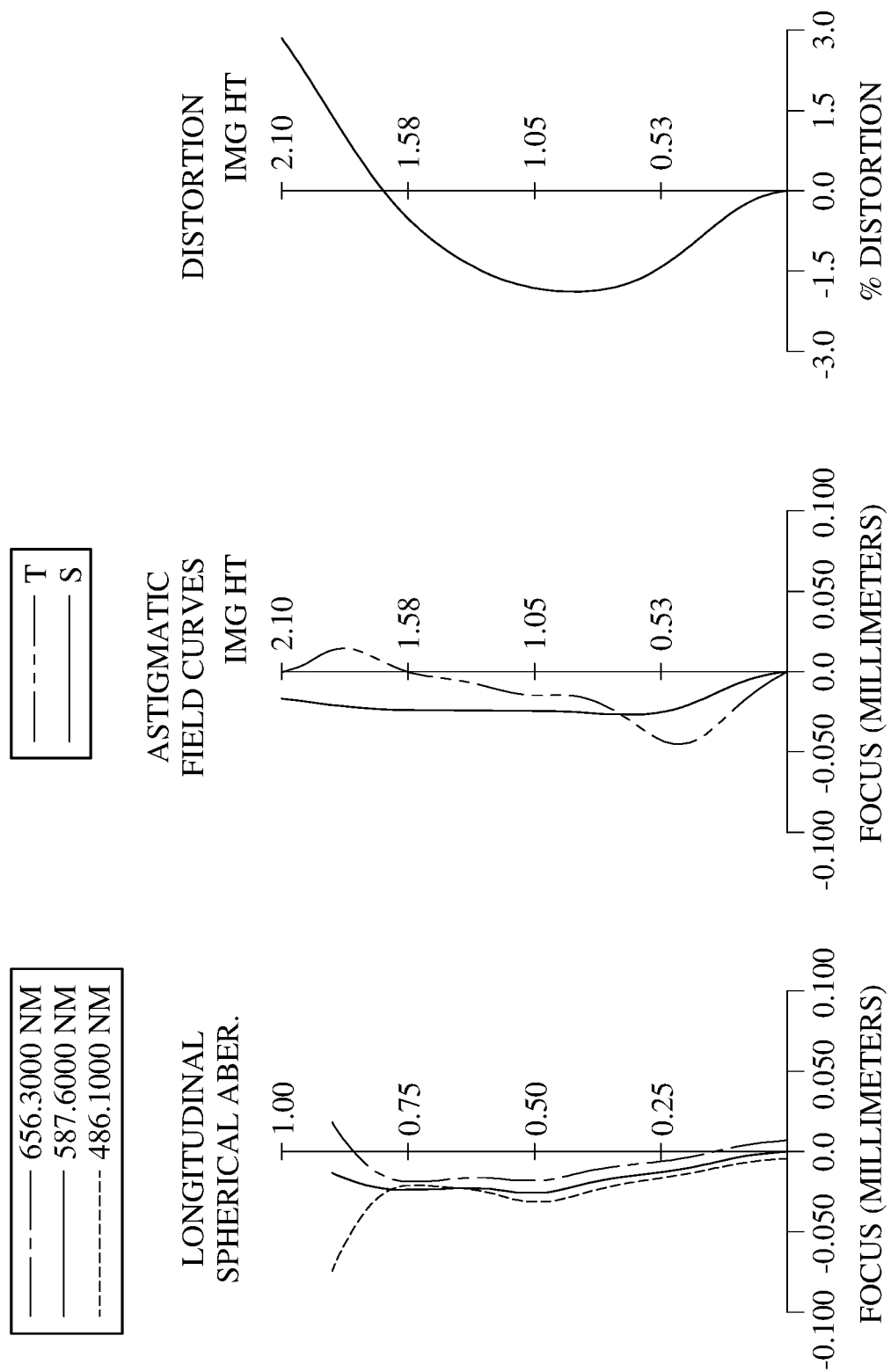
FIG. 24 shows spherical aberration curves, astigmatic field curves and a distortion curve of the image capturing unit according to the 12th embodiment.

FIG. 23 is a schematic view of an image capturing unit according to the 12th embodiment of the present disclosure. FIG. 24 shows, in order from left to right, spherical aberration curves, astigmatic field curves and a distortion curve of the image capturing unit according to the 12th embodiment. In FIG. 23, the image capturing unit includes the imaging lens system (its reference numeral is omitted) of the present disclosure and an image sensor 1299. The imaging lens system includes, in order from an object side to an image side, a first lens element 1210, an aperture stop 1200, a second lens element 1220, a third lens element 1230, a stop 1201, a fourth lens element 1240, a fifth lens element 1250, a sixth lens element 1260, a seventh lens element 1270, an eighth lens element 1280, a filter 1290 and an image surface 1295. The imaging lens system includes eight lens elements (1210, 1220, 1230, 1240, 1250, 1260, 1270 and 1280) with no additional lens element disposed between each of the adjacent eight lens elements.

The first lens element 1210 with positive refractive power has an object-side surface 1211 being convex in a paraxial region thereof and an image-side surface 1212 being convex in a paraxial region thereof. The first lens element 1210 is made of plastic material and has the object-side surface 1211 and the image-side surface 1212 being both aspheric. The object-side surface 1211 of the first lens element 1210 has two inflection points. The image-side surface 1212 of the first lens element 1210 has one inflection point.

The second lens element 1220 with negative refractive power has an object-side surface 1221 being concave in a paraxial region thereof and an image-side surface 1222 being concave in a paraxial region thereof. The second lens element 1220 is made of plastic material and has the object-side surface 1221 and the image-side surface 1222 being both aspheric. The object-side surface 1221 of the second lens element 1220 has one inflection point.

The third lens element 1230 with positive refractive power has an object-side surface 1231 being convex in a paraxial region thereof and an image-side surface 1232 being convex in a paraxial region thereof. The third lens element 1230 is made of plastic material and has the object-side surface 1231 and the image-side surface 1232 being both aspheric. The object-side surface 1231 of the third lens element 1230 has one inflection point. The image-side surface 1232 of the third lens element 1230 has one inflection point.

The fourth lens element 1240 with negative refractive power has an object-side surface 1241 being concave in a paraxial region thereof and an image-side surface 1242 being concave in a paraxial region thereof. The fourth lens element 1240 is made of plastic material and has the object-side surface 1241 and the image-side surface 1242 being both aspheric. The object-side surface 1241 of the fourth lens element 1240 has one inflection point. The image-side surface 1242 of the fourth lens element 1240 has one inflection point.

The fifth lens element 1250 with positive refractive power has an object-side surface 1251 being convex in a paraxial region thereof and an image-side surface 1252 being concave in a paraxial region thereof. The fifth lens element 1250 is made of plastic material and has the object-side surface 1251 and the image-side surface 1252 being both aspheric. The object-side surface 1251 of the fifth lens element 1250 has one inflection point. The image-side surface 1252 of the fifth lens element 1250 has two inflection points.

The sixth lens element 1260 with negative refractive power has an object-side surface 1261 being convex in a paraxial region thereof and an image-side surface 1262 being concave in a paraxial region thereof. The sixth lens element 1260 is made of plastic material and has the object-side surface 1261 and the image-side surface 1262 being both aspheric. The object-side surface 1261 of the sixth lens element 1260 has two inflection points. The image-side surface 1262 of the sixth lens element 1260 has one inflection point.

The seventh lens element 1270 with negative refractive power has an object-side surface 1271 being convex in a paraxial region thereof and an image-side surface 1272 being concave in a paraxial region thereof. The seventh lens element 1270 is made of plastic material and has the object-side surface 1271 and the image-side surface 1272 being both aspheric. The object-side surface 1271 of the seventh lens element 1270 has two inflection points. The image-side surface 1272 of the seventh lens element 1270 has two inflection points. The image-side surface 1272 of the seventh lens element 1270 has at least one critical point in an off-axis region thereof.

The eighth lens element 1280 with positive refractive power has an object-side surface 1281 being convex in a paraxial region thereof and an image-side surface 1282 being convex in a paraxial region thereof. The eighth lens element 1280 is made of plastic material and has the object-side surface 1281 and the image-side surface 1282 being both aspheric. The object-side surface 1281 of the eighth lens element 1280 has two inflection points. The image-side surface 1282 of the eighth lens element 1280 has two inflection points.

The filter 1290 is made of glass material and located between the eighth lens element 1280 and the image surface 1295, and will not affect the focal length of the imaging lens system. The image sensor 1299 is disposed on or near the image surface 1295 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V2/N2, wherein an abbe number of the second lens element 1220 is V2, and a refractive index of the second lens element 1220 is N2.

The detailed optical data of the 12th embodiment are shown in Table 23 and the aspheric surface data are shown in Table 24 below.

TABLE 23

12th Embodiment
f = 6.30 mm, Fno = 1.57, HFOV = 18.0 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 2.045 | (ASP) | 1.300 | Plastic | 1.545 | 56.0 | 3.21 |
| 2 | | −9.352 | (ASP) | −0.088 | | | | |
| 3 | Ape. Stop | Plano | | 0.133 | | | | |
| 4 | Lens 2 | −10.115 | (ASP) | 0.170 | Plastic | 1.669 | 19.5 | −7.21 |
| 5 | | 9.282 | (ASP) | 0.101 | | | | |
| 6 | Lens 3 | 7.434 | (ASP) | 0.368 | Plastic | 1.543 | 56.5 | 7.54 |
| 7 | | −8.957 | (ASP) | 0.219 | | | | |
| 8 | Stop | Plano | | 0.100 | | | | |
| 9 | Lens 4 | −19.874 | (ASP) | 0.203 | Plastic | 1.530 | 55.8 | −4.79 |
| 10 | | 2.925 | (ASP) | 0.604 | | | | |
| 11 | Lens 5 | 5.865 | (ASP) | 0.180 | Plastic | 1.584 | 28.2 | 10.34 |
| 12 | | 197.222 | (ASP) | 0.070 | | | | |
| 13 | Lens 6 | 11.135 | (ASP) | 0.180 | Plastic | 1.639 | 23.5 | −6.37 |
| 14 | | 2.962 | (ASP) | 0.755 | | | | |
| 15 | Lens 7 | 17.679 | (ASP) | 0.170 | Plastic | 1.534 | 55.9 | −5.14 |
| 16 | | 2.367 | (ASP) | 0.126 | | | | |
| 17 | Lens 8 | 11.718 | (ASP) | 0.562 | Plastic | 1.650 | 21.5 | 9.80 |
| 18 | | −13.705 | (ASP) | 0.300 | | | | |
| 19 | Filter | Plano | | 0.145 | Glass | 1.517 | 64.2 | — |
| 20 | | Plano | | 0.258 | | | | |
| 21 | Image | Plano | | — | | | | |

Note:
Reference wavelength is 587.6 nm (d-line).
An effective radius of the stop 1201 (Surface 8) is 1.280 mm.

TABLE 24

Aspheric Coefficients

| Surface # | 1 | 2 | 4 | 5 | 6 | 7 |
|---|---|---|---|---|---|---|
| k = | −7.2960E−01 | 2.0042E+01 | −8.9998E+01 | 3.3917E+01 | 2.3030E+01 | −1.2027E+01 |
| A4 = | 4.2131E−03 | −8.0505E−03 | −6.4992E−03 | −9.5777E−04 | 9.8111E−03 | 9.0978E−02 |
| A6 = | 9.8921E−04 | 3.8124E−02 | 4.4375E−02 | −1.8482E−02 | −8.7019E−02 | −8.4469E−02 |
| A8 = | −1.1799E−03 | −3.1473E−02 | −1.0248E−02 | 9.5767E−02 | 2.2144E−01 | 1.7437E−01 |
| A10 = | 4.6977E−04 | 1.2432E−02 | −5.4784E−03 | −6.7034E−02 | −2.0648E−01 | −2.0510E−01 |
| A12 = | −2.9933E−04 | −2.4747E−03 | 2.6123E−03 | 1.5874E−02 | 9.0424E−02 | 1.1584E−01 |
| A14 = | 4.9687E−05 | 2.0808E−04 | −2.6269E−04 | −9.4331E−04 | −1.5235E−02 | −2.3646E−02 |

| Surface # | 9 | 10 | 11 | 12 | 13 | 14 |
|---|---|---|---|---|---|---|
| k = | −7.8475E+01 | −1.4772E+01 | −4.1217E+01 | −8.3815E+01 | −8.9975E+01 | −8.2800E+01 |
| A4 = | 2.7303E−02 | −4.7118E−02 | −5.9512E−02 | 2.0184E−01 | −8.9618E−02 | −2.8612E−02 |
| A6 = | 6.7571E−02 | 5.1557E−02 | −3.0712E−01 | −2.3946E−01 | 4.9576E−01 | −1.1070E−01 |
| A8 = | −9.4708E−02 | −7.2384E−02 | −2.2661E−01 | −5.9978E−01 | −1.0636E+00 | 3.0515E−01 |
| A10 = | 6.0013E−02 | 3.8975E−02 | 8.5899E−01 | 1.2892E+00 | 1.0479E+00 | −3.6683E−01 |
| A12 = | −1.2726E−02 | −8.4857E−03 | −6.8394E−01 | −8.9050E−01 | −5.4003E−01 | 1.9818E−01 |
| A14 = | — | — | 1.8330E−01 | 2.2466E−01 | 1.1892E−01 | −3.9744E−02 |

| Surface # | 15 | 16 | 17 | 18 |
|---|---|---|---|---|
| k = | 4.4914E+01 | 1.0265E+00 | 2.5391E+01 | −8.2360E+01 |
| A4 = | −5.1902E−01 | −4.9670E−01 | −8.1576E−02 | −1.7771E−01 |
| A6 = | 1.7449E−01 | 3.4730E−01 | 1.0867E−01 | 1.7737E−01 |
| A8 = | 2.4379E−01 | −2.3304E−01 | −1.1261E−01 | −1.0509E−01 |
| A10 = | −4.8573E−01 | 1.2486E−01 | 6.2218E−02 | 3.0738E−02 |
| A12 = | 4.5099E−01 | −4.3112E−02 | −1.8244E−02 | −3.5083E−03 |
| A14 = | −2.2645E−01 | 7.2301E−03 | 2.7700E−03 | −2.9503E−05 |
| A16 = | 4.5830E−02 | −4.2224E−04 | −1.7382E−04 | 2.1497E−05 |

In the 12th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 12th embodiment, so an explanation in this regard will not be provided again.

Moreover, these parameters can be calculated from Table 23 and Table 24 as the following values and satisfy the following conditions:

| 12th Embodiment | | | |
|---|---|---|---|
| f [mm] | 6.30 | EPD/BL | 5.70 |
| Fno | 1.57 | f/EPD | 1.57 |
| HFOV [deg.] | 18.0 | (Y11 − ImgH)/EPD | −0.02 |
| V8 | 21.5 | f × tan(HFOV)/EPD | 0.51 |
| Vmin | 19.5 | (|Y11 − Y82| + BL)/f | 0.13 |
| ΣVi | 316.8 | (Y82 − Y51)/(Y11 − Y51) | 0.89 |
| Nmax | 1.669 | (|Y11 − Y82| + |Y82 − ImgH|)/f | 0.05 |
| (Vi/Ni)min | 11.66 | f/ImgH | 3.00 |
| ΣCT/ΣAT | 1.55 | Yc72/f | 0.09 |
| R1/CT1 | 1.57 | |f/R1| + |f/R2| | 3.75 |
| BL/CT1 | 0.54 | |f/R3| + |f/R4| | 1.30 |
| R8/f | 0.46 | |f/R5| + |f/R6| | 1.55 |
| (R11 + R12)/ | 1.72 | |f/R7| + |f/R8| | 2.47 |
| (R11 − R12) | | |f/R9| + |f/R10| | 1.11 |
| (R13 − R14)/ | 0.76 | |f/R11| + |f/R12| | 2.69 |
| (R13 + R14) | | |f/R13| + |f/R14| | 3.02 |
| f/f1 | 1.96 | |f/R15| + |f/R16| | 1.00 |
| f/f5 | 0.61 | V1/N1 | 36.27 |
| f5/f7 | −2.01 | V2/N2 | 11.66 |
| f8/f5 | 0.95 | V3/N3 | 36.60 |
| f/f5 + f/f6 | −0.38 | V4/N4 | 36.45 |
| ImgH [mm] | 2.10 | V5/N5 | 17.80 |

| 12th Embodiment | | | |
|---|---|---|---|
| TL [mm] | 5.86 | V6/N6 | 14.34 |
| TL/f | 0.93 | V7/N7 | 36.46 |
| TL/EPD | 1.46 | V8/N8 | 13.01 |
| SL/TL | 0.79 | — | |
| BL/TD | 0.14 | | |
| EPD/ImgH | 1.91 | | |

13th Embodiment

Figure 25:
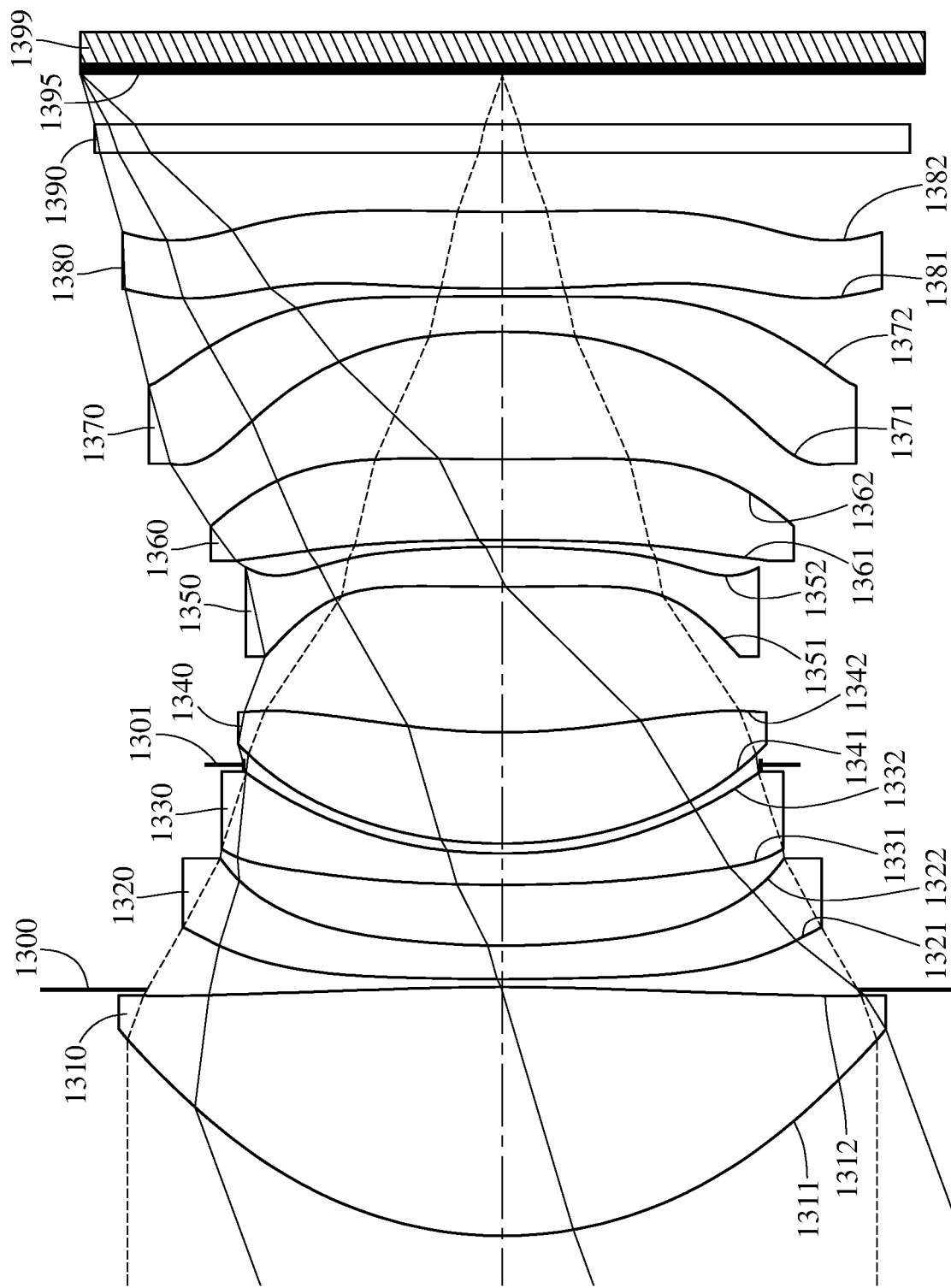
FIG. 25 is a schematic view of an image capturing unit according to the 13th embodiment of the present disclosure.
Figure 26:
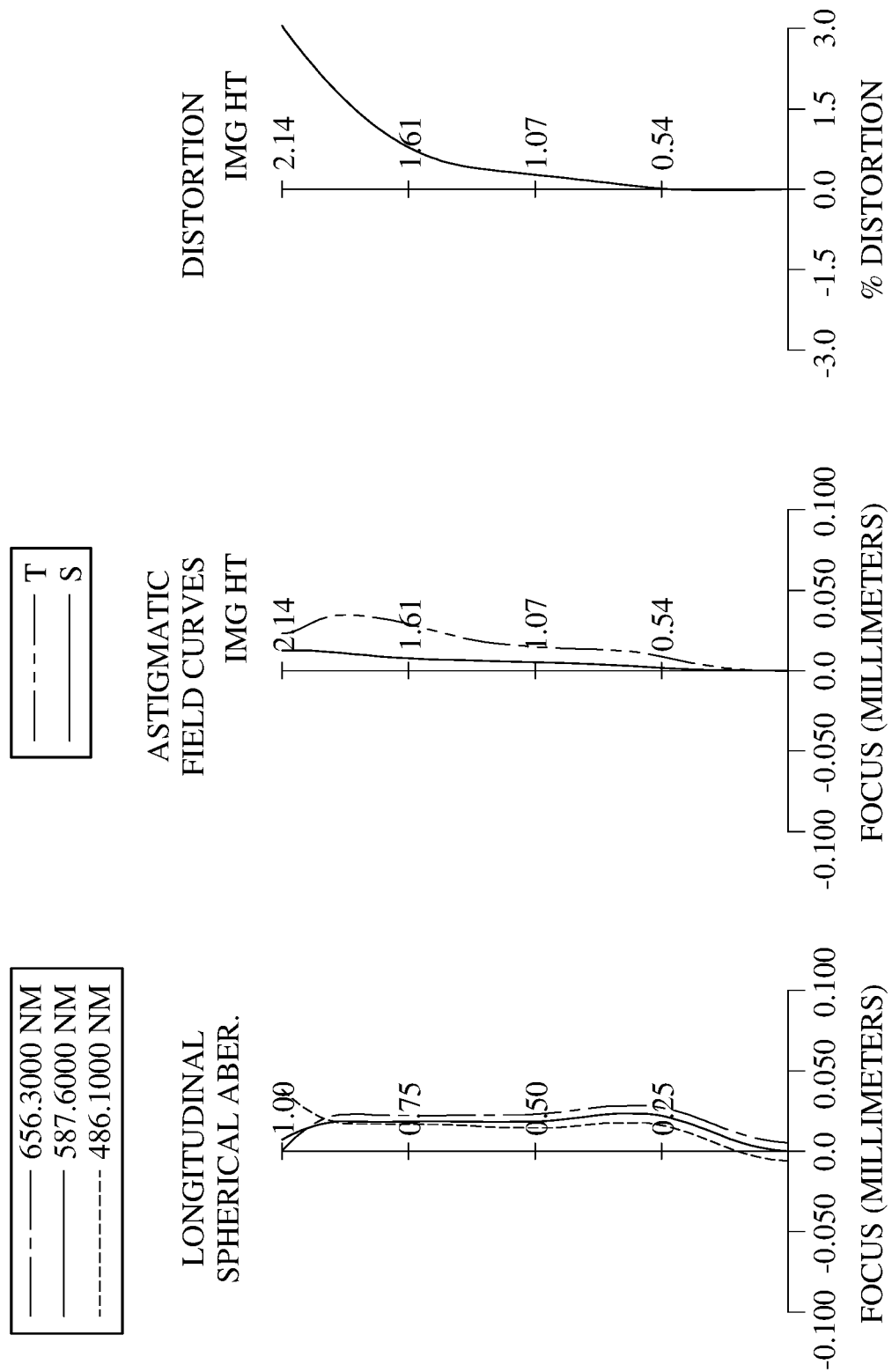
FIG. 26 shows spherical aberration curves, astigmatic field curves and a distortion curve of the image capturing unit according to the 13th embodiment.

FIG. 25 is a schematic view of an image capturing unit according to the 13th embodiment of the present disclosure. FIG. 26 shows, in order from left to right, spherical aberration curves, astigmatic field curves and a distortion curve of the image capturing unit according to the 13th embodiment. In FIG. 25, the image capturing unit includes the imaging lens system (its reference numeral is omitted) of the present disclosure and an image sensor 1399. The imaging lens system includes, in order from an object side to an image side, a first lens element 1310, an aperture stop 1300, a second lens element 1320, a third lens element 1330, a stop 1301, a fourth lens element 1340, a fifth lens element 1350, a sixth lens element 1360, a seventh lens element 1370, an eighth lens element 1380, a filter 1390 and an image surface 1395. The imaging lens system includes eight lens elements (1310, 1320, 1330, 1340, 1350, 1360, 1370 and 1380) with no additional lens element disposed between each of the adjacent eight lens elements.

The first lens element 1310 with positive refractive power has an object-side surface 1311 being convex in a paraxial region thereof and an image-side surface 1312 being convex in a paraxial region thereof. The first lens element 1310 is made of plastic material and has the object-side surface 1311 and the image-side surface 1312 being both aspheric. The image-side surface 1312 of the first lens element 1310 has one inflection point.

The second lens element 1320 with negative refractive power has an object-side surface 1321 being convex in a paraxial region thereof and an image-side surface 1322 being concave in a paraxial region thereof. The second lens element 1320 is made of plastic material and has the object-side surface 1321 and the image-side surface 1322 being both aspheric. The object-side surface 1321 of the second lens element 1320 has one inflection point.

The third lens element 1330 with negative refractive power has an object-side surface 1331 being convex in a paraxial region thereof and an image-side surface 1332 being concave in a paraxial region thereof. The third lens element 1330 is made of plastic material and has the object-side surface 1331 and the image-side surface 1332 being both aspheric. The image-side surface 1332 of the third lens element 1330 has one inflection point.

The fourth lens element 1340 with positive refractive power has an object-side surface 1341 being convex in a paraxial region thereof and an image-side surface 1342 being concave in a paraxial region thereof. The fourth lens element 1340 is made of plastic material and has the object-side surface 1341 and the image-side surface 1342 being both aspheric. The image-side surface 1342 of the fourth lens element 1340 has one inflection point.

The fifth lens element 1350 with positive refractive power has an object-side surface 1351 being convex in a paraxial region thereof and an image-side surface 1352 being convex in a paraxial region thereof. The fifth lens element 1350 is made of plastic material and has the object-side surface 1351 and the image-side surface 1352 being both aspheric. The object-side surface 1351 of the fifth lens element 1350 has one inflection point. The image-side surface 1352 of the fifth lens element 1350 has one inflection point.

The sixth lens element 1360 with negative refractive power has an object-side surface 1361 being concave in a paraxial region thereof and an image-side surface 1362 being concave in a paraxial region thereof. The sixth lens element 1360 is made of plastic material and has the object-side surface 1361 and the image-side surface 1362 being both aspheric. The object-side surface 1361 of the sixth lens element 1360 has two inflection points. The image-side surface 1362 of the sixth lens element 1360 has one inflection point.

The seventh lens element 1370 with negative refractive power has an object-side surface 1371 being concave in a paraxial region thereof and an image-side surface 1372 being convex in a paraxial region thereof. The seventh lens element 1370 is made of plastic material and has the object-side surface 1371 and the image-side surface 1372 being both aspheric. The object-side surface 1371 of the seventh lens element 1370 has one inflection point. The image-side surface 1372 of the seventh lens element 1370 has three inflection points.

The eighth lens element 1380 with negative refractive power has an object-side surface 1381 being convex in a paraxial region thereof and an image-side surface 1382 being concave in a paraxial region thereof. The eighth lens element 1380 is made of plastic material and has the object-side surface 1381 and the image-side surface 1382 being both aspheric. The object-side surface 1381 of the eighth lens element 1380 has two inflection points. The image-side surface 1382 of the eighth lens element 1380 has two inflection points.

The filter 1390 is made of glass material and located between the eighth lens element 1380 and the image surface 1395, and will not affect the focal length of the imaging lens system. The image sensor 1399 is disposed on or near the image surface 1395 of the imaging lens system.

In this embodiment, an Abbe number of the i-th lens element is Vi, a refractive index of the i-th lens element is Ni, a minimum value of Vi/Ni is (Vi/Ni)min, and (Vi/Ni)min is equal to V8/N8, wherein an abbe number of the eighth lens element 1380 is V8, and a refractive index of the eighth lens element 1380 is N8.

The detailed optical data of the 13th embodiment are shown in Table 25 and the aspheric surface data are shown in Table 26 below.

TABLE 25

13th Embodiment
f = 5.63 mm, Fno = 1.48, HFOV = 20.2 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 2.066 | (ASP) | 1.264 | Plastic | 1.545 | 56.0 | 3.37 |
| 2 | | −12.844 | (ASP) | −0.013 | | | | |
| 3 | Ape. Stop | Plano | | 0.053 | | | | |
| 4 | Lens 2 | 11.975 | (ASP) | 0.170 | Plastic | 1.650 | 21.5 | −8.98 |
| 5 | | 3.904 | (ASP) | 0.309 | | | | |
| 6 | Lens 3 | 8.996 | (ASP) | 0.160 | Plastic | 1.582 | 30.2 | −7.25 |
| 7 | | 2.856 | (ASP) | 0.450 | | | | |
| 8 | Stop | Plano | | −0.400 | | | | |
| 9 | Lens 4 | 2.402 | (ASP) | 0.565 | Plastic | 1.530 | 55.8 | 13.52 |
| 10 | | 3.317 | (ASP) | 0.739 | | | | |
| 11 | Lens 5 | 14.137 | (ASP) | 0.203 | Plastic | 1.584 | 28.2 | 7.13 |
| 12 | | −5.873 | (ASP) | 0.035 | | | | |
| 13 | Lens 6 | −14.090 | (ASP) | 0.409 | Plastic | 1.614 | 26.0 | −9.62 |
| 14 | | 10.269 | (ASP) | 0.648 | | | | |
| 15 | Lens 7 | −3.258 | (ASP) | 0.180 | Plastic | 1.534 | 55.9 | −7.41 |
| 16 | | −18.793 | (ASP) | 0.040 | | | | |
| 17 | Lens 8 | 12.127 | (ASP) | 0.389 | Plastic | 1.669 | 19.5 | −84.72 |
| 18 | | 9.861 | (ASP) | 0.300 | | | | |

TABLE 25-continued

13th Embodiment
f = 5.63 mm, Fno = 1.48, HFOV = 20.2 deg.

| Surface # | | Curvature Radius | Thickness | Material | Index | Abbe # | Focal Length |
|---|---|---|---|---|---|---|---|
| 19 | Filter | Plano | 0.145 | Glass | 1.517 | 64.2 | — |
| 20 | | Plano | 0.257 | | | | |
| 21 | Image | Plano | — | | | | |

Note:
Reference wavelength is 587.6 nm (d-line).
An effective radius of the stop 1301 (Surface 8) is 1.311 mm.

TABLE 26

Aspheric Coefficients

| Surface # | 1 | 2 | 4 | 5 | 6 | 7 |
|---|---|---|---|---|---|---|
| k = | −5.3196E−01 | 4.1035E+01 | 4.8091E+01 | −1.5333E+01 | −1.6409E+01 | −6.2126E+00 |
| A4 = | 3.1358E−03 | 1.7459E−02 | −7.1320E−02 | −7.6403E−02 | 4.8029E−04 | 1.4696E−01 |
| A6 = | 3.5379E−03 | 2.9914E−03 | 1.3716E−01 | 1.8245E−01 | 7.8521E−02 | −7.5349E−02 |
| A8 = | −3.6714E−03 | −7.8525E−03 | −9.5564E−02 | −1.0486E−01 | −1.2843E−01 | −4.6673E−02 |
| A10 = | 1.9702E−03 | 4.2343E−03 | 3.3222E−02 | 1.9384E−02 | 8.5984E−02 | 7.8585E−02 |
| A12 = | −5.8353E−04 | −9.8604E−04 | −4.5860E−03 | 5.0736E−03 | −2.6528E−02 | −3.1847E−02 |
| A14 = | 6.4154E−05 | 9.1477E−05 | 5.3819E−06 | −1.4840E−03 | 3.4764E−03 | 3.8198E−03 |

| Surface # | 9 | 10 | 11 | 12 | 13 | 14 |
|---|---|---|---|---|---|---|
| k = | 5.5612E−01 | −2.2694E+00 | −3.8660E+00 | 1.1748E+01 | 5.9898E+01 | −8.2800E+01 |
| A4 = | 4.8286E−02 | −5.1856E−02 | −7.8773E−02 | 4.8491E−02 | −3.4647E−02 | −1.2983E−01 |
| A6 = | −8.1591E−02 | −5.5715E−03 | −3.8407E−02 | −6.8719E−02 | 1.5665E−02 | 6.9287E−02 |
| A8 = | 7.0165E−02 | 2.6842E−02 | −2.9826E−01 | −1.9097E−01 | 3.0222E−02 | −4.2653E−02 |
| A10 = | −2.1655E−02 | −2.1859E−02 | 3.3801E−01 | 2.7884E−01 | −6.0168E−02 | 1.5587E−03 |
| A12 = | 1.8103E−03 | 5.0126E−03 | −1.2889E−01 | −1.0422E−01 | 3.9326E−02 | 6.9947E−03 |
| A14 = | — | — | 1.6785E−02 | 1.0352E−02 | −8.5761E−03 | −1.6368E−03 |

| Surface # | 15 | 16 | 17 | 18 |
|---|---|---|---|---|
| k = | −2.8287E+01 | 1.7904E+01 | 3.5002E+01 | −8.2360E+01 |
| A4 = | −1.7535E−01 | 1.5339E−01 | 6.7850E−02 | −1.0542E−01 |
| A6 = | −6.6445E−02 | −4.4875E−01 | −1.5383E−01 | 1.1855E−01 |
| A8 = | 2.8817E−01 | 4.7524E−01 | 7.6537E−02 | −1.1744E−01 |
| A10 = | −2.9961E−01 | −2.8583E−01 | −1.1987E−02 | 6.1765E−02 |
| A12 = | 1.4584E−01 | 9.9748E−02 | −1.1173E−03 | −1.6539E−02 |
| A14 = | −3.3394E−02 | −1.8732E−02 | 5.3377E−04 | 2.2172E−03 |
| A16 = | 2.9151E−03 | 1.4646E−03 | −4.5657E−05 | −1.2023E−04 |

In the 13th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 13th embodiment, so an explanation in this regard will not be provided again.

Moreover, these parameters can be calculated from Table 25 and Table 26 as the following values and satisfy the following conditions:

13th Embodiment

| | | | |
|---|---|---|---|
| f [mm] | 5.63 | EPD/BL | 5.41 |
| Fno | 1.48 | f/EPD | 1.48 |
| HFOV [deg.] | 20.2 | (Y11 − ImgH)/EPD | −0.05 |
| V8 | 19.5 | f × tan(HFOV)/EPD | 0.54 |
| Vmin | 19.5 | (|Y11 − Y82| + BL)/f | 0.13 |
| ΣVi | 293.1 | (Y82 − Y51)/(Y11 − Y51) | 0.97 |
| Nmax | 1.669 | (|Y11 − Y82| + |Y82 − ImgH|)/f | 0.04 |
| (Vi/Ni)min | 11.66 | f/ImgH | 2.63 |
| ΣCT/ΣAT | 1.79 | Yc72/f | — |
| R1/CT1 | 1.63 | |f/R1| + |f/R2| | 3.16 |

13th Embodiment (continued)

| | | | |
|---|---|---|---|
| BL/CT1 | 0.56 | |f/R3| + |f/R4| | 1.91 |
| R8/f | 0.59 | |f/R5| + |f/R6| | 2.60 |
| (R11 + R12)/(R11 − R12) | 0.16 | |f/R7| + |f/R8| | 4.04 |
| | | |f/R9| + |f/R10| | 1.36 |
| (R13 − R14)/(R13 + R14) | −0.70 | |f/R11| + |f/R12| | 0.95 |
| | | |f/R13| + |f/R14| | 2.03 |
| f/f1 | 1.67 | |f/R15| + |f/R16| | 1.03 |
| f/f5 | 0.79 | V1/N1 | 36.27 |
| f5/f7 | −0.96 | V2/N2 | 13.01 |
| f8/f5 | −11.88 | V3/N3 | 19.11 |
| f/f5 + f/f6 | 0.20 | V4/N4 | 36.45 |
| ImgH [mm] | 2.14 | V5/N5 | 17.80 |
| TL [mm] | 5.90 | V6/N6 | 16.09 |
| TL/f | 1.05 | V7/N7 | 36.46 |
| TL/EPD | 1.55 | V8/N8 | 11.66 |
| SL/TL | 0.79 | — | — |
| BL/TD | 0.14 | | |
| EPD/ImgH | 1.78 | | |

14th Embodiment

Figure 27:
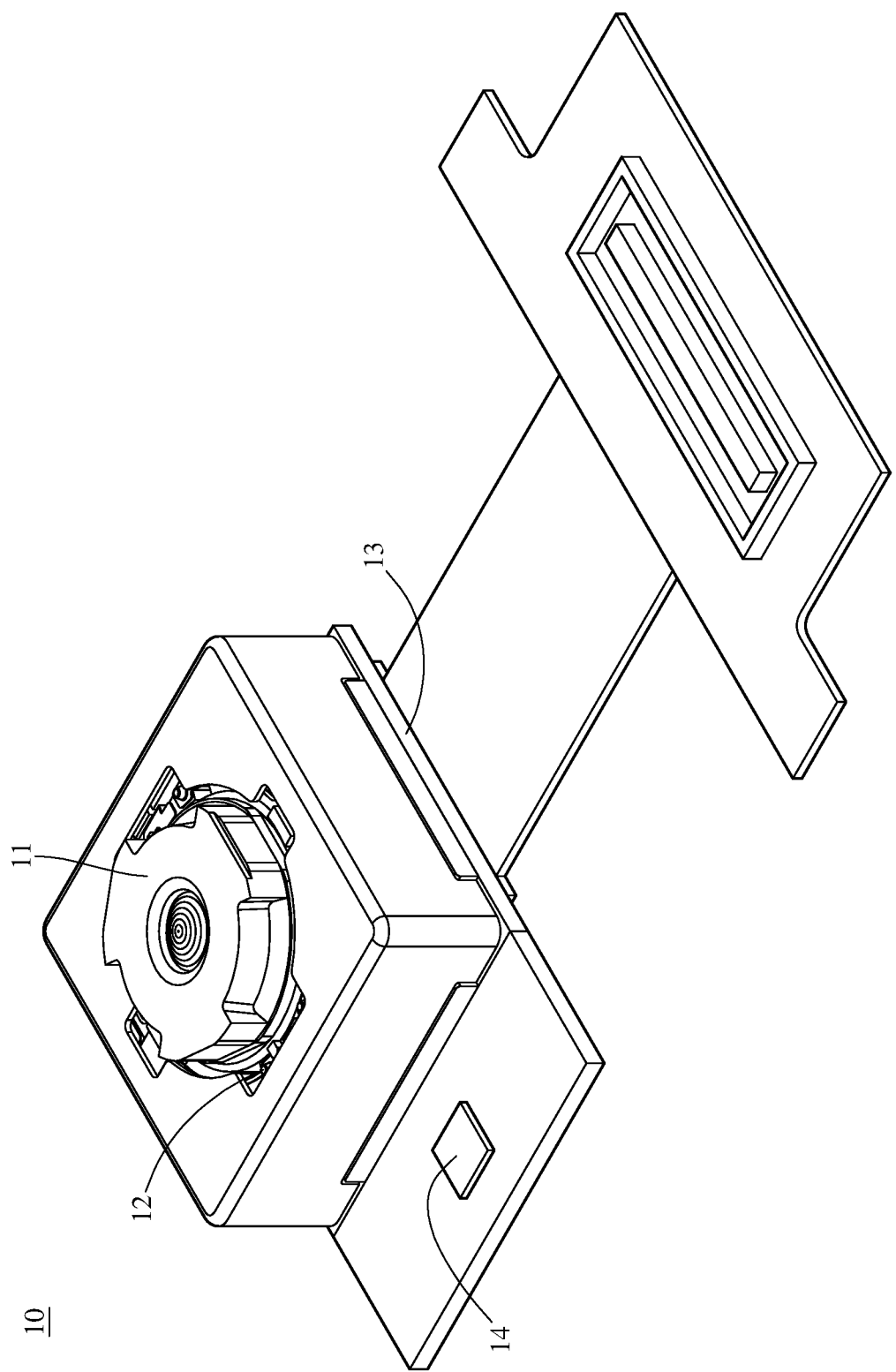
FIG. 27 is a perspective view of an image capturing unit according to the 14th embodiment of the present disclosure.

FIG. 27 is a perspective view of an image capturing unit according to the 14th embodiment of the present disclosure. In this embodiment, an image capturing unit 10 is a camera module including a lens unit 11, a driving device 12, an image sensor 13 and an image stabilizer 14. The lens unit 11 includes the imaging lens system of the present disclosure, a barrel and a holder member (their reference numerals are omitted) for holding the imaging lens system. The imaging light converges in the lens unit 11 of the image capturing unit 10 to generate an image with the driving device 12 utilized for image focusing on the image sensor 13, and the generated image is then digitally transmitted to other electronic component for further processing.

The driving device 12 can have auto focusing functionality, and different driving configurations can be obtained through the usages of voice coil motors (VCM), micro electro-mechanical systems (MEMS), piezoelectric systems, or shape memory alloy materials. The driving device 12 is favorable for obtaining a better imaging position of the lens unit 11, so that a clear image of the imaged object can be captured by the lens unit 11 with different object distances. The image sensor 13 (for example, CCD or CMOS), which can feature high photosensitivity and low noise, is disposed on the image surface of the imaging lens system to provide higher image quality.

The image stabilizer 14, such as an accelerometer, a gyro sensor and a Hall Effect sensor, is configured to work with the driving device 12 to provide optical image stabilization (OIS). The driving device 12 working with the image stabilizer 14 is favorable for compensating for pan and tilt of the lens unit 11 to reduce blurring associated with motion during exposure. In some cases, the compensation can be provided by electronic image stabilization (EIS) with image processing software, thereby improving image quality while in motion or low-light conditions.

15th Embodiment

Figure 28:
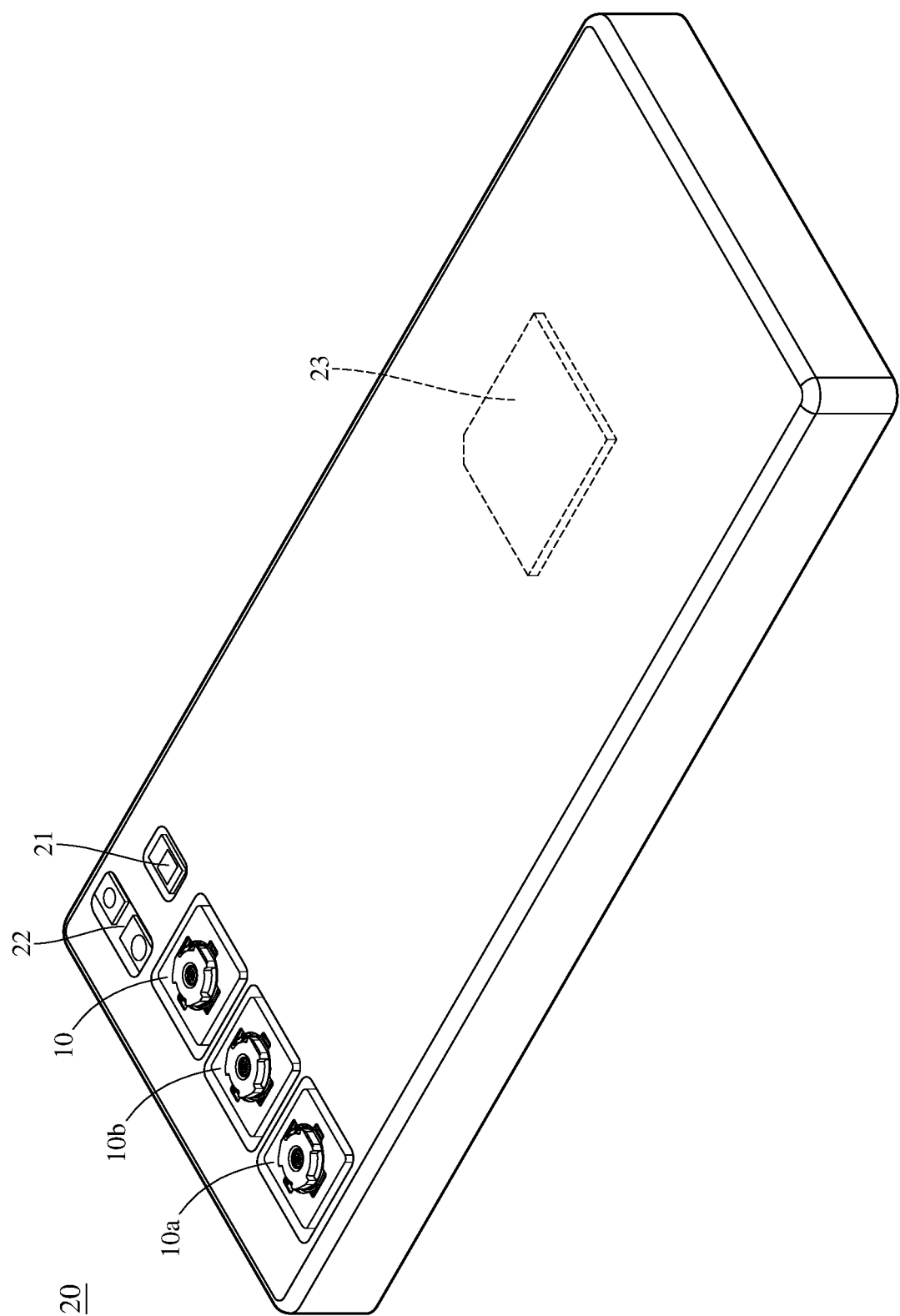
FIG. 28 is one perspective view of an electronic device according to the 15th embodiment of the present disclosure.
Figure 29:
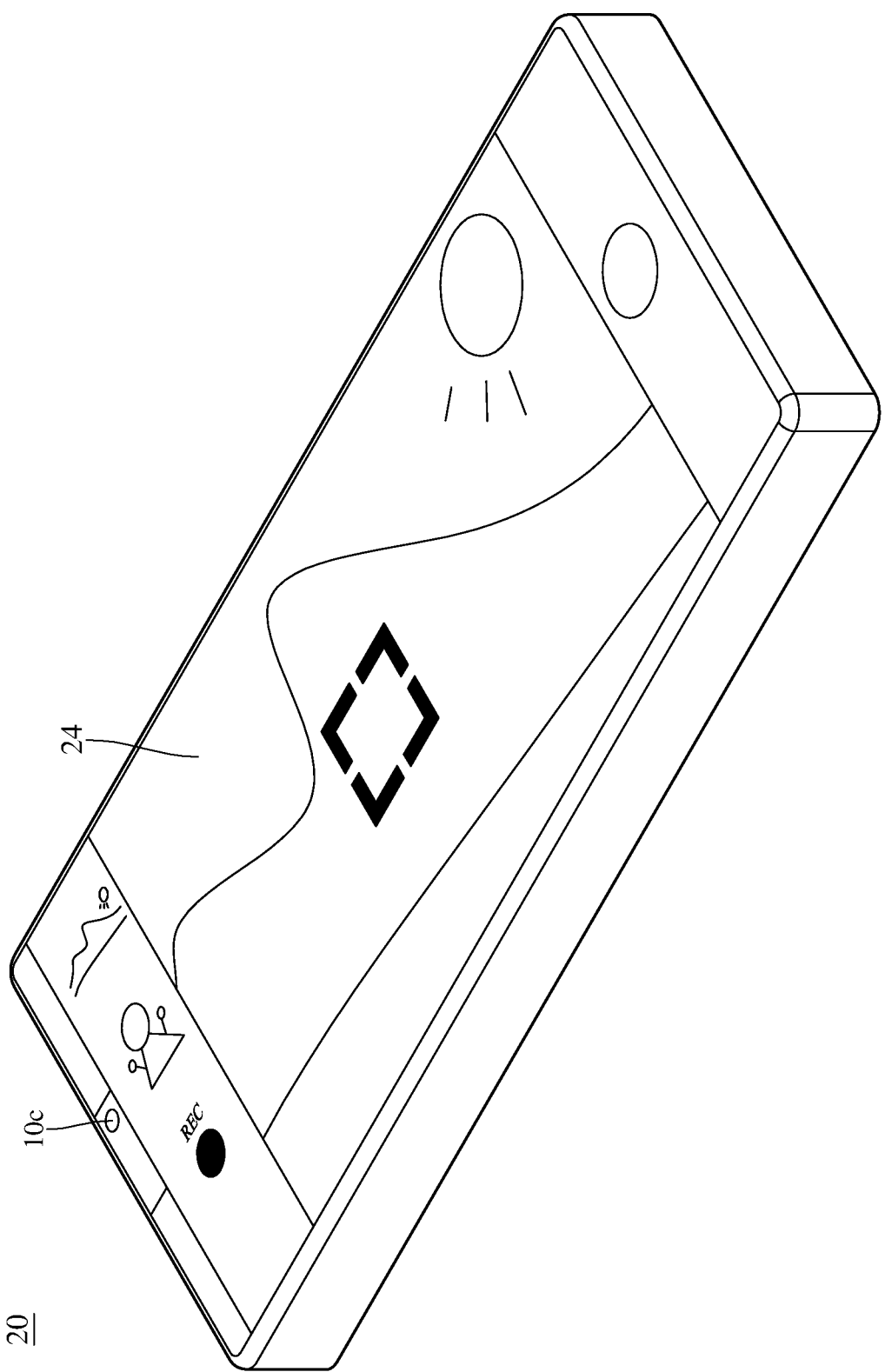
FIG. 29 is another perspective view of the electronic device in FIG. 28.
Figure 30:
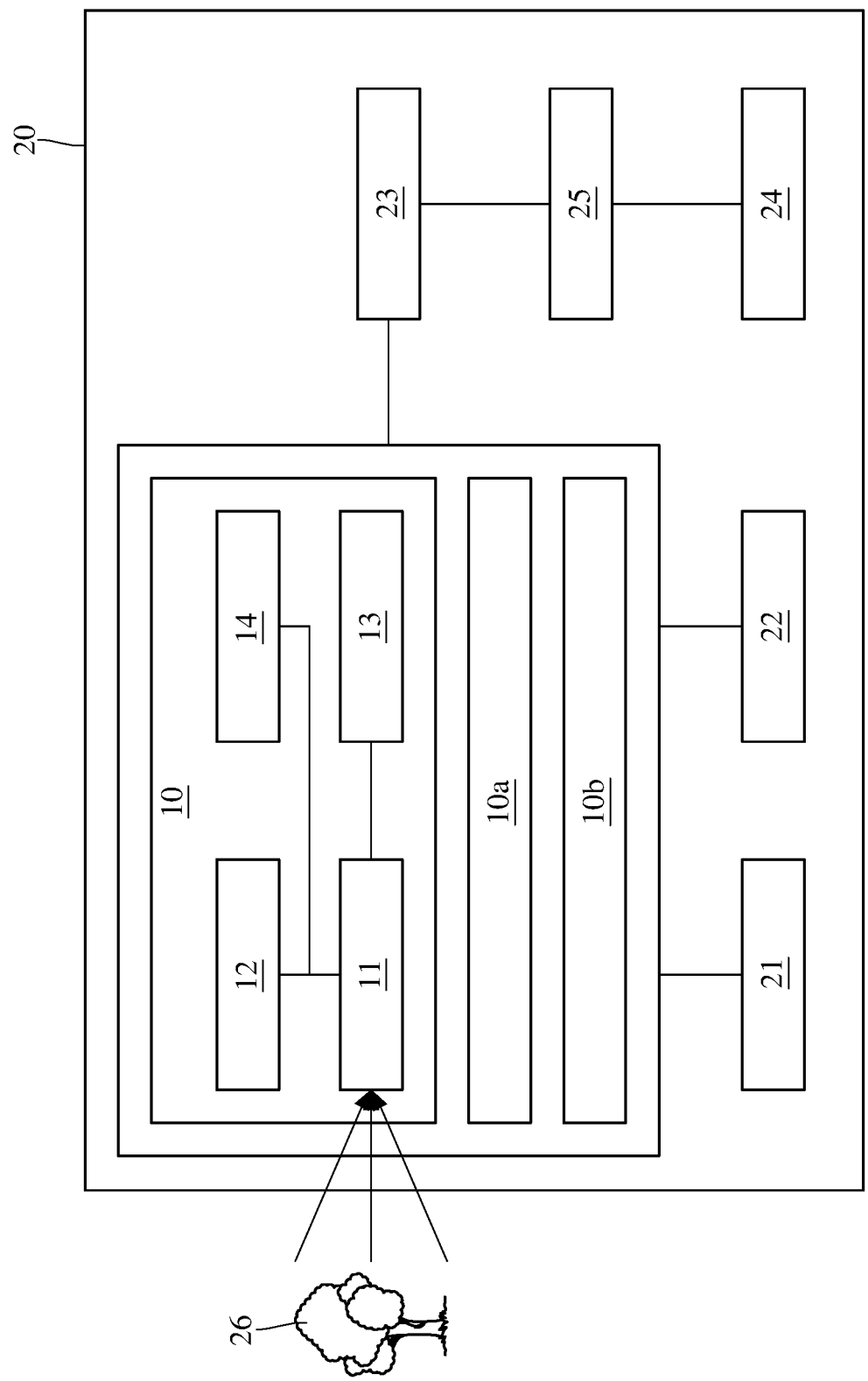
FIG. 30 is a block diagram of the electronic device in FIG. 28.

FIG. 28 is one perspective view of an electronic device according to the 15th embodiment of the present disclosure. FIG. 29 is another perspective view of the electronic device in FIG. 28. FIG. 30 is a block diagram of the electronic device in FIG. 28.

In this embodiment, an electronic device 20 is a smartphone including the image capturing unit 10 disclosed in the 14th embodiment, an image capturing unit 10a, an image capturing unit 10b, an image capturing unit 10c, a flash module 21, a focus assist module 22, an image signal processor 23, a user interface 24 and an image software processor 25. The image capturing unit 10c is located on the same side as the user interface 24, and the image capturing unit 10, the image capturing unit 10a and the image capturing unit 10b are located on the opposite side. The image capturing unit 10, the image capturing unit 10a and the image capturing unit 10b all face the same side. Furthermore, the image capturing unit 10a, the image capturing unit 10b and the image capturing unit 10c all have a configuration similar to that of the image capturing unit 10. In detail, each of the image capturing unit 10a, the image capturing unit 10b and the image capturing unit 10c includes a lens unit, a driving device, an image sensor and an image stabilizer, and the lens unit includes an optical lens assembly, a barrel and a holder member for holding the optical lens assembly.

In this embodiment, the image capturing unit 10 is a telephoto image capturing unit, the image capturing unit 10a is a wide-angle image capturing unit and the image capturing unit 10b is a standard image capturing unit having a field of view ranging between that of the image capturing unit 10 and the image capturing unit 10a. In addition, the field of view of the image capturing unit 10 and the field of view of the image capturing unit 10a are different from each other by at least 20 degrees. The image capturing units 10, 10a, 10b have different fields of view, such that the electronic device 20 has various magnification ratios so as to meet the requirement of optical zoom functionality. In this embodiment, the electronic device 20 includes multiple image capturing units 10, 10a, 10b and 10c, but the present disclosure is not limited to the number of image capturing units.

When a user captures images of an object 26, the light rays converge in the image capturing unit 10, the image capturing unit 10a or the image capturing unit 10b to generate an image(s), and the flash module 21 is activated for light supplement. The focus assist module 22 detects the object distance of the imaged object 26 to achieve fast auto focusing. The image signal processor 23 is configured to optimize the captured image to improve image quality. The light beam emitted from the focus assist module 22 can be either conventional infrared or laser. In addition, the electronic device 20 can capture images of the object 26 via the image capturing unit 10c. The user interface 24 can be a touch screen or a physical button. The user is able to interact with the user interface 24 and the image software processor 25 having multiple functions to capture images and complete image processing. The image processed by the image software processor 25 can be displayed on the user interface 24.

The smartphone in this embodiment is only exemplary for showing the image capturing unit 10 of the present disclosure installed in an electronic device, and the present disclosure is not limited thereto. The image capturing unit 10 can be optionally applied to optical systems with a movable focus. Furthermore, the imaging lens system of the image capturing unit 10 features good capability in aberration corrections and high image quality, and can be applied to 3D (three-dimensional) image capturing applications, in products such as digital cameras, mobile devices, digital tablets, smart televisions, network surveillance devices, dashboard cameras, vehicle backup cameras, multi-camera devices, image recognition systems, motion sensing input devices, wearable devices and other electronic imaging devices.

The foregoing description, for the purpose of explanation, has been described with reference to specific embodiments. It is to be noted that TABLES 1-26 show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An imaging lens system comprising a total of eight lens elements, the eight lens elements being, in order from an object side to an image side, a first lens element, a second lens element, a third lens element, a fourth lens element, a fifth lens element, a sixth lens element, a seventh lens element and an eighth lens element, and each of the eight lens elements having an object-side surface facing toward the object side and an image-side surface facing toward the image side;

wherein the first lens element has positive refractive power, and at least one lens element of the imaging lens system has at least one lens surface having at least one inflection point;

wherein a minimum value among Abbe numbers of all lens elements of the imaging lens system is Vmin, half of a maximum field of view of the imaging lens system is HFOV, a focal length of the imaging lens system is f, a focal length of the first lens element is f1, a focal length of the fifth lens element is f5, a focal length of the eighth lens element is f8, an entrance pupil diameter of the imaging lens system is EPD, an axial distance between the image-side surface of the eighth lens element and an image surface is BL, an axial distance between the object-side surface of the first lens element and the image-side surface of the eighth lens element is TD, a maximum effective radius of the object-side surface of the first lens element is Y11, a maximum effective radius of the image-side surface of the eighth lens element is Y82, a maximum image height of the imaging lens system is ImgH, a maximum value among refractive indices of all lens elements of the imaging lens system is Nmax, and the following conditions are satisfied:

$8.0 < V\text{min} < 22.5$;

$5.0\ [\text{deg.}] < \text{HFOV} < 25.0\ [\text{deg.}]$;

$0.80 < f/\text{EPD} < 2.20$;

$0 < BL/TD < 0.25$;

$0.32 < f/f1 < 3.80$;

$-0.50 < f8/f5 < 9.0$;

$0 < (|Y11-Y82|+|Y82-\text{ImgH}|)/f < 0.15$; and $1.60 < N\text{max} < 1.72$.

2. The imaging lens system of claim 1, wherein the second lens element has negative refractive power, the image-side surface of the second lens element is concave in a paraxial region thereof, and each of at least three lens elements of the imaging lens system has at least one lens surface having at least one inflection point.

3. The imaging lens system of claim 1, wherein the object-side surface of the first lens element is convex in a paraxial region thereof, the image-side surface of the seventh lens element is concave in a paraxial region thereof, and at least four lens elements of the imaging lens system are made of plastic material.

4. The imaging lens system of claim 1, wherein the minimum value among Abbe numbers of all lens elements of the imaging lens system is Vmin, and the following condition is satisfied:

$10.0 < V\text{min} < 20.0$.

5. The imaging lens system of claim 1, wherein an axial distance between the object-side surface of the first lens element and the image surface is TL, the entrance pupil diameter of the imaging lens system is EPD, and the following condition is satisfied:

$0.90 < TL/\text{EPD} < 1.90$.

6. The imaging lens system of claim 1, wherein each of at least four lens elements of the imaging lens system has an Abbe number smaller than 35.0.

7. The imaging lens system of claim 1, wherein a sum of central thicknesses of all lens elements of the imaging lens system is ΣCT, a sum of axial distances between each of all adjacent lens elements of the imaging lens system is ΣAT, and the following condition is satisfied:

$1.10 < \Sigma CT/\Sigma AT < 3.50$.

8. The imaging lens system of claim 1, wherein a curvature radius of the object-side surface of the first lens element is R1, a central thickness of the first lens element is CT1, and the following condition is satisfied:

$0.50 < R1/CT1 < 2.65$.

9. The imaging lens system of claim 1, wherein an axial distance between the object-side surface of the first lens element and the image surface is TL, the focal length of the imaging lens system is f, a curvature radius of the object-side surface of the seventh lens element is R13, a curvature radius of the image-side surface of the seventh lens element is R14, and the following conditions are satisfied:

$0.50 < TL/f < 1.10$; and $(R13-R14)/(R13+R14) < 5.0$.

10. The imaging lens system of claim 1, wherein the focal length of the imaging lens system is f, a curvature radius of the object-side surface of one lens element of the imaging lens system is Ro, a curvature radius of the image-side surface of the lens element of the imaging lens system is Ri, and at least one lens element of the imaging lens system satisfies the following condition:

$|f/\text{Ro}|+|f/\text{Ri}| < 0.50$.

11. An image capturing unit, comprising:
the imaging lens system of claim 1; and
an image sensor disposed on the image surface of the imaging lens system.

12. An electronic device, comprising at least two image capturing units, the at least two image capturing units facing the same side, and the at least two image capturing units comprising:
a first image capturing unit, comprising the imaging lens system of claim 1 and a first image sensor, wherein the first image sensor is disposed on the image surface of the imaging lens system; and
a second image capturing unit, comprising an optical lens assembly and a second image sensor, wherein the second image sensor is disposed on an image surface of the optical lens assembly;
wherein a field of view of the first image capturing unit and a field of view of the second image capturing unit are different from each other by at least 20 degrees.

13. An imaging lens system comprising a total of eight lens elements, the eight lens elements being, in order from an object side to an image side, a first lens element, a second lens element, a third lens element, a fourth lens element, a fifth lens element, a sixth lens element, a seventh lens element and an eighth lens element, and each of the eight lens elements having an object-side surface facing toward the object side and an image-side surface facing toward the image side;

wherein at least one lens element of the imaging lens system has at least one lens surface having at least one inflection point;

wherein an Abbe number of the eighth lens element is V8, half of a maximum field of view of the imaging lens system is HFOV, a focal length of the imaging lens system is f, a focal length of the fifth lens element is f5, a focal length of the eighth lens element is f8, an entrance pupil diameter of the imaging lens system is EPD, an axial distance between the object-side surface of the first lens element and an image surface is TL, a maximum effective radius of the object-side surface of the first lens element is Y11, a maximum effective radius of the image-side surface of the eighth lens element is Y82, a maximum image height of the imaging lens system is ImgH, and the following conditions are satisfied:

$8.0 < V8 < 24.5;$ $5.0[\text{deg.}] < \text{HFOV} < 30.0[\text{deg.}];$ $0.80 < f/\text{EPD} < 2.20;$ $0.50 < TL/f < 1.30;$ $-0.50 < f8/f5 < 9.0;$ and $0 < (|Y11 - Y82| + |Y82 - \text{ImgH}|)/f < 0.15.$

14. The imaging lens system of claim 13, wherein the first lens element has positive refractive power, the object-side surface of the first lens element is convex in a paraxial region thereof, and the image-side surface of the third lens element is concave in a paraxial region thereof.

15. The imaging lens system of claim 13, wherein the image-side surface of the seventh lens element is concave in a paraxial region thereof.

16. The imaging lens system of claim 13, wherein the Abbe number of the eighth lens element is V8, and the following condition is satisfied:

$8.0 < V8 < 22.0.$

17. The imaging lens system of claim 13, wherein the entrance pupil diameter of the imaging lens system is EPD, an axial distance between the image-side surface of the eighth lens element and the image surface is BL, and the following condition is satisfied:

$4.50 < \text{EPD}/BL < 18.0.$

18. The imaging lens system of claim 13, wherein an axial distance between the image-side surface of the eighth lens element and the image surface is BL, a central thickness of the first lens element is CT1, and the following condition is satisfied:

$0 < BL/CT1 < 0.95.$

19. The imaging lens system of claim 13, wherein a maximum effective radius of the object-side surface of the first lens element is Y11, a maximum image height of the imaging lens system is ImgH, the entrance pupil diameter of the imaging lens system is EPD, the focal length of the imaging lens system is f, the focal length of the fifth lens element is f5, and the following conditions are satisfied:

$-0.27 < (Y11 - \text{ImgH})/\text{EPD} < 0;$ and $-0.25 < f/f5 < 1.50.$

20. The imaging lens system of claim 13, further comprising an aperture stop, wherein the focal length of the imaging lens system is f, the entrance pupil diameter of the imaging lens system is EPD, an axial distance between the aperture stop and the image surface SL, the axial distance between the object-side surface of the first lens element and the image surface is TL, and the following conditions are satisfied:

$1.0 < f/\text{EPD} < 2.0;$ and $0.50 < SL/TL < 0.95.$

21. The imaging lens system of claim 13, wherein the focal length of the imaging lens system is f, half of the maximum field of view of the imaging lens system is HFOV, the entrance pupil diameter of the imaging lens system is EPD, and the following condition is satisfied:

$0.20 < f \times \tan(\text{HFOV})/\text{EPD} < 1.0.$

22. The imaging lens system of claim 13, wherein a maximum effective radius of the object-side surface of the first lens element is Y11, a maximum effective radius of the image-side surface of the eighth lens element is Y82, an axial distance between the image-side surface of the eighth lens element and the image surface is BL, the focal length of the imaging lens system is f, and the following condition is satisfied:

$0 < (|Y11 - Y82| + BL)/f < 0.20.$

23. An imaging lens system comprising a total of eight lens elements, the eight lens elements being, in order from an object side to an image side, a first lens element, a second lens element, a third lens element, a fourth lens element, a fifth lens element, a sixth lens element, a seventh lens element and an eighth lens element, and each of the eight lens elements having an object-side surface facing toward the object side and an image-side surface facing toward the image side;

wherein at least one lens element of the imaging lens system has at least one lens surface having at least one inflection point;

wherein a minimum value among Abbe numbers of all lens elements of the imaging lens system is Vmin, an axial distance between the object-side surface of the first lens element and an image surface is TL, a focal length of the imaging lens system is f, a focal length of the fifth lens element is f5, a focal length of the eighth lens element is f8, an axial distance between the image-side surface of the eighth lens element and the image surface is BL, an axial distance between the object-side surface of the first lens element and the image-side surface of the eighth lens element is TD, a maximum effective radius of the object-side surface of the first lens element is Y11, a maximum effective radius of the image-side surface of the eighth lens element is Y82, a maximum image height of the imaging lens system is ImgH, and the following conditions are satisfied:

$8.0 < V\text{min} < 20.0;$ $0.50 < TL/f < 1.10;$ $0 < BL/TD < 0.30;$ $-0.50 < f8/f5 < 9.0;$ and $0 < (|Y11 - Y82| + |Y82 - \text{ImgH}|)/f < 0.15.$

24. The imaging lens system of claim 23, wherein an Abbe number of the first lens element is V1, an Abbe number of the second lens element is V2, an Abbe number of the third lens element is V3, an Abbe number of the fourth lens element is V4, an Abbe number of the fifth lens element is V5, an Abbe number of the sixth lens element is V6, an Abbe number of the seventh lens element is V7, an Abbe number of the eighth lens element is V8, an Abbe number of the i-th lens element is Vi, and the following condition is satisfied:

$$150.0 < \Sigma Vi < 320.0, \text{ wherein } i=1, 2, 3, 4, 5, 6, 7, 8.$$

25. The imaging lens system of claim 23, wherein the focal length of the imaging lens system is f, the focal length of the fifth lens element is f5, a focal length of the sixth lens element is f6, a vertical distance between a critical point on the image-side surface of the seventh lens element and an optical axis is Yc72, and the following conditions are satisfied:

$$-0.50 < f/f5 + f/f6 < 1.0; \text{ and}$$

$$0.02 < Yc72/f < 0.70.$$

26. The imaging lens system of claim 23, wherein the focal length of the imaging lens system is f, the focal length of the fifth lens element is f5, a focal length of the seventh lens element is f7, a curvature radius of the image-side surface of the fourth lens element is R8, and the following conditions are satisfied:

$$f5/f7 < 0.50; \text{ and}$$

$$-1.50 < R8/f < 1.50.$$

27. The imaging lens system of claim 23, wherein the focal length of the imaging lens system is f, a maximum image height of the imaging lens system is ImgH, a curvature radius of the object-side surface of the sixth lens element is R11, a curvature radius of the image-side surface of the sixth lens element is R12, and the following conditions are satisfied:

$$2.10 < f/\text{ImgH} < 3.80; \text{ and}$$

$$-0.50 < (R11+R12)/(R11-R12) < 15.0.$$

28. The imaging lens system of claim 23, wherein each of at least four lens elements of the imaging lens system has an Abbe number smaller than 35.0, a maximum effective radius of the object-side surface of the first lens element is Y11, a maximum effective radius of the object-side surface of the fifth lens element is Y51, a maximum effective radius of the image-side surface of the eighth lens element is Y82, and the following condition is satisfied:

$$0.70 < (Y82-Y51)/(Y11-Y51) < 2.50.$$

29. The imaging lens system of claim 23, wherein an entrance pupil diameter of the imaging lens system is EPD, a maximum image height of the imaging lens system is ImgH, a curvature radius of the object-side surface of the seventh lens element is R13, a curvature radius of the image-side surface of the seventh lens element is R14, and the following conditions are satisfied:

$$1.20 < \text{EPD}/\text{ImgH} < 2.80; \text{ and}$$

$$(R13-R14)/(R13+R14) < 5.0.$$

30. The imaging lens system of claim 23, wherein an Abbe number of the first lens element is V1, an Abbe number of the second lens element is V2, an Abbe number of the third lens element is V3, an Abbe number of the fourth lens element is V4, an Abbe number of the fifth lens element is V5, an Abbe number of the sixth lens element is V6, an Abbe number of the seventh lens element is V7, an Abbe number of the eighth lens element is V8, an Abbe number of the i-th lens element is Vi, a refractive index of the first lens element is N1, a refractive index of the second lens element is N2, a refractive index of the third lens element is N3, a refractive index of the fourth lens element is N4, a refractive index of the fifth lens element is N5, a refractive index of the sixth lens element is N6, a refractive index of the seventh lens element is N7, a refractive index of the eighth lens element is N8, a refractive index of the i-th lens element is Ni, a minimum value of Vi/Ni is (Vi/Ni)min, the axial distance between the object-side surface of the first lens element and the image surface is TL, a maximum image height of the imaging lens system is ImgH, and the following conditions are satisfied:

$$9.0 < (Vi/Ni)\text{min} < 11.80, \text{ wherein } i=1,2,3,4,5,6,7,8;$$

$$4.0 \text{ [mm]} < TL < 8.0 \text{ [mm]}; \text{ and}$$

$$1.50 \text{ [mm]} < \text{ImgH} < 4.50 \text{ [mm]}.$$

* * * * *